(12) United States Patent
Hayashi et al.

(10) Patent No.: US 10,847,703 B2
(45) Date of Patent: Nov. 24, 2020

(54) THERMOELECTRIC CONVERSION ELEMENT, THERMOELECTRIC CONVERSION MODULE, AND ELECTRICAL DEVICE

(71) Applicant: Murata Manufacturing Co., Ltd., Nagaokakyo (JP)

(72) Inventors: Sachiko Hayashi, Nagaokakyo (JP); Osamu Chikagawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 53 days.

(21) Appl. No.: 15/823,942

(22) Filed: Nov. 28, 2017

(65) Prior Publication Data

US 2018/0083175 A1 Mar. 22, 2018

Related U.S. Application Data

(63) Continuation of application No. PCT/JP2016/060730, filed on Mar. 31, 2016.

(30) Foreign Application Priority Data

Jun. 9, 2015 (JP) ................. 2015-116967

(51) Int. Cl.
*H01L 35/04* (2006.01)
*H01L 35/32* (2006.01)
(Continued)

(52) U.S. Cl.
CPC ............. *H01L 35/04* (2013.01); *H01L 35/22* (2013.01); *H01L 35/32* (2013.01); *H01L 35/34* (2013.01)

(58) Field of Classification Search
CPC ....... H01L 35/04; H01L 35/32; H01L 35/325; H01L 35/34; H01L 35/30
See application file for complete search history.

(56) References Cited

U.S. PATENT DOCUMENTS 3,879,229 A * 4/1975 Gilbert .................... H01L 35/32
136/208
8,222,510 B2 * 7/2012 Majumdar .............. H01L 35/22
136/201
(Continued)

FOREIGN PATENT DOCUMENTS

JP 2000-252528 A 9/2000
JP 2003-258323 A 9/2003
(Continued)

OTHER PUBLICATIONS

English machine translation of JP 2003-258323 provided via the EPO website. (Year: 2019).*
(Continued)

*Primary Examiner* — Daniel P Malley, Jr.
(74) *Attorney, Agent, or Firm* — Arent Fox LLP

(57) ABSTRACT

A thermoelectric conversion module includes a module main body having a length direction and a height direction which is perpendicular to the length direction. The module main body include a row of alternating first and second thermoelectric conversion elements each of which is elongated in the height direction and has upper and lower surfaces. First and second electrodes are connected to respective ones of the plurality of first and second thermoelectric conversion elements. An insulator covers both the upper and lower surfaces of the first and second thermoelectric conversion elements. A lower heat transfer plates is provided on the lower part of the insulator 13 and an upper heat transfer plate is provided on the upper part of the insulator.

17 Claims, 32 Drawing Sheets

(51) Int. Cl.
*H01L 35/22* (2006.01)
*H01L 35/34* (2006.01)

(56) References Cited

U.S. PATENT DOCUMENTS

| | | | | |
|---|---|---|---|---|
| 2006/0213204 A1* | 9/2006 | Morimoto | ............... | H01L 35/32 62/3.2 |
| 2011/0226304 A1* | 9/2011 | Hayashi | ................ | H01L 35/32 136/238 |
| 2013/0061901 A1* | 3/2013 | Tohei | ................ | H01L 35/08 136/205 |
| 2013/0118541 A1* | 5/2013 | Lee | ................ | H01L 35/34 136/200 |
| 2014/0356985 A1* | 12/2014 | Ricci | ................ | H01L 21/67109 438/11 |
| 2015/0179912 A1* | 6/2015 | Maeshima | ................ | H01L 35/16 136/211 |

FOREIGN PATENT DOCUMENTS

| | | | |
|---|---|---|---|
| JP | 2003258323 A | * | 9/2003 |
| JP | 2009-124030 A | | 6/2009 |
| JP | 2011165976 A | | 8/2011 |
| JP | 2012-248819 A | | 12/2012 |
| JP | 2013-4837 A | | 1/2013 |

OTHER PUBLICATIONS

English machine translation of Murakami et al. (JP 2003-258323 A) provided via the EPO website. 2019. (Year: 2019).*
International Search Report issued in International Application No. PCT/JP2016/060730, dated Jun. 28, 2016.
Written Opinion of the International Searching Authority issued in International Application No. PCT/JP2016/060730, dated Jun. 28, 2016.

* cited by examiner

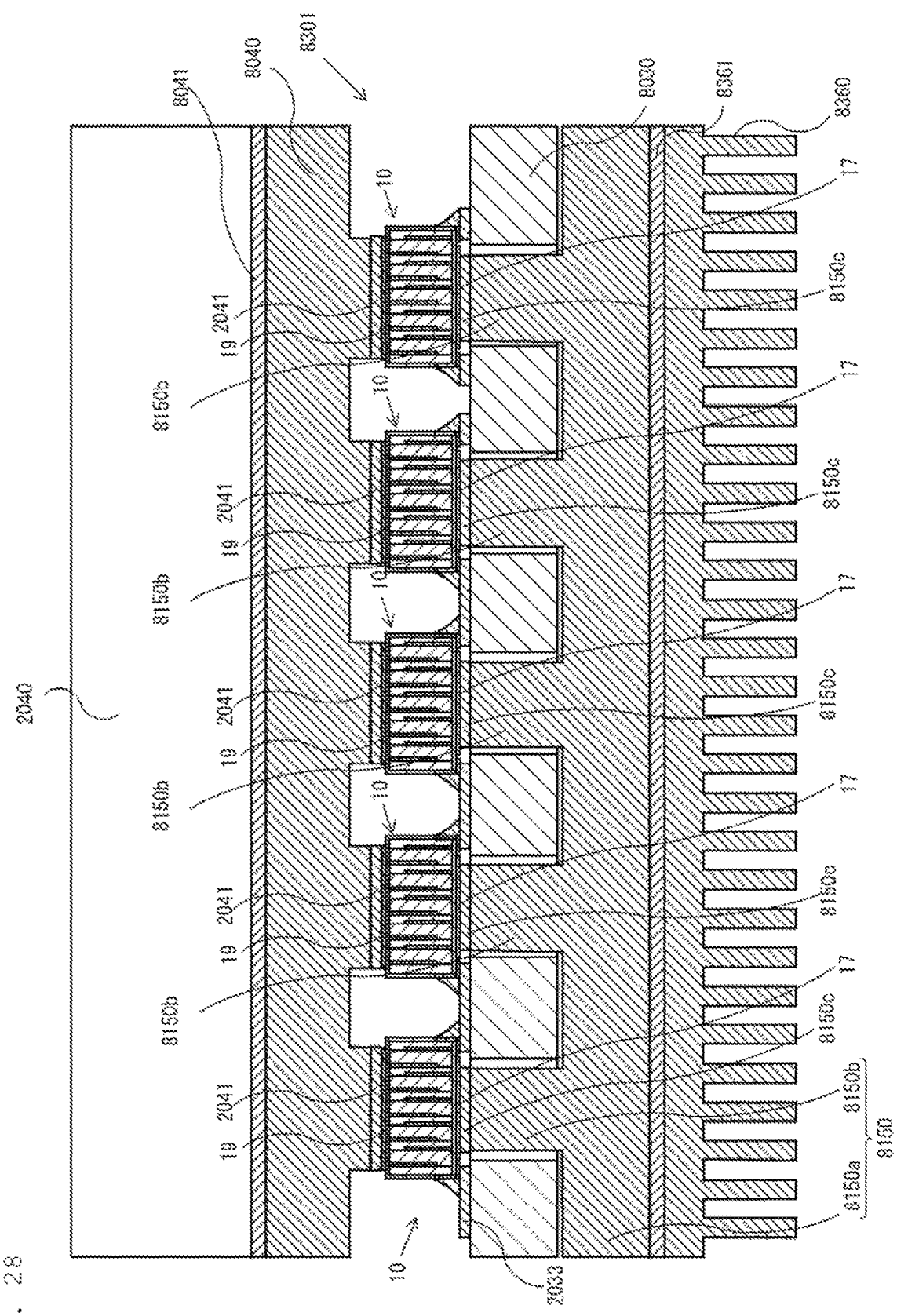

THERMOELECTRIC CONVERSION ELEMENT, THERMOELECTRIC CONVERSION MODULE, AND ELECTRICAL DEVICE

CROSS REFERENCE TO RELATED APPLICATIONS

The present application is a continuation of International application No. PCT/JP2016/060730, filed Mar. 31, 2016, which claims priority to Japanese Patent Application No. 2015-116967, filed Jun. 9, 2015, the entire contents of each of which are incorporated herein by reference.

TECHNICAL FIELD

The present invention relates to a thermoelectric conversion module, a thermoelectric conversion module, and an electrical device.

BACKGROUND OF THE INVENTION

Provided is a thermoelectric conversion module including an module main body where a plurality of first thermoelectric conversion elements formed from a p-type thermoelectric conversion material and a plurality of second thermoelectric conversion elements formed from an n-type thermoelectric conversion material are arranged alternately (see, for example, Japanese Patent Application Laid-Open No. 2009-124030).

This thermoelectric conversion module is mounted on a substrate with a pair of electrodes electrically connected to conductive patterns formed on the substrate. Further, the thermoelectric conversion module generates electric power with a temperature difference in the thermoelectric conversion module, which is produced by a heat source disposed on the side opposite to the substrate. In addition, the module main body of the thermoelectric conversion module has an outer surface covered with an insulator part, excluding parts of the outer surface provided with the electrodes. Furthermore, the module main body is thermally coupled to the substrate and the heat source with the insulator part interposed there between.

However, when the thermoelectric conversion module described in Patent Document 1 is mounted on a substrate, it is often the case that an air layer is formed between the substrate and the insulator part because the electrodes and the conductive patterns have thicknesses. In addition, the surface of the insulator part of the thermoelectric conversion module has minute asperity produced due to manufacturing factors. Further, when the insulator part of the thermoelectric conversion module is brought into contact with the heat source, the insulator part makes point contact with the heat source. In these cases, there is a possibility that thermal coupling may be insufficient between the module main body and the substrate or between the module main body and the heat source.

The present invention has been achieved in view of the foregoing reason, and an object of the invention is to provide a thermoelectric conversion module, a thermoelectric conversion module, and an electrical device which can make an improvement in power generation efficiency.

BRIEF SUMMARY OF THE INVENTION

In accordance with one aspect of the present invention, a thermoelectric conversion module includes a module main body having a length direction and a height direction which is perpendicular to the length direction. The module main body include a row of alternating first and second thermoelectric conversion elements. Each of the thermoelectric elements is elongated in the height direction and have upper and lower surfaces. First and second electrodes are physically and electrically connected to respective ones of the plurality of first and second thermoelectric conversion elements and an insulator covers at least one of the upper and lower surfaces of the first and second thermoelectric conversion elements. A heat transfer plate is provided on the insulator such that the insulator is interposed between the heat transfer plate and the first and second thermoelectric conversion elements.

In a further aspect of the invention, the insulator is a first insulator and extends over the lower surfaces of the first and second thermoelectric conversion elements and the heat transfer plate is a first heat transfer plate provided on the first insulator. The thermoelectric conversion module further includes a second insulator covering the upper surfaces of the first and second thermoelectric conversion elements and a second heat transfer plate covering the second insulator.

In yet a further aspect of the invention, the first and second insulators are contiguous and integral with one another.

In a preferred embodiment, the heat transfer plate is formed contiguously and integrally with at least one of the first and second electrodes.

In another aspect of the invention, each adjacent pair of thermoelectric conversion elements share a respective common thermoelectric conversion element and every other pair of adjacent thermoelectric conversion elements is electrically connected at their top end. The remaining pairs of adjacent thermoelectric elements are connect at their bottom end. In a preferred embodiment, each thermoelectric conversion element of an adjacent pair of thermoelectric conversion elements includes a planar main surface which faces a planar main surface of the other of the thermoelectric conversion elements of the pair. A first portion of the pair of planar main surfaces abut one another to electrically connect the top or bottom ends of the adjacent pair of thermoelectric conversion elements and a second portion of the pair of planar main surfaces are separated by a respective insulating member.

In some embodiments the insulator covers only one of the upper and lower surfaces of the first and second thermoelectric conversion elements. In others, it covers both the upper and lower surfaces of the first and second thermoelectric conversion elements. In preferred embodiments, the heat transfer plate has a higher thermal conductivity than the insulator.

In some embodiments, the heat transfer plate covers one of the upper and lower surfaces of each of the first and second thermoelectric conversion elements. In others, two heat transfer plates are provided, with one covering the upper surfaces of each of the first and second thermoelectric conversion elements and the lower surfaces of each of the first and second thermoelectric conversion elements. In these embodiments, the first and second heat transfer plates are formed from a material that has a higher thermal conductivity than the first and second insulators, respectively.

In another aspect of the invention, the first and second electrodes are joined to respective ones of the first thermoelectric conversion elements.

In yet another aspect of the invention, the first and second electrodes comprise a base layer formed from Ni and Mo and provided on an outer surface of the module main body and a contact layer formed from a metal and covering the base layer. Each of the base layers is joined to a respective one of the first thermoelectric conversion elements.

In another aspect of the invention, each of the first thermoelectric conversion elements comprise a p-type semiconductor including Ni, Mo, and a composite oxide and each of the second thermoelectric conversion elements comprise an n-type semiconductor including the composite oxide. The composite oxide comprises Sr, La, and Ti.

In another aspect of the invention, each of the first thermoelectric conversion elements comprises an n-type semiconductor and each of the second thermoelectric conversion elements comprise a p-type semiconductor.

The invention is also directed to a combination of the a thermoelectric conversion module having one or more of the aspects described above and a substrate on which the thermoelectric conversion module is mounted. In a preferred embodiment, the insulator covers at least the lower surfaces of the first and second thermoelectric conversion elements and the heat transfer plate is disposed between the insulator and the substrate.

In another aspect of the invention, the heat transfer plate is a first heat transfer plate and the substrate includes upper and lower opposing surfaces and a through hole which extends from the upper to the lower opposing surfaces of the substrate. The thermoelectric conversion module, including the first heat transfer plate, is located above the through hole on the side of the upper surface of the substrate. The combination further includes a second heat transfer plate including a main body portion and a protruded portion which protrudes from the main plate. The main body portion is disposed under the bottom surface of the substrate and the protruded portion extends through the through hole into thermal contact with the first heat transfer plate.

According to the present invention, the formation of a heat transfer through the heat transfer plate path between the module main body and the heat source can strengthen the thermal coupling between the module main body and the heat source.

Accordingly, the module main body can achieve a temperature difference closer to the temperature difference from the heat source. In addition, heat transferred from the heat source to the heat transfer plate spreads to the whole transfer plate, and then transfers to the module main body. Alternatively, heat transferred from the module main body to the heat transfer plate spreads to the whole heat transfer plate, and then transfers to the heat source. Thus, for example, as compared with a configuration including no heat transfer plate, heat is transferred uniformly to the entire part of the module main body corresponding to the heat transfer plate, or heat is transferred uniformly to the heat source from the entire part of the module main body corresponding to the heat transfer plate. Accordingly, the power generation efficiency of the module main body can be improved.

BRIEF DESCRIPTION OF THE DRAWINGS

FIG. 28 is a cross-sectional view of a thermoelectric conversion module according to a modification example.

DETAILED DESCRIPTION OF THE PREFERRED EMBODIMENTS

Respective exemplary embodiments of the present invention will be described in detail below with reference to the drawings.

Embodiment 1

Figure 1:
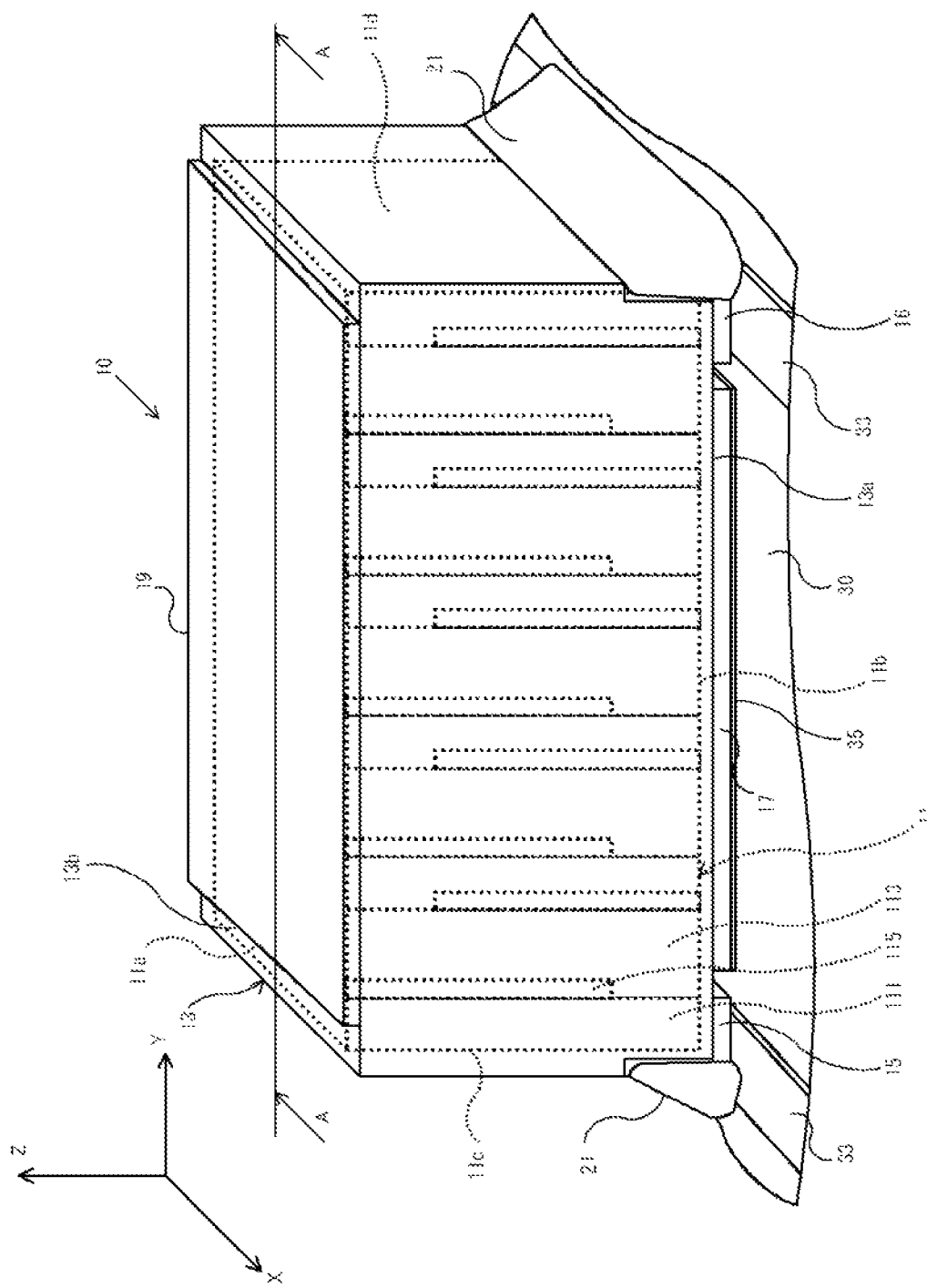
FIG. 1 is a perspective view of a thermoelectric conversion module according to Embodiment 1.
Figure 2:
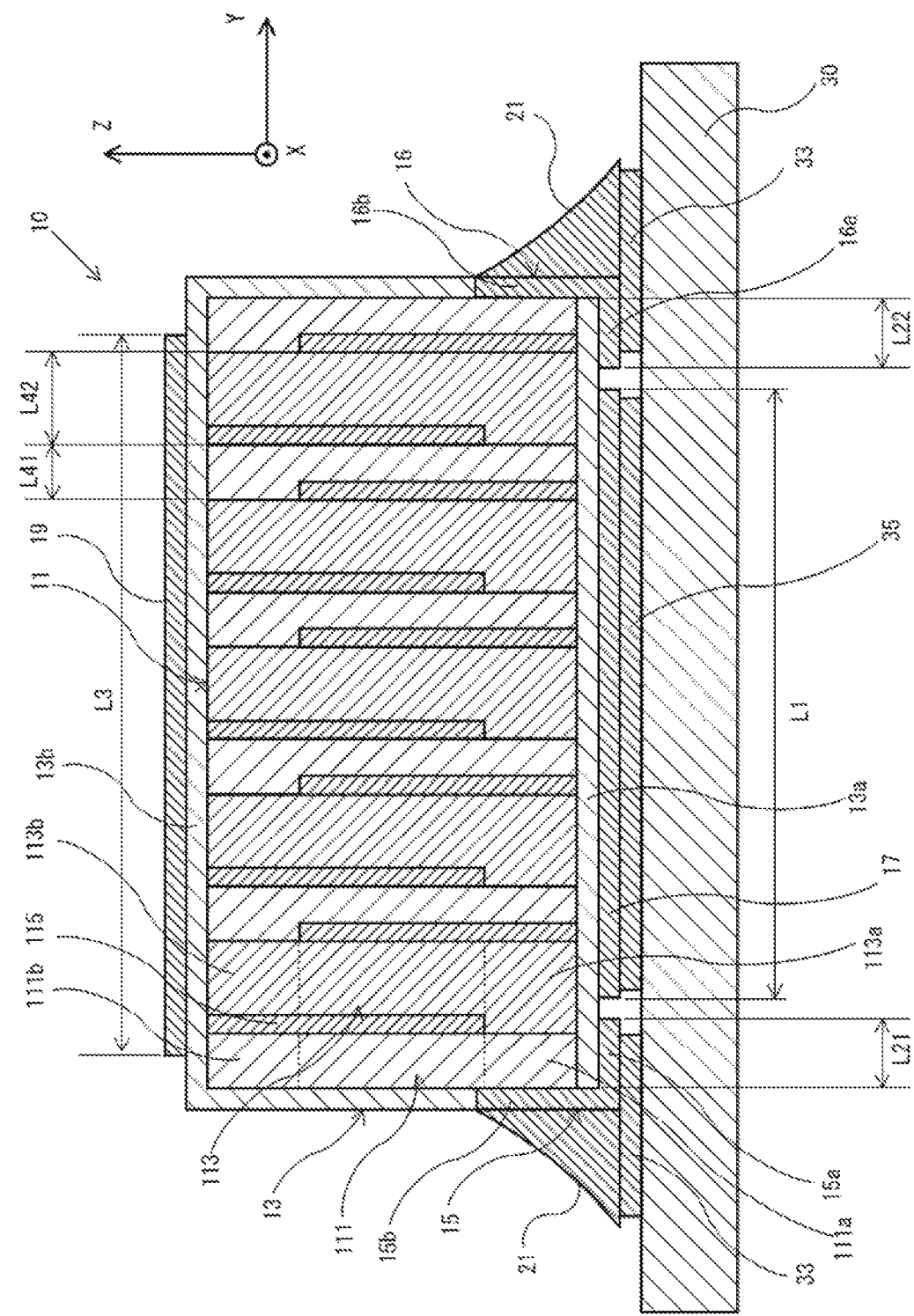
FIG. 2 is a cross-sectional arrow view of the thermoelectric conversion module according to Embodiment 1 along the line A-A in FIG. 1.

As shown in FIGS. 1 and 2, a thermoelectric conversion module 10 according embodiment 1 is, for example, mounted on a substrate 30 with conductive patterns 33 formed. 1. The thermoelectric conversion module 10 includes a module main body having a length direction (direction Y in FIG. 1) and a height direction (direction Z FIG. 1) which is perpendicular to the length direction. The module main body include a row of alternating first and second thermoelectric conversion elements 111, 113, each of which is elongated in the height direction and has upper and lower surfaces. First and second electrodes 15b and 16b are preferably physically and electrically connected to respective ones of the plurality of first and second thermoelectric conversion elements (in this embodiment, to the laterally outermost first thermoelectric conversion elements 111). An insulator 13 covers both the upper and lower surfaces of the first and second thermoelectric conversion elements 111 and 113 (and the side surfaces of the main module body except for the location where the electrodes 15, 16 are located). A lower heat transfer plates 17 is provided on the lower part 13a of the insulator 13 and an upper heat transfer plate 19 is provided on the upper part 13b of the insulator 13. As a result, the upper part 13b of the insulator 13 is interposed between the upper heat transfer plate 19 and the upper surfaces of the first and second thermoelectric conversion elements 111 and 113. Conversely, the lower part 13a of the insulator 13 is interposed between the lower heat transfer plate 17 and the lower surfaces of the first and second thermoelectric conversion elements 111 and 113.

For convenience of description, the positive Z direction is referred to as the upper direction and the negative Z direction is referred to as the lower direction. In addition, the surfaces lying in the positive Z direction are referred to as upper surfaces and the surfaces lying in the negative Z direction are referred to as lower surfaces. However, these are relative terms which are dependent on the actual orientation of the thermoelectric conversion module 10 and are used to identify the positions of various elements and surfaces relative to one another. Thus, a surface which is an "upper" surface can actually be located below the "lower" surface if the thermoelectric conversion module 10 is turned upside down. Similarly, the "upper" and "lower" directions can be left and right directions if the thermoelectric conversion module 10 is rotated clockwise by 90 degrees as viewed in FIG. 1.

The heat transfer plate 17, which preferably has a higher thermal conductivity than the lower part 13a of the insulator 13, assists heat transfer from the main body of the thermoelectric conversion element 10 to the substrate 30. The heat transfer plate 19, which preferably has a higher thermal conductivity than the upper part 13b of the insulator 13, assists heat transfer a heat source (not shown) and the main body of the thermoelectric conversion element 10. [0031]

The module main body 11 has a substantially cuboid shape in which the plurality of first and second thermoelectric conversion elements 111 and 113 are arranged along the length direction (the Y direction) of the module main body. The first and second thermoelectric conversion elements 111 and 113 are arranged to alternate between one another and are preferably laminated together. As best shown in FIG. 2, the leftmost first thermoelectric conversion element 111 lies adjacent the leftmost second thermoelectric conversion element 113 to form a respective thermoelectric conversion element pair. The leftmost second thermoelectric conversion element also lies adjacent the second leftmost first thermoelectric conversion element 111 forming a second thermoelectric conversion element pair. The two adjacent thermoelectric element pairs share a common thermoelectric conversion element (i.e., the leftmost second thermoelectric element 113). Additional adjacent thermoelectric element pairs are formed moving along the length direction of the module main body (with the last thermoelectric conversion element pair consisting of the rightmost thermoelectric second thermoelectric conversion element 111 and the rightmost first thermoelectric conversion element 113).

For each thermoelectric conversion element pair, a first planar surface of one of the thermoelectric conversion element of the pair interfaces a second planar surface of the other the thermoelectric conversion element of the pair. A first portion of the first and second planar surfaces abut one another (e.g., the lowermost portion of the leftmost thermoelectric conversion pair) and a second portion of the first and second planar surfaces are separated by a respective insulator 115.

As shown in FIG. 2, the first thermoelectric conversion elements 111 each have: a first site 111a located on the lower side of the first thermoelectric conversion element 111; and a second site 111b located on the upper side of the first thermoelectric conversion element 111. The second thermoelectric conversion elements 113 each have: a third site 113a located on the lower side of the second thermoelectric conversion element 113 and a fourth site 113b located on the upper side of the second thermoelectric conversion element 113. The insulator layers 115 are each disposed partially between the interfacing surfaces of the first thermoelectric conversion element 111 and the second thermoelectric conversion element 113 of a given thermoelectric conversion element excluding the joined site between the first site 111a and the third site 113a or the joined site between the second site 111b and the fourth site 113b. In this way each successive thermoelectric conversion element pair is electrically coupled at either the top surface of the first and second thermoelectric conversion elements or the bottom surface thereof.

The longitudinal direction of the module main body 11 corresponds to the direction of laminating the first thermoelectric conversion elements 111 and the second thermoelectric conversion elements 113 (i.e., the y direction of FIGS. 1 and 2. The module main body 11 generates electric power with the body thermally coupled to the substrate 30 located outside on the lower side (in the −Z direction) and a heat source located outside on the upper side (in the +Z direction in in FIG. 1), with a higher temperature than the substrate 30.

The ratio between the thickness L41 of each of the first thermoelectric conversion elements 111 and the thickness L42 of each of the second thermoelectric conversion element 113 is preferably set to be equal to the ratio between the reciprocals of the magnitudes of respective resistance values per unit volume for the first thermoelectric conversion element 111 and the second thermoelectric conversion element 113. Thus, the first thermoelectric conversion element 111 is substantially equal in resistance value to the second thermoelectric conversion element 113.

The insulator part 13 preferably covers the entire region including an upper surface 11a and a lower surface 11b of the module main body 11, but excluding a region of the outer surface of the module main body 11 where the electrodes 15, 16 are provided. The insulator part 13 preferably has a lower sub-insulator part (a first sub-insulator part) 13a that covers the lower surface 11b (a lower side) of the module main body 11, and an upper sub-insulator part (a second sub-insulator part) 13b that covers the upper surface 11a (upper side) of the module main body 11.

The electrodes 15, 16 are connected respectively to the first thermoelectric conversion elements 111 located at opposite ends of the module main body 11. The plurality of first and second thermoelectric conversion elements 111 and 113 are alternately connected in series between the pair of electrodes 15, 16. The electrodes 15, 16 are preferably provided to extend onto the lower sub-insulator part 13a from both side surfaces 11c, 11d (FIG. 1) of the module main body 11 in the laminating direction.

The heat transfer plate 17 is provided on a side of the lower sub-insulator part 13a closer to the substrate 30 (opposite to the module main body 11), in a region excluding the regions where the electrodes 15, 16 are formed. The heat transfer plate 19 is provided on a side of the upper-sub insulator part 13b closer to a heat source (opposite to the module main body 11). The heat transfer plate 19 covers a region excluding a part of a peripheral edge in a planar view of the upper sub-insulator part 13b. The heat transfer plate 17 is bonded to the substrate 30 with a conductive member 35 of a conductive paste or the like interposed there between. The heat transfer plate 19 makes contact with the heat source.

The first thermoelectric conversion elements 111 contain a NiMo alloy and a composite oxide represented by composition formula: ATiO3 that has a perovskite structure. This composition is defined as a p-type semiconductor. A of the composition formula: ABO3 includes Sr. A may be La1-xSrx with Sr substituted with La within the range of 0≤x<0.2. Besides, for example, compositions containing Ni, Mo, and (Sr0.965La0.035)TiO3 as main constituents can be adopted as the p-type semiconductor.

The second thermoelectric conversion elements 113 are n-type semiconductors. The second thermoelectric conversion elements 113 contain a composite oxide represented by composition formula: ATiO3 that has a perovskite structure. A of the composition formula: ATiO3 includes Sr. A may be La1-xSrx with Sr substituted with La within the range of 0≤x<0.2. For example, compositions containing (Sr0.965La0.035)TiO3 as a main constituent can be adopted as the n-type thermoelectric conversion material.

The insulator layers 115 are composed of an electrically insulating oxide, for example, Y2O3-doped ZrO2 and the like.

The electrode 15 is composed of: a base layer (not shown) formed from a NiMo alloy or the like and provided on the outer surface of the module main body 11; and a contact layer (not shown) formed from Ni and Sn, or the like, which coats a surface of the base layer opposite to the module main body 11. The contact layer of the electrode 15 is bonded to the conductive pattern 33 and the conductive member 21. The conduct layer preferably has a Ni plating layer and an Sn plating layer formed on the surface layer of the Ni plating layer. The contact layer is configured to have, for example, Ni of 3 to 5 μm in thickness and Sn of 4 to 6 μm in thickness.

The electrodes 15, 16 are joined to the first thermoelectric conversion elements 111 selected on the basis of how the electrodes 15, 16 are joined to the first thermoelectric conversion elements 111 and how the electrodes 15, 16 are joined to the second thermoelectric conversion elements 113. Specifically, the contact layers of the electrodes 15, 16, which are formed from the Ni layer and the Sn layer, are bonded to the first thermoelectric conversion elements 111 formed from a p-type thermoelectric conversion material containing Ni, Mo, Sr, La, Ti, and O as its main constituents.

The base layers of the electrodes 15, 16 achieve ohmic contact with the first thermoelectric conversion elements 111. Thus, the thermoelectric conversion module 10 according to the present embodiment is configured to have the first thermoelectric conversion elements 111 disposed at opposite ends of the module main body 11 in the laminating direction with the electrodes 15, 16 being bonded to the first thermoelectric conversion elements 111. This configuration can reduce the resistance generated at the boundary sites between the electrodes 15, 16 and the first thermoelectric conversion elements 111.

The insulator part 13 is composed of an electrically insulating oxide. As this oxide, Y2O3-doped ZrO2 and the like can be used as with the insulator layers 115. The heat transfer plates 17, 19 are, as with the electrodes 15, 16, composed of: a base layer (not shown) formed from a metal material such as NiMo; and a contact layer (not shown) formed from a metal material such as Ni and Sn, which covers a surface of the base layer opposite to the insulator part 13. The conductive members 21 are composed of a conductive paste or the like obtained by mixing a metal material such as a solder or a conductive material with a resin binder. The conductive members 21 are interposed between parts 15b, 16b of the electrodes 15, 16 formed on the side surfaces 11c, 11d of the module main body 11 and the conductive patterns 33 formed on the substrate 30, and bonded to the electrodes 15, 16 and the conductive pattern 33.

The thermoelectric conversion module 10 according to the present embodiment has a heat transfer path formed through the heat transfer plate 17 between the module main body 11 and the substrate 30, and a heat transfer path formed between the module main body 11 and a heat source through the heat transfer plate 19. In addition, heat transferred from the module main body 11 to the heat transfer plate 17 spreads to the whole transfer plate 17, and then transfers to the substrate 30. Then, heat transferred from the heat source to the heat transfer plate 19 spreads to the whole transfer plate 19, and then transfers to the module main body 11.

Figure 3:
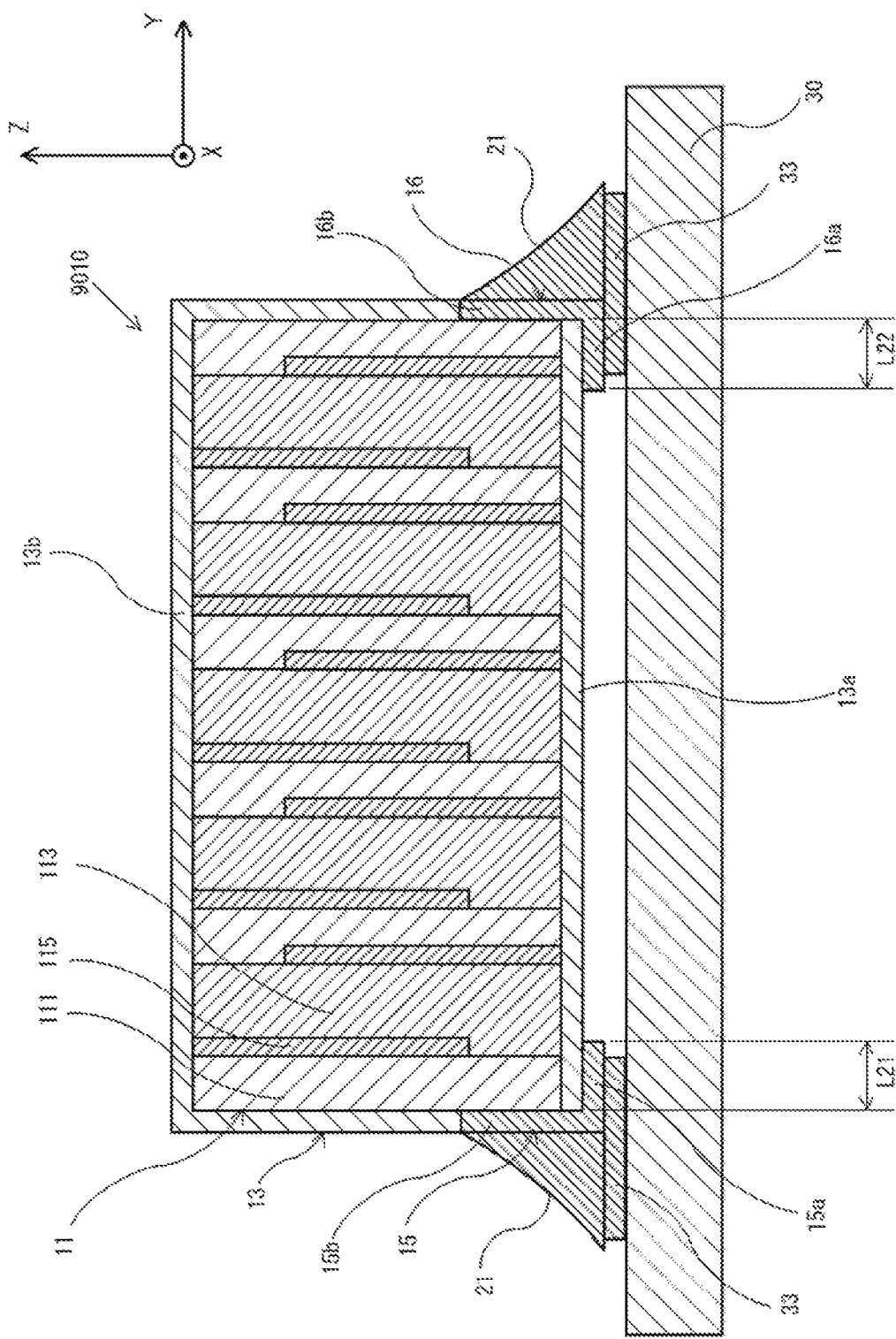
FIG. 3 is a cross-sectional view of a thermoelectric conversion module according to Comparative Example 1.

Next, the results of measuring no-load voltages will be described for the thermoelectric conversion module 10 according to the present embodiment and the following thermoelectric conversion module 9010 according to Comparative Example 1 shown in FIG. 3. The thermoelectric conversion module 9010 according to Comparative Example 1 differs from the thermoelectric conversion module 10 according to Embodiment 1 in that include a heat transfer plate. It is to be noted that the same constituents as those of the thermoelectric conversion module 10 according to Embodiment 1 are denoted by the same reference symbols in FIG. 3. The module main bodies 11 have dimensions of X=6 mm, Y=7 mm, and Z=2.7 mm. The electrodes 15 of the thermoelectric conversion modules 10, 9010 on the lower sub-insulator parts 13a have extension amounts L21, L22 of 0.4 mm. In addition, the heat transfer plate 17 has a length L1 of 6 mm, whereas the heat transfer plate 19 has a length (length in the X direction) L3 of 6 mm, and the widths (the widths in the X direction) of the heat transfer plates 17, 19 are substantially equal to the width (the width in the X direction) of the module main body 11. The term of "substantially equal" encompasses differences of ±5%. The thermoelectric conversion module 9010 according to Comparative Example 1 has a heat transfer path formed between the module main body 11 and the substrate 30 through an air layer interposed there between, and has a heat transfer path formed between the module main body 11 and a heat source, through only a contact point between the insulator part 13 and the heat source.

In the measurement, the heat transfer 19 of the thermoelectric conversion module 10 was brought into contact with a heat source (not shown) disposed above the module main body 11, whereas the upper sub-insulator part 13b of the thermoelectric conversion module 9010 was brought into contact with the heat source. In addition, the temperature of the heat source was maintained at 30° C., and the temperature of the substrate 30 was maintained at 20° C.

The no-load voltage output from the thermoelectric conversion module 9010 according to Comparative Example 1 was 37 mV, whereas the no-load voltage output from the thermoelectric conversion module 10 according to the present embodiment was 72 mV. The reason for this result is believed to be as follows. In the case of the thermoelectric conversion module 9010, there is a void (filled with air) between the vicinity of the center in the longitudinal direction of the module and the substrate 30. Thus, in the vicinity of the center of the thermoelectric conversion module 9010, the thermal coupling between the module main body 11 and the substrate 30 is relatively weak, and the temperature difference between the upper surface 11a and lower surface 11b of the module main body 11 is smaller than the temperature difference between the heat source and the substrate 30. The thermal coupling between the upper surface 11a of the module main body 11 and the heat source is also weak because the thermoelectric conversion module 9010 is merely brought into contact with the heat source. Thus, heat is insufficiently transferred from the heat source to the module main body 11, and in terms of the module main body 11 as a whole, the temperature difference between the upper surface 11a and the lower surface 11b becomes smaller than the temperature difference between the heat source and the substrate 30. Due to these factors, the voltage output from the thermoelectric conversion module 9010 becomes relatively small.

On the other hand, in the case of the thermoelectric conversion module 10, as described above, the heat transfer path through the heat transfer plate 17 is formed between the module main body 11 and the substrate 30, whereas the heat transfer path through the heat transfer plate 19 is formed between the module main body 11 and the heat source, and the thermal coupling between the module main body 11 and the substrate 30 is relatively strong in the vicinity of the center of the thermoelectric conversion module 10. Thus, the temperature difference between the upper surface 11a and lower surface 11b of the module main body 11 is substantially equal to the temperature difference between the heat source and the substrate 30. The term of "substantially equal" mentioned previously encompasses differences of ±5%. In this case, the voltage output from the thermoelectric conversion module 10 is higher as compared with the voltage output from the thermoelectric conversion module 9010.

As described above, the thermoelectric conversion module 10 according to the present embodiment forms the heat transfer paths through the heat transfer plates 17, 19 respectively between the module and the substrate 30 and between the module and the heat source, thereby making it possible to strength thermal coupling between the heat source and the module main body 11 and between the module main body 11 and the substrate 30. Accordingly, the module main body 11 can achieve a temperature difference closer to the temperature difference between the heat source and the substrate 30. In addition, heat transferred from the heat source to the heat transfer plate 19 spreads to the whole heat transfer plate 19, and then transfers to the module main body 11. In addition, heat transferred from the module main body 11 to the heat transfer plate 17 spreads to the whole transfer plate 17, and then transfers to the substrate 30. Thus, as compared with the thermoelectric conversion module 9010 according to Comparative Example 1, heat is transferred uniformly over the entire length of the heat transfer plate 17 in the module main body 11 to the substrate 30, and heat is transferred uniformly from the heat source to the entire part corresponding to the heat transfer plate 19 in the module main body 11. Accordingly, the power generation efficiency of the module main body 11 can be improved.

In addition, according to the present embodiment, the heat transfer plate 17 is provided on the lower sub-insulator part 13a, whereas the heat transfer plate 19 is provided on the upper sub-insulator part 13b. Thus, the thermal coupling can be strengthened both between the module main body 11 and the substrate 30 and between the module main body 11 and the heat source. Accordingly, the module main body 11 can achieve a temperature difference closer to the temperature difference between the heat source and the substrate 30.

In addition, the heat transfer plates 17, 19 are formed from a metal material. Thus, the thermoelectric conversion module 10 can be joined by metal joining with the use of a solder or the like, for example, to a metal part provided on the substrate 30 or a metal part of the heat source. In this case, thermal coupling can be strengthened between the substrate 30 or the heat source and the module main body 11.

Furthermore, in the thermoelectric conversion module 10 according to the present embodiment, the electrodes 15, 16 are connected to the conductive patterns 33 of the substrate 30 with the conductive members 21 interposed there between. Thus, the connection strength between the thermoelectric conversion module 10 and the substrate 30 can be increased, and the heat-transfer performance between the module main body 11 and the substrate 30 can be increased because the heat transfer paths via the conductive members 21 are formed.

Next, a method for manufacturing the thermoelectric conversion module 10 according to the present embodiment will be described with reference to FIG. 4.

First, La2O3, SrCO3, and TiO2 are weighed (step S1). Specifically, La2O3, SrCO3, and TiO2 are weighed so as to meet Sr:La:Ti=0.965:0.035:1 in terms of molar ratio.

Next, the powder materials of La2O3, SrCO3, and TiO2 weighed are mixed with the addition of pure water thereto (step S2). For example, the materials are subjected to grinding and mixing with the use of a ball mill (step S2).

Subsequently, the slurry containing La2O3, SrCO3, and TiO2 is dried (step S3). Thereafter, the product obtained by drying the slurry is subjected to calcination (step S4). The calcination is carried out under the condition of 1000 to 1400° C. in the atmosphere. Thus, a powder material of (Sr0.965La0.035)TiO3 is produced.

Thereafter, the powder material of (Sr0.965La0.035)TiO3, an organic solvent such as toluene and ethanol, and a binder material such as polyvinyl butyral are mixed (step S5) thereby producing a mixture containing (Sr0.965La0.035)TiO3. Next, the produced mixture is molded into the form of a sheet (step S6), to form n-type thermoelectric conversion material sheets for the second thermoelectric conversion elements 113.

In addition, the powder material of (Sr0.965La0.035)TiO3 produced in accordance with the process in the step S4, a Ni powder material, and a Mo powder material are weighed (step S7). Specifically, the materials are weighed such that the molar ratio between Ni and Mo is 0.9:0.1, and the total ratio of Ni and Mo by weight is 80 wt. %, whereas the ratio of (Sr0.965La0.035)TiO3 by weight is 20 wt. %.

Subsequently, the powder material of (Sr0.965La0.035)TiO3, the Ni powder material, the Mo powder material, an organic solvent such as toluene and ethanol, and a binder material such as polyvinyl butyral are mixed (step S8). Thus, a mixture containing Ni, Mo, and (Sr0.965La0.035)TiO3 is produced. Thereafter, the produced mixture is molded into the form of a sheet (step S9), thereby producing p-type thermoelectric conversion material sheets for the first thermoelectric conversion elements 111.

In addition, an insulating paste for the insulator layers 115 and the insulator part 13 is produced in parallel with the production of the n-type thermoelectric conversion material sheets and the p-type thermoelectric conversion material sheets. In the production of the insulating paste, first, a powder material of Y2O3-doped ZrO2 is weighed (step S10).

Next, the powder material of Y2O3-doped ZrO2 and a resin such as a varnish are mixed (step S11). The powder material of Y2O3-doped ZrO2 and an organic solvent such as a varnish can be mixed with the use of a roll machine or the like. Thus, the insulating paste containing the Y2O3-doped ZrO2 is produced.

After producing the n-type thermoelectric conversion material sheets, the insulating paste is applied to the n-type thermoelectric conversion material sheets through the use of a printing technique (step S12). Likewise, after producing the p-type thermoelectric conversion material sheets, the insulating paste is also applied to the p-type thermoelectric conversion material sheets through the use of a printing technique (step S13). This insulating paste is applied by printing to be 5 μm in thickness. The insulating paste is applied in a patterned form so as to cover the entire region excluding parts of the n-type thermoelectric conversion material sheets and p-type thermoelectric conversion material sheets, which correspond to the directly joined parts between the n-type thermoelectric conversion layers 113 and the first thermoelectric conversion elements 111.

Subsequently, the n-type thermoelectric conversion material sheets and p-type thermoelectric conversion material sheets with the insulating paste applied thereto are stacked alternately, and then subjected to pressure bonding (step S14). For example, the p-type thermoelectric conversion material sheets and the n-type thermoelectric conversion material sheets are stacked alternately at a thickness ratio of 1:4, so as to reach 50 pairs. Then, the n-type thermoelectric conversion material sheets and p-type thermoelectric conversion material sheets stacked are subjected to pressure bonding by an isostatic press method.

Thereafter, the laminated body of the n-type thermoelectric conversion material sheets and p-type thermoelectric conversion material sheets subjected to the pressure bonding is cut into individual pieces, thereby producing the module main body 11 (step S15).

Next, the insulating paste is applied to the outer surface of the module main body 11, and dried (step S16). Specifically, with a mask attached to a region of the outer surface of the module main body 11 where the electrode 15 is to be formed, the insulating paste is applied through the use of a dip coating technique, and thereafter, the mask is removed. Then, the insulating paste is dried. Thus, the insulator part 13 is produced which partially covers the outer surface of the module main body 11.

Subsequently, a NiMo paste is applied onto the outer surface of the module main body 11 and the insulator part 13 (step S17). Specifically, the NiMo paste is applied to regions of the side surfaces 11c, 11d of the module main body 11, which are not covered with the insulator part 13, regions of the lower sub-insulator part 13a at both ends in the longitudinal direction, a region of the upper sub-insulator part 13b in the center thereof, and a region of the lower sub-insulator part 13a in the center thereof. This NiMo paste is produced by mixing a Ni powder material and a Mo powder material with an organic solvent such as a varnish.

Thereafter, the module main body 11 with the insulating paste and NiMo paste applied thereto is subjected to firing (step S18). Specifically, the module main body 11 with the insulating paste and NiMo paste applied thereto is subjected to a degreasing treatment in the atmosphere, and then subjected to firing under the condition of temperature: 1200° C. to 1400° C. in a reducing atmosphere with an oxygen partial pressure of 10-10 to 10-15 MPa. Thus, a fired body is produced which is composed of the module main body 11, the insulator part 13, a base layer for the electrode 15, and base layers for the heat transfer plates 17, 19.

Next, the so produced fired body is subjected to a plating treatment (step S19). Specifically, the small biological body is subjected to an electrolytic plating treatment, thereby forming contact layers of Ni and Sn or the like on the base layer for the electrode 15 and the base layers for the heat transfer plates 17, 19.

As described above, in accordance with the method for manufacturing the thermoelectric conversion module 10 according to the present embodiment, the insulating pastes respectively applied to the first thermoelectric conversion elements 111 and the n-type thermoelectric conversion layers 113 and the insulating paste partially applied to the outer surface of the module main body 11 are simultaneously subjected to co-firing. Thus, the number of firing steps can be reduced, and the manufacturing process can be thus simplified.

Embodiment 2

Figure 5:
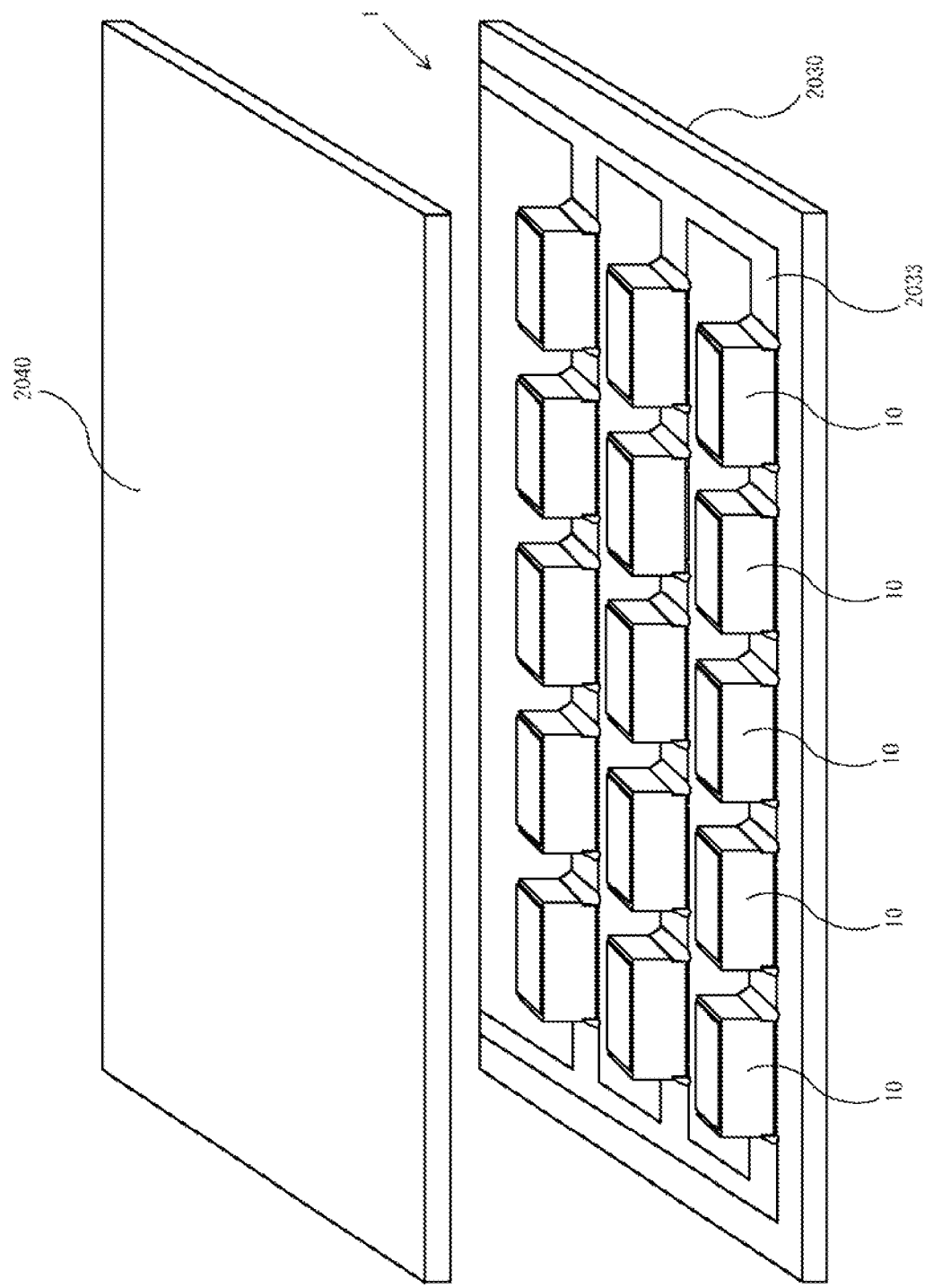
FIG. 5 is a perspective view of a thermoelectric conversion module according to Embodiment 2.
Figure 6:
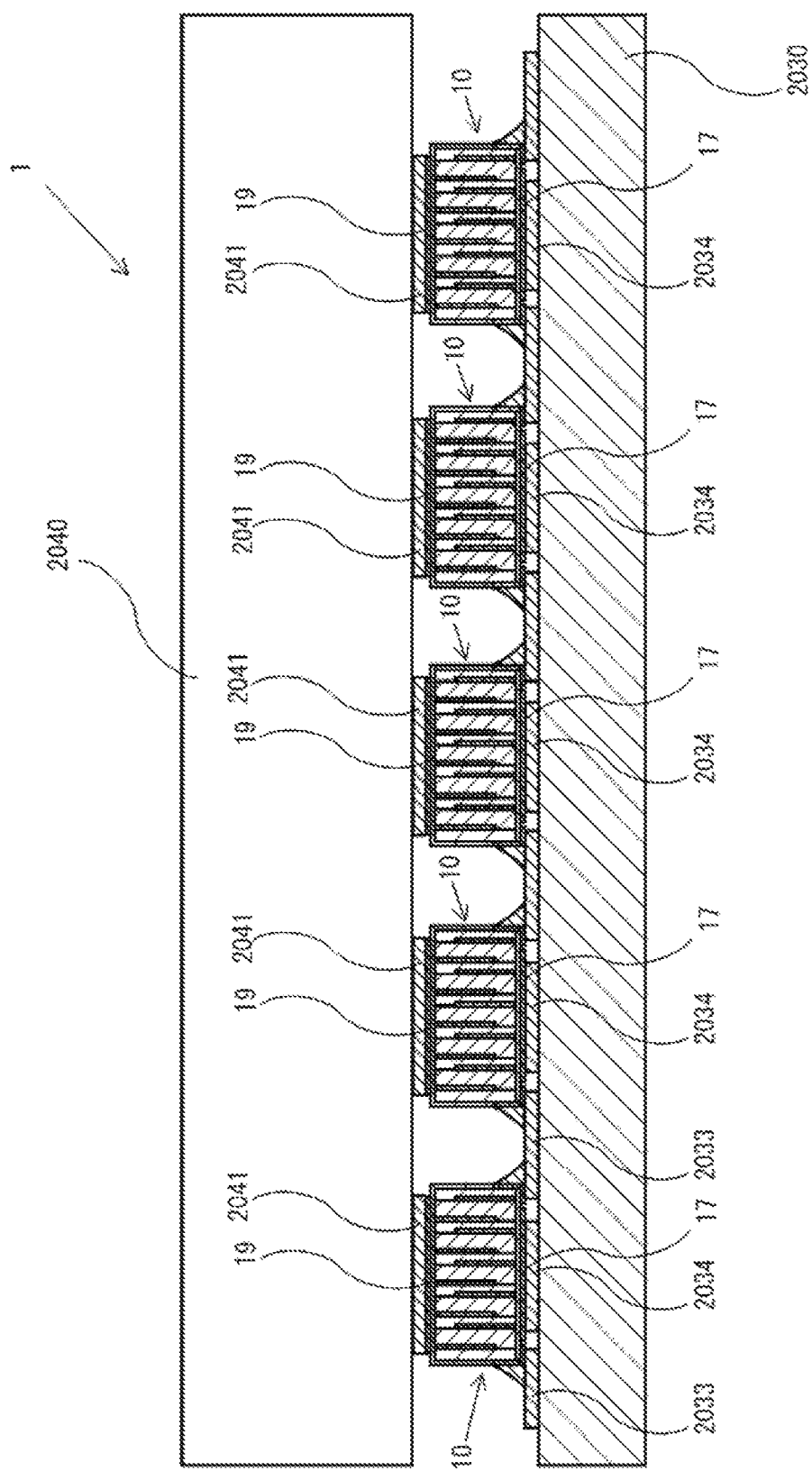
FIG. 6 is a cross-sectional view of the thermoelectric conversion module according to Embodiment 2.

A thermoelectric conversion module 1 according to the present embodiment has, as shown in FIG. 5, 5×3 thermoelectric conversion modules 10 as described in Embodiment 1, which are connected in series and parallel on a substrate 2030. The substrate 2030, which is composed of a rigid substrate formed from a glass epoxy resin or the like, has a conductive pattern 2033 in a fashion that can connect the 5×3 thermoelectric conversion modules 10 in series and parallel. In addition, the substrate 2030 is, as shown in FIG. 6, provided with conductive members 2034 at sites opposed to the heat transfer plates 17 of the respective thermoelectric conversions 10. The conductive members 2034 are formed from a metal material such as Ni and Sn.

The electrodes 15 of the thermoelectric conversion modules 10 are joined, with the conductive members 21, to the conductive pattern 2033 formed on the substrate 2030, and the heat transfer plates 17 of the thermoelectric conversion modules 10 are jointed to the conductive members 2034. In addition, the heat transfer plates 19 are joined to a heat source 2040 with conductive members 2041 such as a conductive paste.

Next, the results of measuring no-load voltages will be described for the thermoelectric conversion module 1 according to the present embodiment and the following thermoelectric conversion module according to Comparative Example 2. The thermoelectric conversion module according to Comparative Example 2 has 5×3 thermoelectric conversion modules 9010 according to Comparative Example 1, as described in Embodiment 1, which are connected respectively in series and parallel. In addition, the substrate 2030 and the heat source 2040 are adapted in the same fashion as the thermoelectric conversion module 1 according to the present embodiment. The measurement was made with the temperature of the heat source 2040 maintained at 30° C. and the temperature of the substrate 2030 maintained at 20° C. For each of the thermoelectric conversion module 1 according to the present embodiment and the thermoelectric conversion module according to Comparative Example 2, ten modules were prepared, and the average values for the no-load voltages output from the modules were evaluated.

The average value for the no-load voltage output from the thermoelectric conversion module according to Comparative Example 2 was 172 mV, whereas the average value for the no-load voltage output from the thermoelectric conversion module 1 was 368 mV. From this result, it is determined that the result of high voltage output from each thermoelectric conversion module 10 constituting the thermoelectric conversion module 1 described in Embodiment 1 is reflected as compared with the thermoelectric conversion module 9010 according to the comparative example. In addition, the output voltage of the thermoelectric conversion module 1 is substantially equal to the quintuple of the output voltage (72 mV) of the thermoelectric conversion module 10 described in Embodiment 1. As noted above, the term "substantially equal" encompasses differences of ±5%. More specifically, when the output voltage of each thermoelectric conversion module 10 is determined, the output voltage in the case of five thermoelectric conversion modules 10 connected series can be estimated with a relatively high degree of accuracy.

In addition, the standard deviation of the no-load voltage output from the thermoelectric conversion module according to Comparative Example 2 was 27 mV, whereas the standard deviation of the no-load voltage output from the thermoelectric conversion module 1 was 4 mV. More specifically, the fluctuation in the no-load voltage output from the thermoelectric conversion module 1 is small as compared with the comparative example. From this result, in the case of the thermoelectric conversion module according to Comparative Example 2, it is determined that the thermal coupling between each thermoelectric conversion module 9010 and the heat source 2040 and between each thermoelectric conversion module 9010 and the substrate 2030 is relatively weak, thereby making the heat transfer there between more likely to be affected by variation in manufacture. On the other hand, in the case of the thermoelectric conversion module 1, it is determined that the thermal coupling between each thermoelectric conversion module 9010 and the heat source 2040 and between each thermoelectric conversion module 9010 and the substrate 2030 is relatively weak, thereby making the heat transfer less likely to be affected by the variation.

As described above, in the thermoelectric conversion module 1 according to the present embodiment, each thermoelectric conversion module 10 has the heat transfer plates 17, 19, thereby making it possible to strengthen thermal coupling between each thermoelectric conversion module 10 and the heat source 2040 and between each thermoelectric conversion module 10 and the substrate 2030. Thus, the fluctuation in heat transfer can be reduced between each thermoelectric conversion module 10 and the heat source 2040 and between each thermoelectric conversion module 10 and the substrate 2030.

Figure 7:
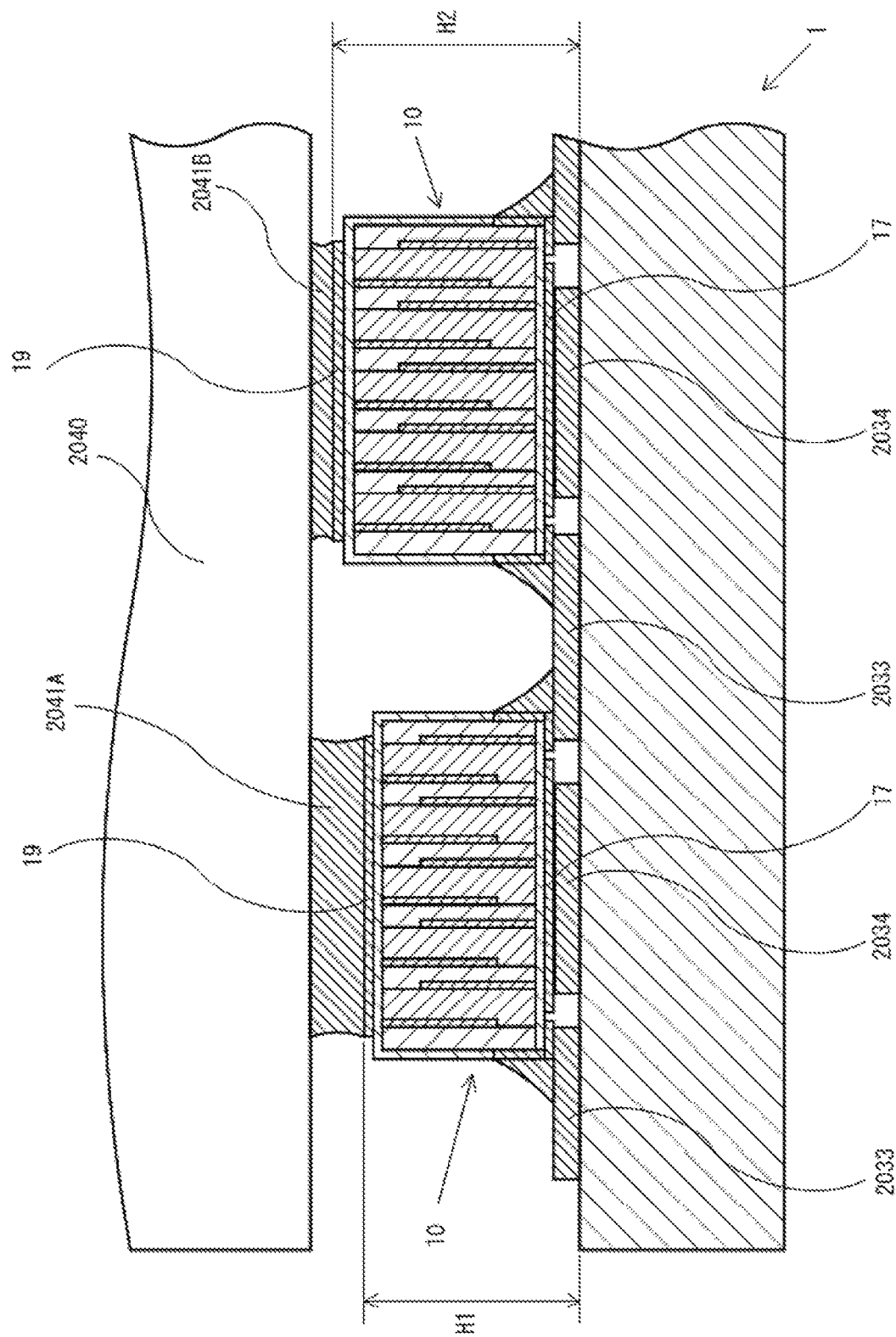
FIG. 7 is a cross-sectional view of the thermoelectric conversion module according to Embodiment 2.

In addition, for the plurality of thermoelectric conversion modules 10 constituting the thermoelectric conversion module 1 according to the present embodiment, the heat transfer plates 19 are formed from a metal material. In FIG. 7, the heights H1, H2 of the heat transfer plates 19 are assumed to vary between the plurality of thermoelectric conversion modules 10. In this case, for the thermoelectric conversion module 1, the heat transfer plates 19 and the heat source 2040 are joined in a way that appropriate amounts of conductive members 2041A, 2041b such as a conductive paste are, depending on the heights H1, H2, packed between the heat transfer plates 19 of the respective thermoelectric conversion modules 10 and the heat source 2040. Thus, the plurality of thermoelectric conversion modules 10 can be thermally coupled to the heat source 2040 in a uniform manner.

Embodiment 3

Figure 8:
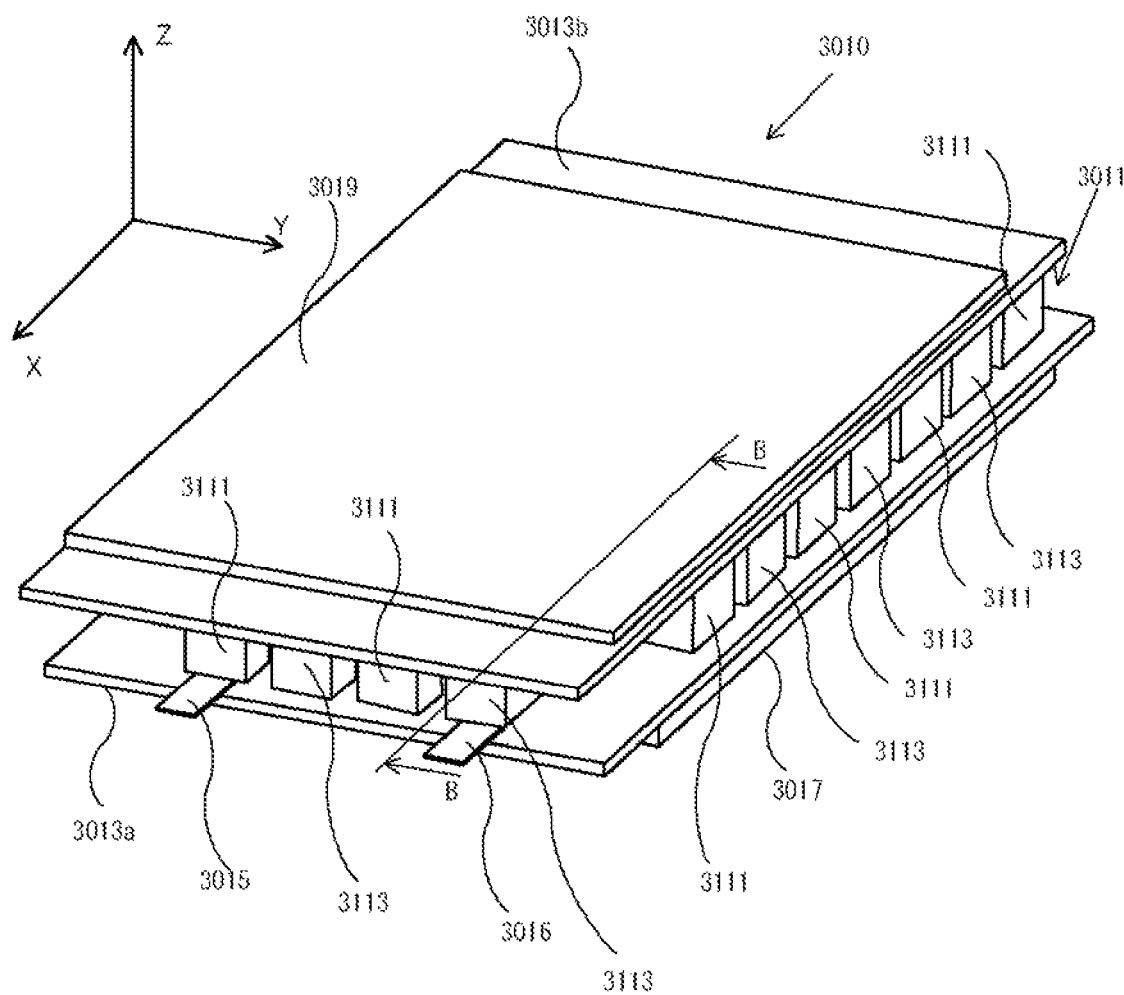
FIG. 8 is a perspective view of a thermoelectric conversion module according to Embodiment 3.

A thermoelectric conversion module 3010 according to the embodiment 3 is a so-called n-type thermoelectric conversion module, which includes, as shown in FIG. 8, two insulating substrates (insulator parts) 3013a, 3013b, an module main body 3011 including a plurality of first thermoelectric conversion elements 3111 and a plurality of second thermoelectric conversion elements 3113, two electrodes 3015, 3016, and heat transfer plates 3017, 3019. It is to be noted that an explanation will be given with the ±Z directions in FIG. 8 as an upward and downward directions in the description of the present embodiment.

The two insulating substrates 3013a, 3013b, which are formed from an electrically insulating material, have the shape of a substantially rectangular plate. The two insulating substrates 3013a, 3013b are disposed to have an overlap at an interval in the thickness direction of the substrates. The electrically insulating material that forms the insulating substrates 3013a, 3013b is, for example, a material with a relatively high thermal conductivity, such as Al2O3. The thicknesses of the insulating substrates 3013a, 3013b are not to be considered particularly limited.

The electrode 3015 is joined to one first thermoelectric conversion elements 3111 located at an end of the module main body 3011, among the plurality of first thermoelectric conversion elements 3111. In addition, the electrode 3016 is joined to one second thermoelectric conversion elements 3113 located at an end of the module main body 3011, among the plurality of second thermoelectric conversion elements 3113. The electrodes 3015, 3016 are formed from a metal material such as Ag.

In the module main body 3011, the plurality of first thermoelectric conversion elements 3111 and the plurality of second thermoelectric conversion elements 3113 are alternately arranged at intervals in two directions (the XY directions in FIG. 8). The module main body 3011 generates electric power with the body thermally coupled to a lower heat source located outside on the lower side (in the −Z direction in FIG. 8) and an upper heat source located outside on the upper side (in the +Z direction in in FIG. 8), with a higher temperature than the lower heat source. It is to be noted that the upper heat source may be a heat generating device, whereas the lower heat source may be outside air.

The first thermoelectric conversion elements 3111, which each has a substantially cuboid shape, are formed from a p-type thermoelectric conversion material (first thermoelectric conversion material). The second thermoelectric conversion elements 3113, which each has a substantially cuboid shape, are also formed from an n-type thermoelectric conversion material (second thermoelectric conversion material). The p-type thermoelectric conversion material and the n-type thermoelectric conversion material respectively have the same materials as the p-type thermoelectric conversion material and n-type thermoelectric conversion material described in Embodiment 1.

Figure 9:
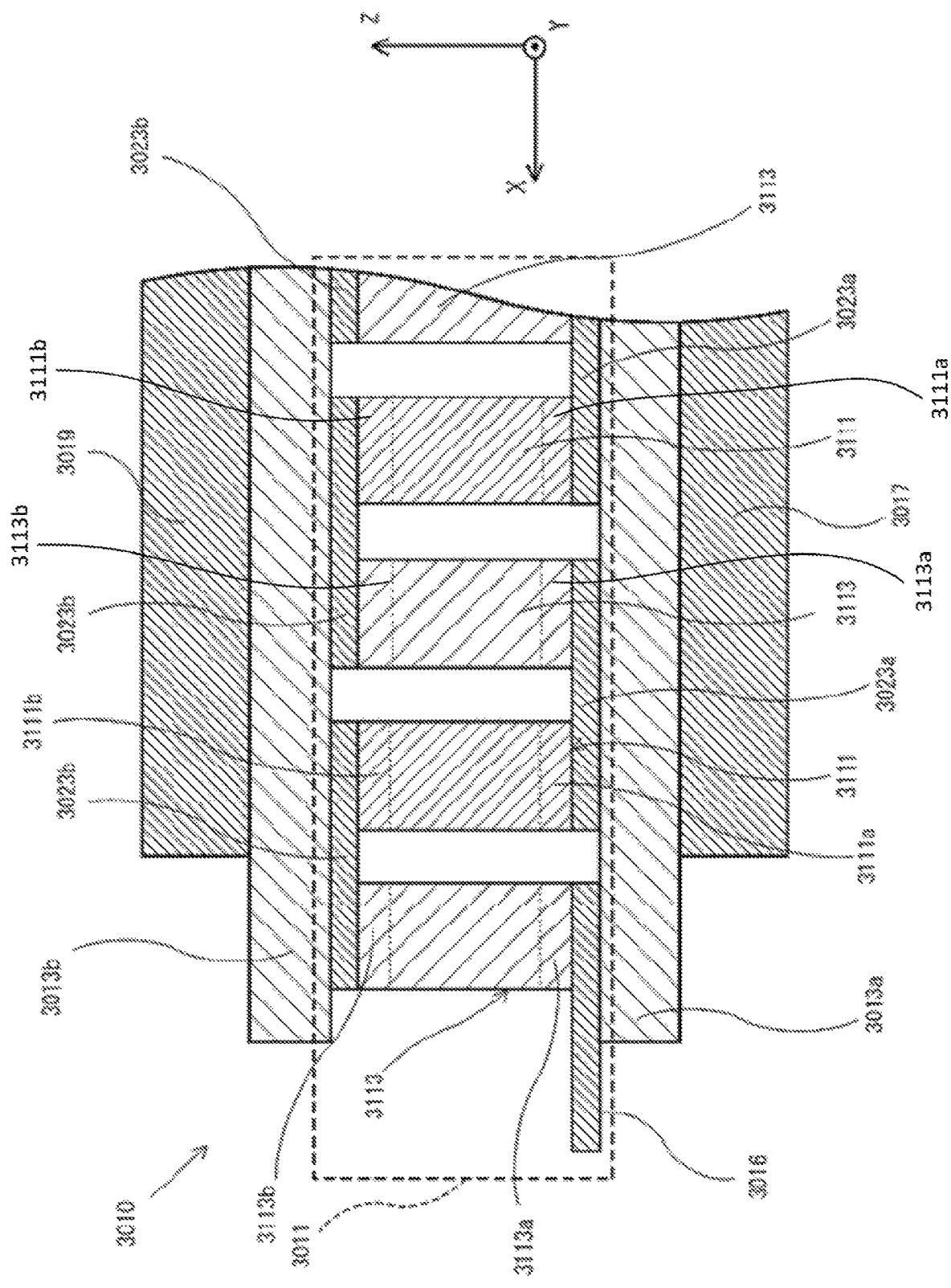
FIG. 9 is a cross-sectional arrow view of the thermoelectric conversion module according to Embodiment 3 along the line B-B in FIG. 8.

The first thermoelectric conversion elements 3111 and the second thermoelectric conversion elements 3113 are, as shown in FIG. 9, sandwiched between the two insulating substrates 3013*a*, 3013*b*. The first thermoelectric conversion elements 3111 each have a first site 3111*a* located on the lower side and a second site 3111*b* located on the upper side. The second thermoelectric conversion elements 3113 each have a third site 3113*a* located on the lower side and a fourth site 3111*c* located on the upper side.

The insulating substrates 3013*a*, 3013*b* are provided respectively with conductive members 3023*a*, 3023*b* for electrically connecting the first thermoelectric conversion elements 3111 and the second thermoelectric conversion elements 3113. The conductive members 3023*a*, 3023*b* are formed from a conductive material containing, as its main constituent, a metal material such as Ag.

The first site 3111*a* of the first thermoelectric conversion element 3111 is electrically connected through the conductive member 3023*a* to the third site 3113*a* of the second thermoelectric conversion element 3113 which is adjacent to the first thermoelectric conversion element 3111. In addition, the second site 3111*b* of the first thermoelectric conversion element 3111 is electrically connected through the conductive member 3023*b* to the fourth site 3113*b* of the second thermoelectric conversion element located adjacent to (to the left of) the first thermoelectric conversion element 3111.

The third site 3113*a* of the second thermoelectric conversion element 3113 is electrically connected through the conductive member 3023*a* to the first site 3111*a* of one first thermoelectric conversion element 3111 adjacent to (to the right of) the second thermoelectric conversion element 3113. In addition, the fourth site 3113*b* of the second thermoelectric conversion element 3113 is electrically connected through the conductive member 3023*b* to the second site 3111*b* of another first thermoelectric conversion element 3111 adjacent to the second thermoelectric conversion element 3113. In this way, the pluralities of first thermoelectric conversion elements 3111 and second thermoelectric conversion elements 3113 are alternately connected in series between the two electrodes 3015, 3016.

The heat transfer plates 3017, 3019 are provided on the sides of the insulating substrates 3013*a*, 3013*b* opposite to the sides opposed to the first thermoelectric conversion elements 3111 and the second thermoelectric conversion elements 3113.

Figure 10:
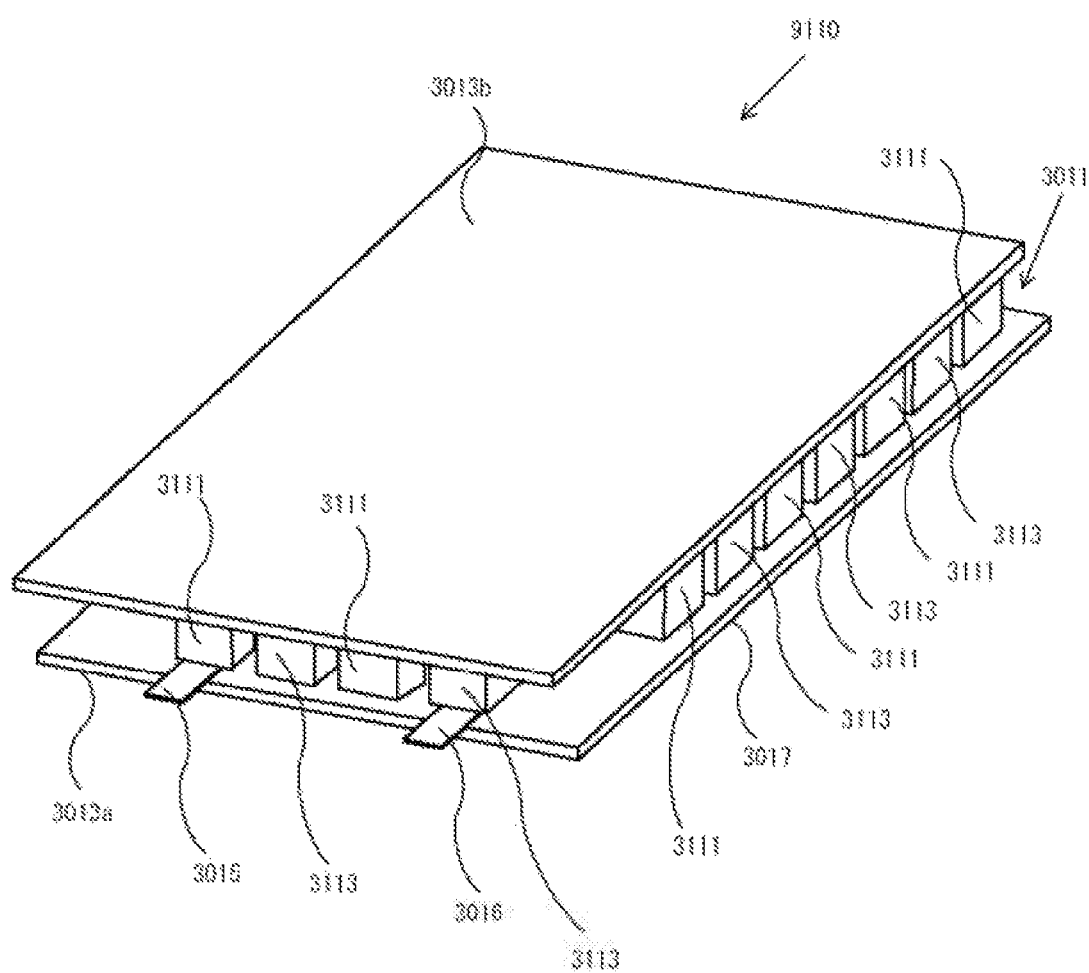
FIG. 10 is a perspective view of a thermoelectric conversion module according to Comparative Embodiment 3.

Next, the results of measuring no-load voltages will be described for the thermoelectric conversion module 3010 according to the present embodiment and the following thermoelectric conversion module according to Comparative Example 3. As shown in FIG. 10, the thermoelectric conversion module 9110 according to Comparative Example 3 corresponds to the thermoelectric conversion module 3010 according to the present embodiment with the heat transfer plates 3017, 3019 omitted. It is to be noted that in FIG. 10, the same constituents as those of the thermoelectric conversion module 3010 are denoted by the same reference symbols as in FIG. 8. In addition, the thermoelectric conversion modules 3010, 9110 each have fifty first thermoelectric conversion elements 3111 and fifty second thermoelectric conversion elements 3113 alternately connected in series between the two electrodes 3015, 3016. The thermoelectric conversion module 3010 has a metallic part (not shown) formed in a fashion spaced from the heat transfer plates 3017, 3019 to wrap around the insulating substrates 3013*a*, 3013*b* from the side opposed to the first thermoelectric conversion elements 3111 and the second thermoelectric conversion elements 3113 to the opposite side. The measurement was made with the heat transfer plates 3017, 3019 of the thermoelectric conversion module 3010 joined respectively to heat sources with conductive members such as a conductive paste, and with the insulating substrates 3013*a*, 3013*b* of the thermoelectric conversion module 9110 respectively brought into contact with heat sources. In addition, the temperatures of the heat sources closer to the insulating substrates 3013*a* were maintained at 20° C., whereas the temperatures of the heat sources closer to the insulating substrates 3013*b* were maintained at 30° C.

The no-load voltage output from the thermoelectric conversion module 9110 according to Comparative Example 3 was 30 mV, whereas the no-load voltage output from the thermoelectric conversion module 3010 was 66 mV. From this result, it is determined that in the case of the thermoelectric conversion module 9110, because of the insulating substrates 3013*a*, 3013*b* merely in contact with the heat sources, the thermal coupling between the insulating substrates 3013*a*, 3013*b* and the heat sources is relatively weak, thereby making the temperature difference between the insulating substrates 3013*a*, 3013*b* smaller than the temperature difference between the heat sources. In addition, the voltage output from the thermoelectric conversion module 9110 is thus lower as compared with the voltage output from the thermoelectric conversion module 3010.

On the other hand, in the case of the thermoelectric conversion module 3010, the insulating substrates 3013*a*, 3013*b* and the heat sources are thermally strongly coupled because of the heat transfer plates 3017, 3019 respectively joined to the heat sources with the conductive members such as a conductive paste interposed there between. Thus, the temperature difference between the insulating substrates 3013*a*, 3013*b* is substantially equal to the temperature difference between the heat sources. Again, the term "substantially equal" encompasses differences of ±5%. Accordingly, the voltage output from the thermoelectric conversion module 3010 is higher as compared with the voltage output from the thermoelectric conversion module 9110.

As described above, the thermoelectric conversion module 3010 according to the present embodiment is configured to function as a so-called n-type thermoelectric conversion module, thereby making it possible to increase the output voltage.

In addition, the thermoelectric conversion module 3010 is configured to have (air filled) gaps between the first thermoelectric conversion elements 3111 and the second thermoelectric conversion elements 3113. Thus, for example, as compared with being configured to fill, with an insulating material, the spaces between the first thermoelectric conversion elements 3111 and the second thermoelectric conversion elements 3113, the thermoelectric conversion module 3010 can be reduced in weight.

Figure 11:
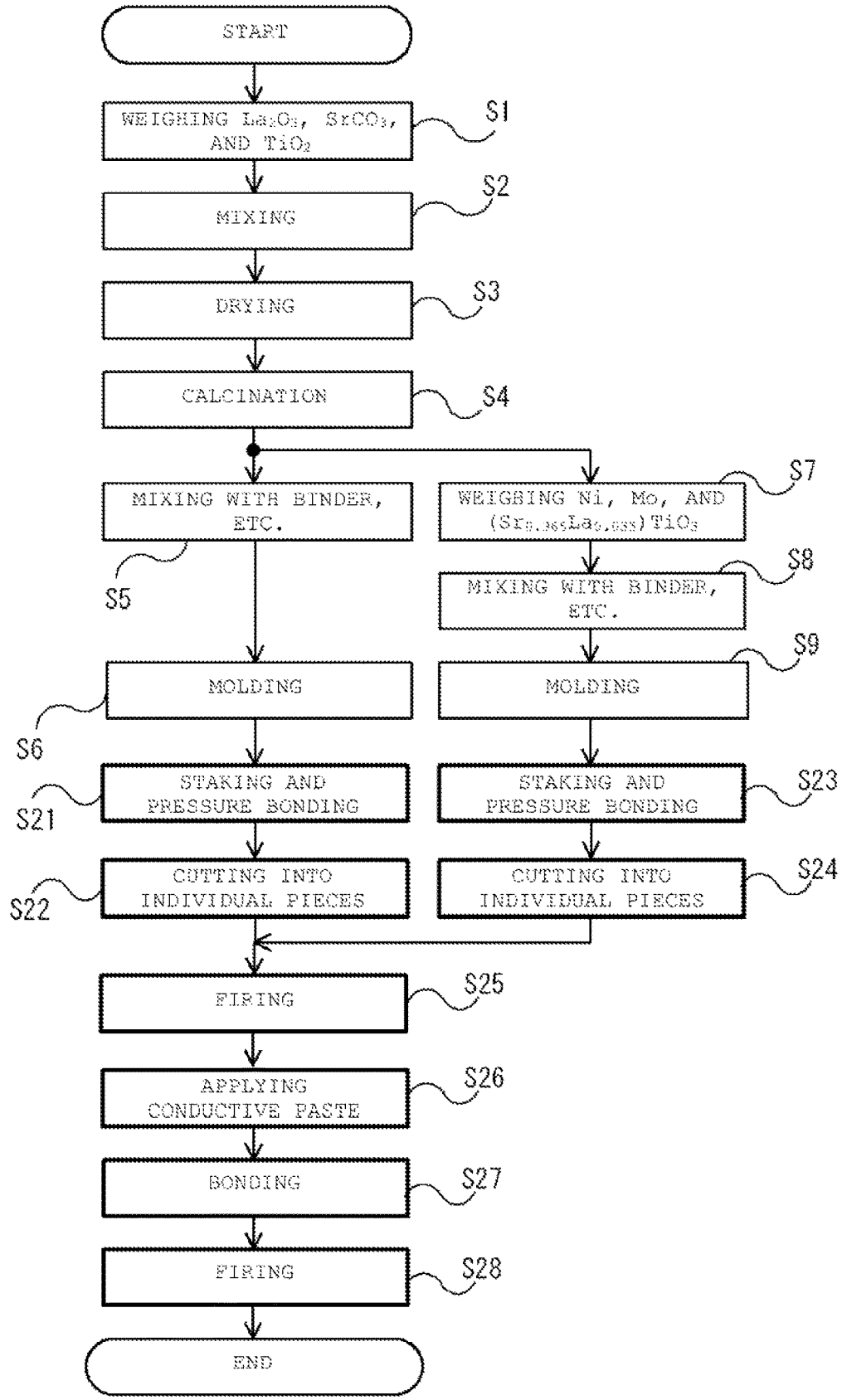
FIG. 11 is a diagram for explaining a method for manufacturing the thermoelectric conversion module according to Embodiment 3.

Next, a method for manufacturing the thermoelectric conversion module 3010 according to the present embodiment will be described with reference to FIG. 11. It is to be noted that in FIG. 11, the same treatments as those of the manufacturing method according to Embodiment 1 are denoted by the same reference symbols as in FIG. 4.

After completing the process in the step S6, the n-type thermoelectric conversion material sheets produced are stacked and subjected to pressure bonding, thereby producing a stacked body of the n-type thermoelectric conversion material sheets (step S21). Specifically, the n-type thermoelectric conversion material sheets are subjected to pressure bonding by an isostatic press method. Next, the laminated body of the n-type thermoelectric conversion material sheets is cut with a dicing machine, thereby producing laminated bodies for the second thermoelectric conversion elements 3113 (step S22).

In addition, after completing the process in the step S8, the p-type thermoelectric conversion material sheets produced are stacked, and subjected to pressure bonding, thereby producing a stacked body of the p-type thermoelectric conversion material sheets (step S23). Specifically, the p-type thermoelectric conversion material sheets are subjected to pressure bonding by an isostatic press method. Next, the laminated body of the p-type thermoelectric conversion material sheets is cut with a dicing machine, thereby producing laminated bodies for the first thermoelectric conversion elements 3111 (step S24).

Thereafter, the laminated bodies for the second thermoelectric conversion elements 3113 and the laminated bodies for the first thermoelectric conversion elements 3111 are each subjected to firing (step S25). Specifically, first, the laminated bodies for the second thermoelectric conversion elements 3113 and the first thermoelectric conversion elements 3111 are each subjected to a degreasing treatment in the atmosphere. Thereafter, the laminated bodies for the second thermoelectric conversion elements 3113 and the first thermoelectric conversion elements 3111 are each subjected to firing under the condition of temperature: 1200 to 1400° C. in a reducing atmosphere with an oxygen partial pressure of 10-10 to 10-15 MPa. Thus, the second thermoelectric conversion elements 3113 and the first thermoelectric conversion elements 3111 are produced.

Next, a conductive paste is applied to opposite ends in the longitudinal direction for each of the second thermoelectric conversion elements 3113 and the first thermoelectric conversion elements 3111, and to sides of the insulating substrates 3013a, 3013b opposite to the sides opposed to the first thermoelectric conversion elements 3111 and the second thermoelectric conversion elements 3113 (step S26). For example, an Ag paste may be adopted as the conductive paste.

Subsequently, the second thermoelectric conversion elements 3113 and the first thermoelectric conversion elements 3111 are each bonded to the conductive members 3023a, 3023b of the insulating substrates 3013a, 3013b or the electrode 3015, 3016, with a conductive paste interposed there between (step S27).

Thereafter, the second thermoelectric conversion elements 3113, the first thermoelectric conversion elements 3111, the electrodes 3015, 3016, and the insulating substrates 3013a, 3013b, bonded to each other with the conductive paste interposed there between, are subjected to firing (step S18). Specifically, the firing is carried out under the condition of temperature: 800° C. in the atmosphere. Thus, the thermoelectric conversion module 3010 is produced.

As described above, in accordance with the method for manufacturing the thermoelectric conversion module 3010 according to the present embodiment, the first thermoelectric conversion elements 3111 and the second thermoelectric conversion elements 3113 are produced respectively by laminating the p-type thermoelectric conversion material sheets on one another and the n-type thermoelectric conversion material sheets on one another. Accordingly, unlike the method for manufacturing the thermoelectric conversion module 10 according to Embodiment 1, in stacking the p-type thermoelectric conversion material sheets or the n-type thermoelectric conversion material sheets, there is no need to position the p-type thermoelectric conversion material sheets or the n-type thermoelectric conversion material sheets in accordance with the pattern of an insulating paste formed on the sheets. Accordingly, the manufacturing process can be simplified.

Embodiment 4

Figure 12:
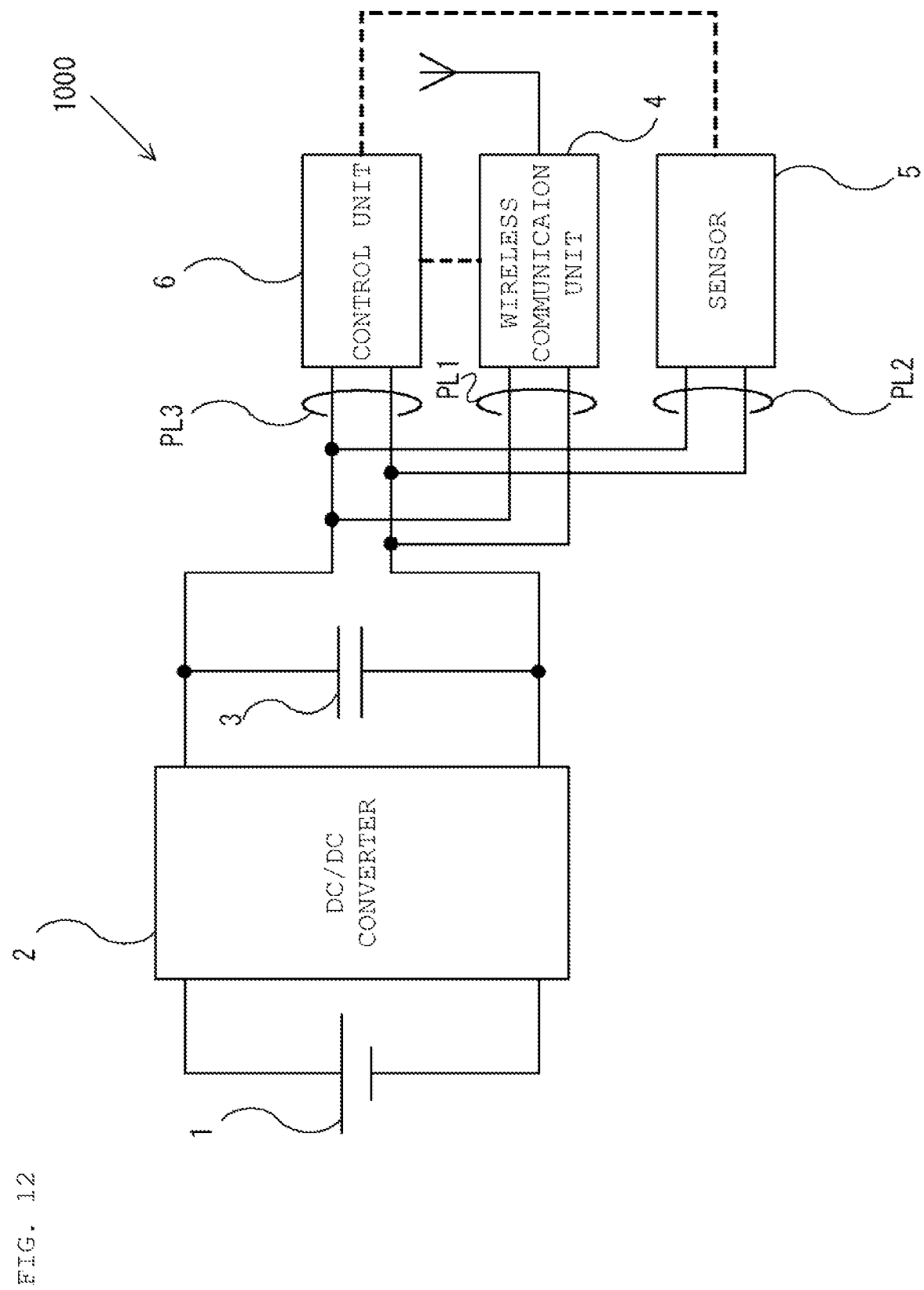
FIG. 12 is a circuit diagram illustrating the configuration of a wireless communication device according to Embodiment 4.

A communication device 1000 according to the present embodiment includes, as shown in FIG. 12, the thermoelectric conversion module 1 described in Embodiment 2, a DC/DC converter 2, a capacitor 3, a wireless communication unit 4, a sensor 5, and a control unit 6. The DC/DC converter 2 is composed of a step-up circuit. It is to be noted that an explanation will be given with the operating voltages of the wireless communication unit 4, the sensor 5, and the control unit 6 being regarded as being equal. The capacitor 3 supplies electric power through power lines PL1, PL2, PL3 respectively to the wireless communication unit 4, the sensor 5, and the control unit 6.

The wireless communication unit 4 including, for example, a modem, a gateway, and the like, converts signals input from the control unit 6 and transmits the converted signals to the outside, and converts signals received from the outside and outputs the converted signals to the control unit 6. The sensor 5 is composed of, for example, a temperature sensor, an infrared sensor, or a humidity sensor. The sensor 5 outputs detected signals to the control unit 6. The control unit 6 including an MPU (micro processing unit) converts detected signals input from the sensor 5, to numerical data, generates signals containing the numerical data, and outputs the generated signals to the wireless communication unit 4.

In this communication device 1000, electricity generated by the thermoelectric conversion module 1 is boosted by the DC/DC converter 2 and accumulated in the capacitor 3. The electric power supplied from the capacitor 3 is used for the operation of the wireless communication unit 4, the sensor 5, and the control unit 6.

When the communication device 1000 according to the present embodiment is installed in a location where a heat source is present, the device can continue to operate semi permanently as long as heat is supplied from the heat source to the thermoelectric conversion module 1. Accordingly, for example, as compared with a communication device operated by power supply from a battery or the like, the burden of maintenance on users can be reduced because of the eliminated need for work such as battery replacement or battery charging.

Modification Examples

Figure 13A:
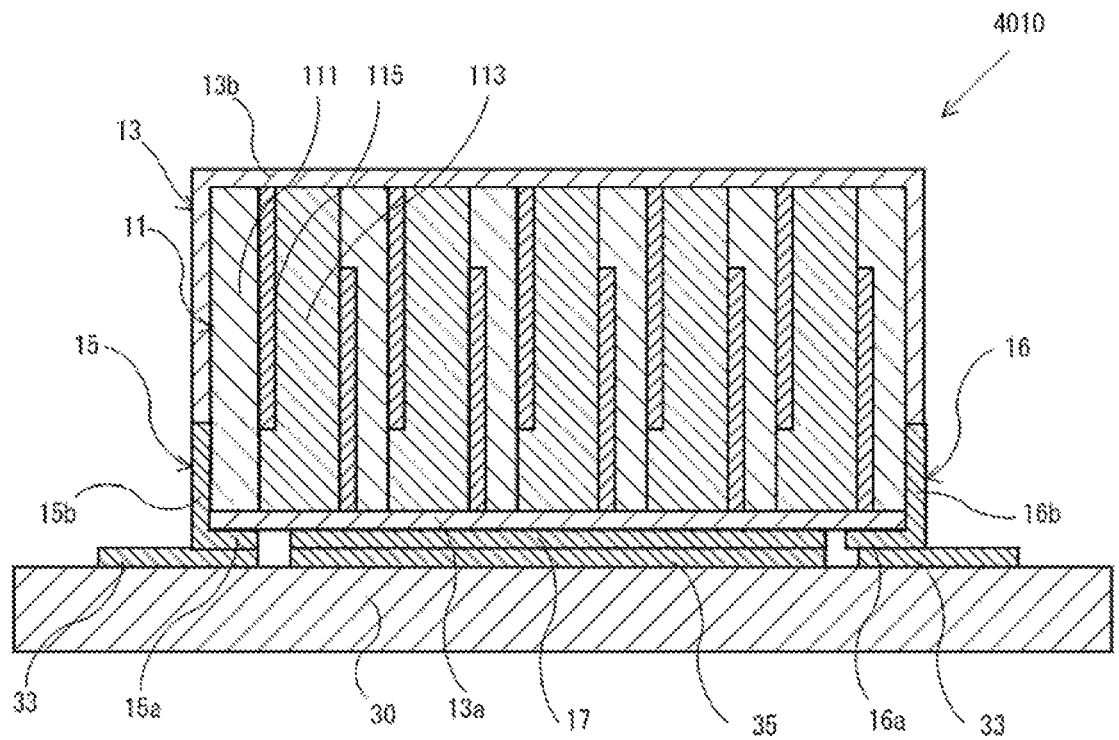
FIG. 13A is a cross-sectional view of a thermoelectric conversion module according to a modification example.
Figure 13B:
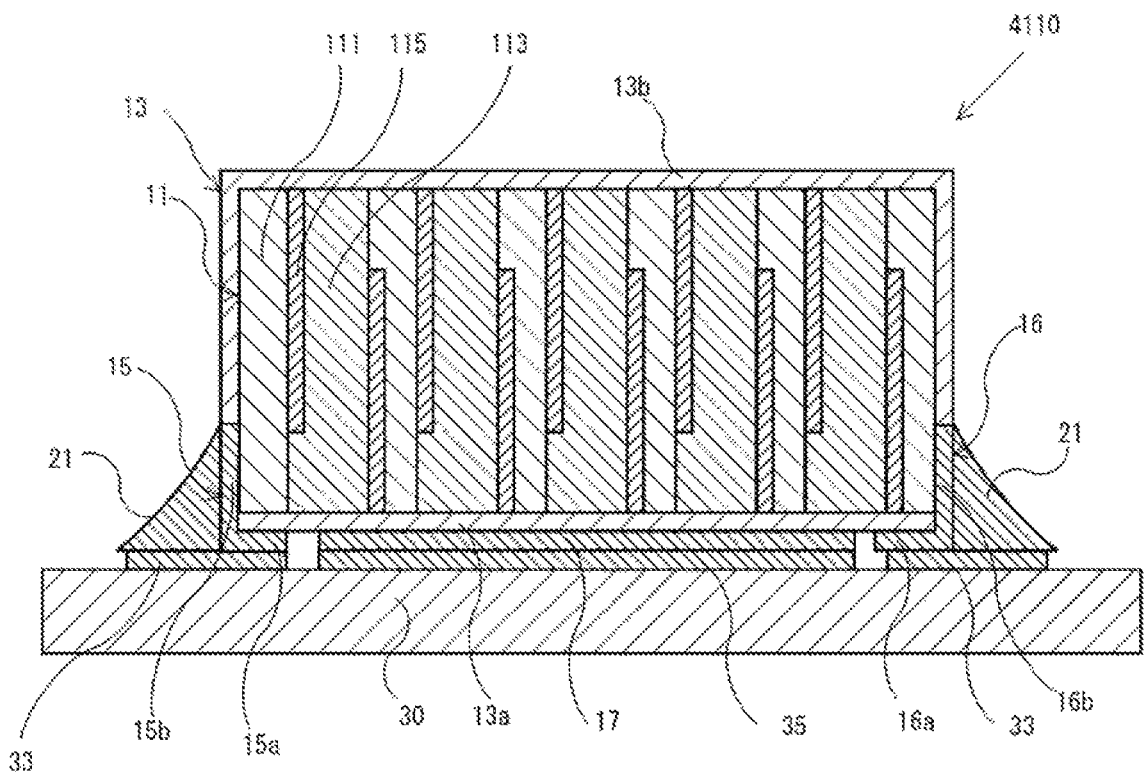
FIG. 13B is a cross-sectional view of a thermoelectric conversion module according to a modification example.

While the embodiments of the present invention have been described above, the present invention is not to be considered limited to the configurations according to the embodiment described previously. For example, as with the thermoelectric conversion modules 4010, 4110 shown in FIGS. 13A and 13B, the thermoelectric conversion module 10 described in Embodiment 1 may be configured to omit the heat transfer plate 19 provided on the upper sub-insulator part 13*b*. In addition, the thermoelectric conversion module 4010 is configured to further omit the conductive members 21 interposed between the conductive patterns 33 of the substrate 30 and the parts 15*b*, 16*b* of the electrodes 15, 16 provided on the side surfaces 11*c*, 11*d* of the module main body 11 in the thermoelectric conversion module 10. It is to be noted that in FIGS. 13A and 13B, the same constituents as those according to Embodiment 1 are denoted by the same reference symbols as in FIG. 2.

Figure 4:
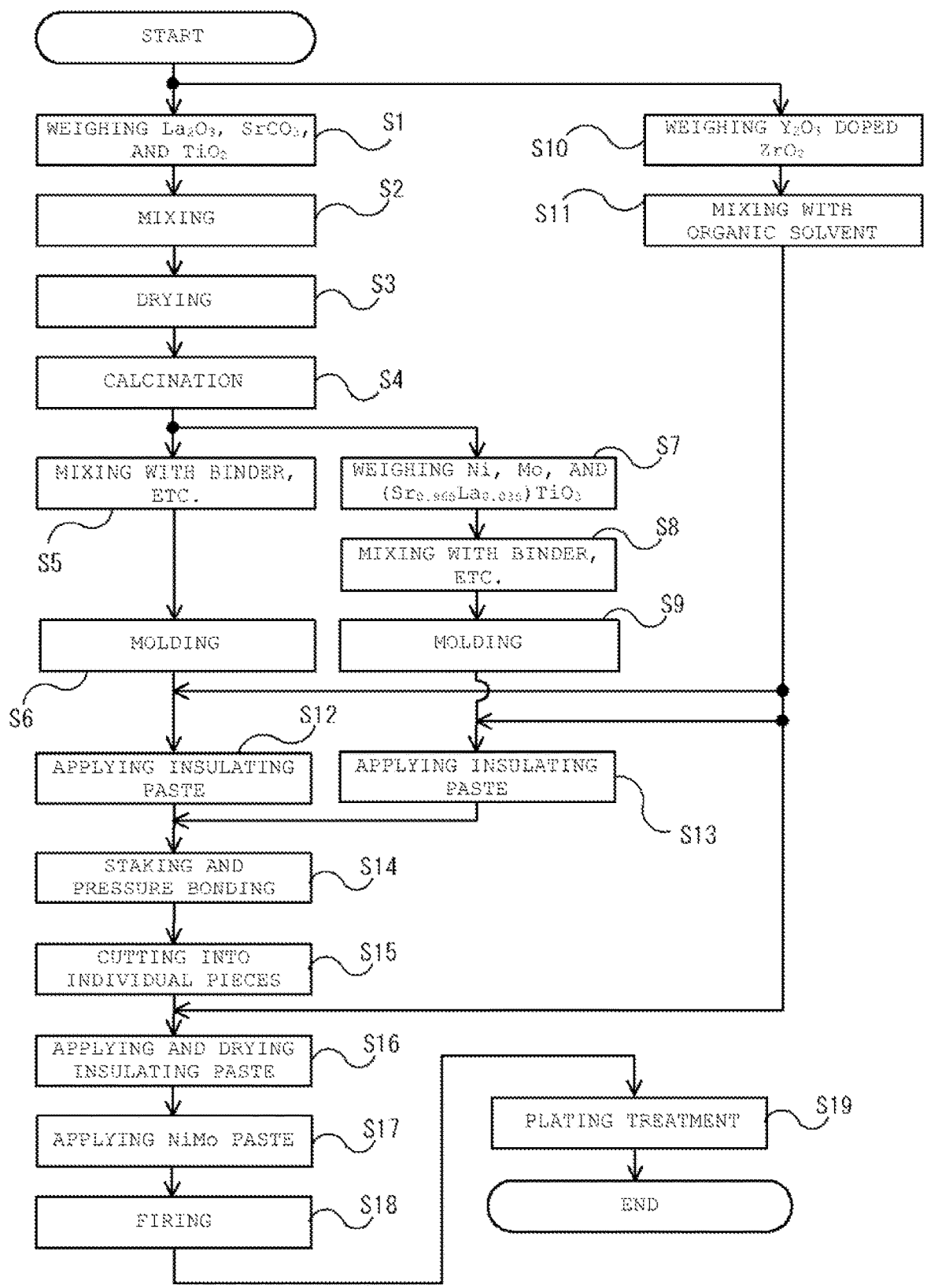
FIG. 4 is a diagram for explaining a method for manufacturing the thermoelectric conversion module according to Embodiment 1.

In the methods for manufacturing the thermoelectric conversion modules 4010, 4110, the difference from the manufacturing method described in Embodiment 1 is that no NiMo paste is applied to the upper sub-insulator part 13*b* in the step of applying the NiMo paste (step S17) in FIG. 4. In the other respects, the methods are provided in the same way as the manufacturing method described in Embodiment 1. In addition, in the method for manufacturing the thermoelectric conversion module 4110, the conductive members 21 such as a conductive paste are interposed between parts of the electrodes 15 on the side surfaces 11*c*, 11*d* of the module main body 11 and the conductive patterns 33 of the substrate 30.

Next, the results of measuring no-load voltages will be described for the thermoelectric conversion modules 4010, 4110 according to the present modification example. In the measurement, the upper sub-insulator parts 13*b* of the thermoelectric conversion modules 4010, 4110 were brought into contact with heat sources (not shown) disposed above the thermoelectric conversion modules 4010, 4110. In addition, the temperature of the heat source was maintained at 30° C., and the temperature of the substrate 30 was maintained at 20° C.

The no-load voltages output from the thermoelectric conversion modules 4010, 4110 were respectively 45 mV and 47 mV. The voltages output from the piezoelectric conversion modules 4010, 4110 were both higher than the voltage (37 mV) output from the thermoelectric conversion module 9010 according to Comparative Example 1, described in Embodiment 1. More specifically, the thermoelectric conversion modules 4010, 4110 can output higher voltages as compared with the thermoelectric conversion module 9010 according to Comparative Example 1.

The present configurations can achieve simplification, since the heat transfer plates 19 provided on the upper sub-insulator parts 13*b* are omitted.

Figure 14:
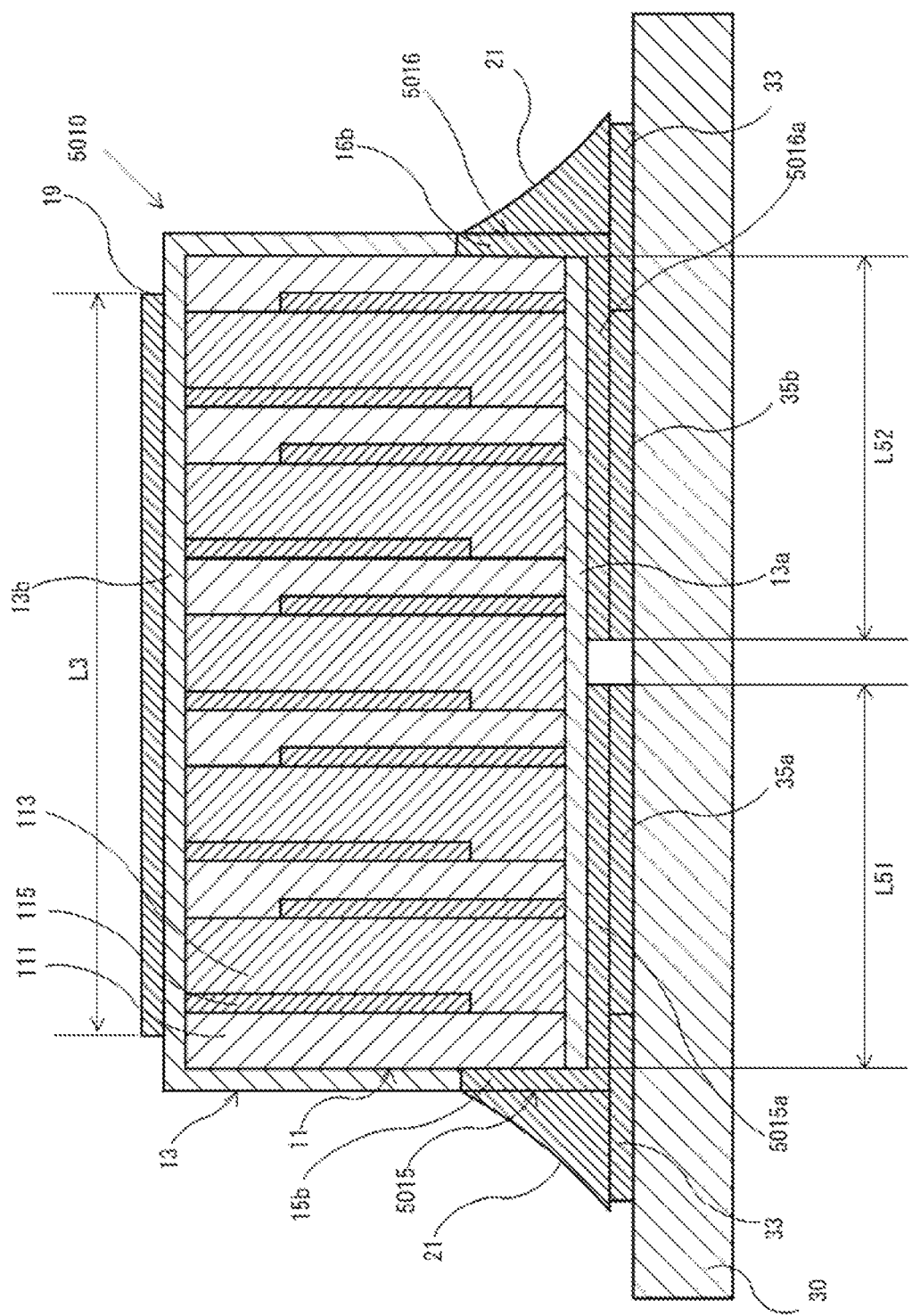
FIG. 14 is a cross-sectional view of a thermoelectric conversion module according to a modification example.

While the configuration including the lower sub-insulator part 13*a* provided with the heat transfer plate 17 separated from the electrodes 15, 16 has been described in Embodiment 1, the heat transfer plate 17 is not to be considered limited to the configuration separated from the electrodes 15, 16. For example, as with the thermoelectric conversion module 5010 shown in FIG. 14, electrodes 5015, 5016 may have parts 5015*a*, 5016*a* extended to a central part in the longitudinal direction of the lower sub-insulator part 13*a*. More specifically, the heat transfer plate may be configured to be formed continuously and integrally with the pair of electrodes 15, 16 electrically connected to the conductive patterns 33. It is to be noted that in FIG. 14, the same constituents as those according to Embodiment 1 are denoted by the same reference symbols as in FIG. 2. The electrodes 5015, 5016 are respectively joined to the substrate 30 with conductive members 35*a*, 35*b* interposed there between.

In the method for manufacturing the thermoelectric conversion module 5010, the difference from the manufacturing method described in Embodiment 1 is that the NiMo paste is applied to the part of the lower sub-insulator part 13*a* excluding a substantially central part thereof in the longitudinal direction in the step of applying the NiMo paste (step S17) in FIG. 4. In the other respects, the methods are provided in the same way as the manufacturing method described in Embodiment 1.

Next, the result of measuring a no-load voltage will be described for the thermoelectric conversion module 5010 according to the present modification example. In the thermoelectric conversion module 5010 used for the measurement, respective extended parts 5015*a*, 5016*a* of the electrodes 5015, 5016 on the lower sub-insulator part 13*a* have lengths L51, L52 that are both 3.4 mm. In the measurement, the heat transfer plate 19 of the thermoelectric conversion module 5010 was joined to a heat source (not shown) disposed above the thermoelectric conversion module 5010, with a conductive member such as a conductive paste interposed there between. In addition, the temperature of the heat source was maintained at 30° C., and the temperature of the substrate 30 was maintained at 20° C.

The no-load voltage output from the thermoelectric conversion module 5010 was 72 mV, and equal to the voltage output from the thermoelectric conversion module 10 according to Embodiment 1. More specifically, the thermoelectric conversion module 5010 has power generation performance equivalent to that of the thermoelectric conversion module 10 according to Embodiment 1.

The present configuration also achieves a similar effect to that achieved by the thermoelectric conversion module 10 according to Embodiment 1. In addition, the parts with the NiMo paste applied thereto in the step of applying the NiMo paste are not segmentalized, as compares with the configuration with the heat transfer plate 17 separated from the electrodes 15, 16 like the thermoelectric conversion 10 according to Embodiment 1. Accordingly, the step of applying the NiMo paste can be simplified.

Figure 15A:
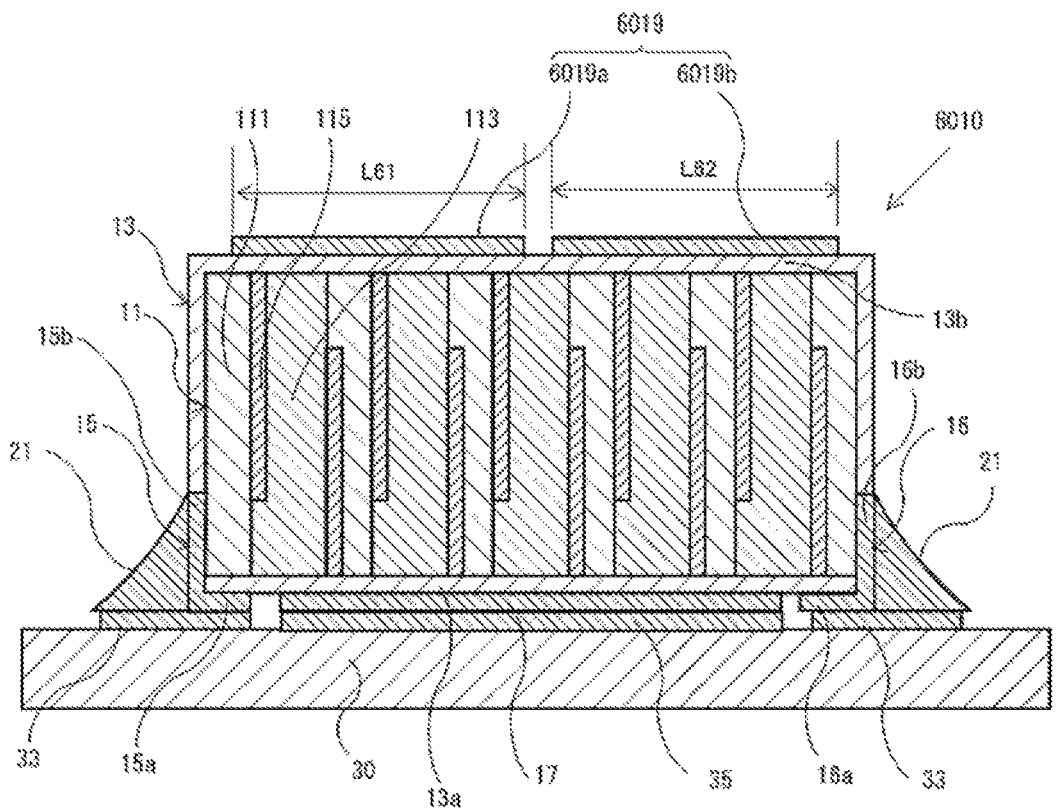
FIG. 15A is a cross-sectional view of a thermoelectric conversion module according to a modification example.
Figure 15B:
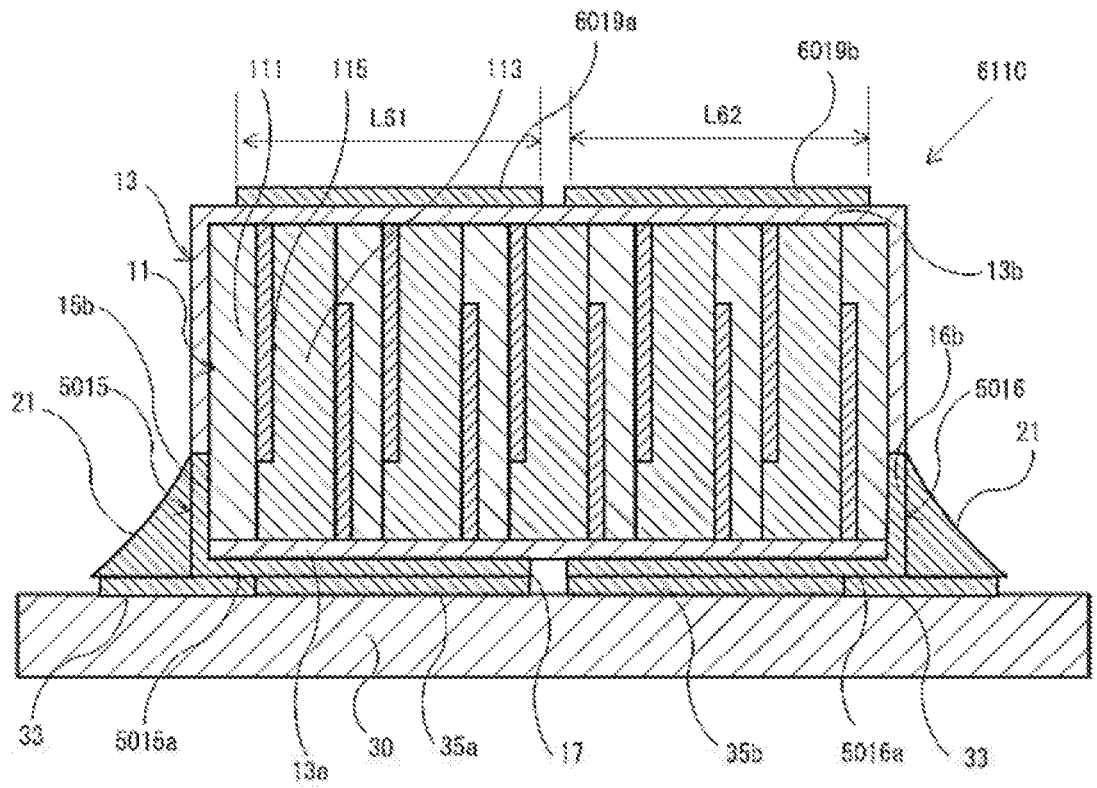
FIG. 15B is a cross-sectional view of a thermoelectric conversion module according to a modification example.
Figure 16:
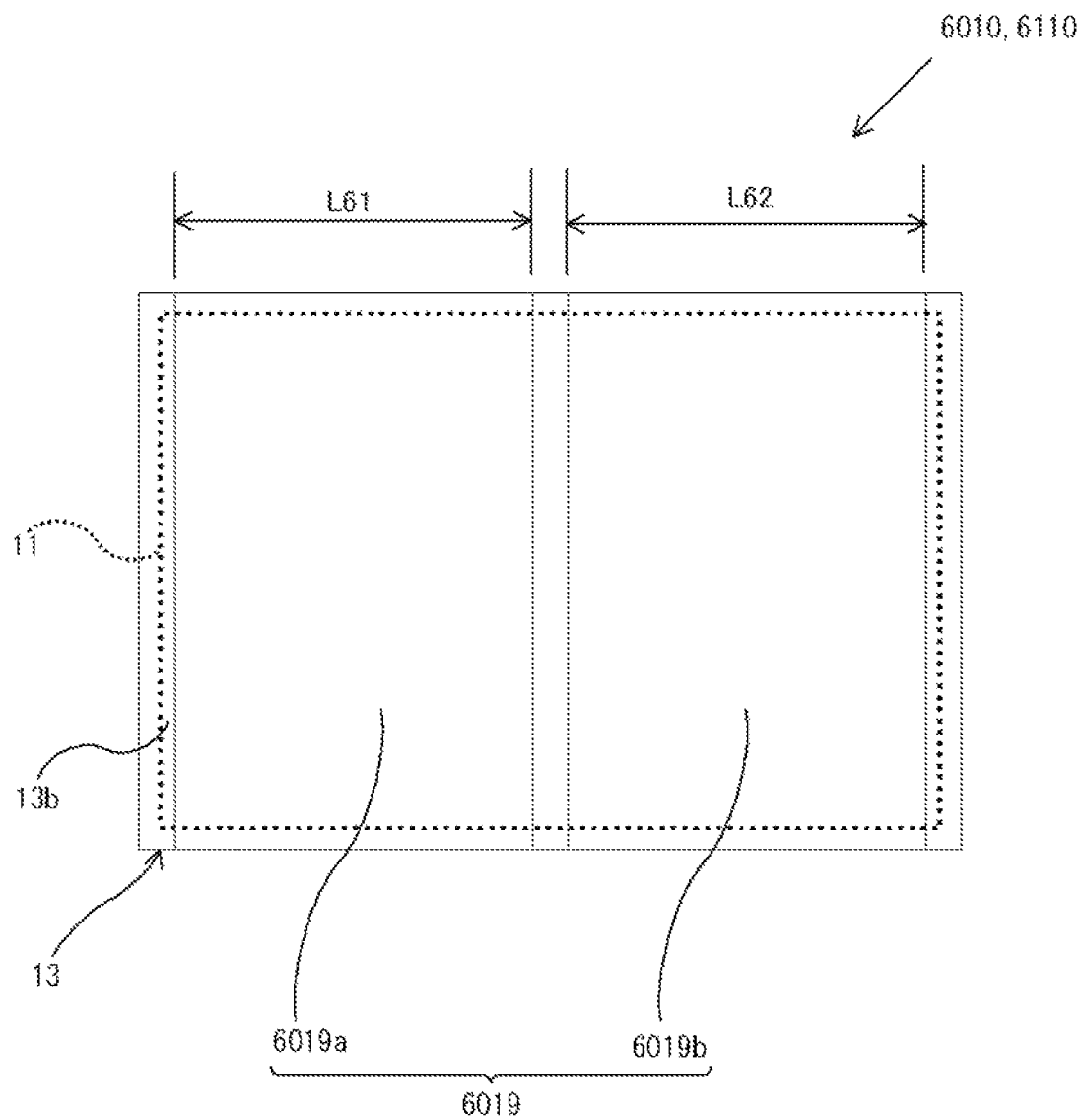
FIG. 16 is a plan view of the thermoelectric conversion module according to the modification example.

While the configuration with one heat transfer plate 17 provided on the lower sub-insulator part 13*a* and one heat transfer plate 19 provided on the upper sub-insulator part 13*b* has been described in Embodiment 1, the numbers of heat transfer plates provided on the lower sub-insulator part 13*a* and the upper sub-insulator part 13*b* are not limited to 1. For example, the heat transfer plate provided on the lower sub-insulator part 13*a* or the heat transfer plate provided on the upper sub-insulator part 13*b* may be composed of a plurality of sub-heat transfer plates. In the case of the thermoelectric conversion modules 6010, 6110 shown in FIGS. 15A and 15B, a heat transfer plate 6019 provided on the upper sub-insulator part 13*b* is composed of two sub-heat transfer plates 6019*a*, 6019*b*. The two sub-heat transfer plates 6019*a*, 6019*b* are arranged in the longitudinal direction of the upper sub-insulator part 13*b* as shown in FIG. 16. It is to be noted that in FIGS. 15A and 15B and FIG. 16, the same constituents as those according to Embodiment 1 are denoted by the same reference symbols as in FIG. 2.

In the method for manufacturing the thermoelectric conversion module 6010, the difference from the manufacturing method described in Embodiment 1 is that the NiMo paste is applied to each of two locations lined in the longitudinal direction of the upper sub-insulator part 13*b* in the step of applying the NiMo paste (step S17) in FIG. 4. In the other respects, the methods are provided in the same way as the manufacturing method described in Embodiment 1.

Next, the results of measuring no-load voltages will be described for the thermoelectric conversion modules 6010, 6110 according to the present modification example. The sub-heat transfer plates 6019a, 6019b of the thermoelectric conversion modules 6010, 6110 used for the measurement respectively have lengths L61, L62 that are both 3.2 mm in the longitudinal direction of the module main body 11. In the measurement, the heat transfer plates 6019a, 6019 of the thermoelectric conversion modules 6010, 6110 were joined to heat sources (not shown) disposed above the thermoelectric conversion modules 6010, 6110, with conductive members such as a conductive paste interposed there between. In addition, the temperature of the heat source was maintained at 30° C., and the temperature of the substrate 30 was maintained at 20° C.

The no-load voltage output from the thermoelectric conversion module 6010 was 71 mV, and the no-load voltage output from the thermoelectric conversion module 6110 was 73 mV, and the non-load voltages are both substantially equal to the voltage output from the thermoelectric conversion module 10 according to Embodiment 1. The term of "substantially equal" mentioned previously encompasses differences of ±5%. More specifically, the thermoelectric conversion modules 6010, 6110 have power generation performance equivalent to that of the thermoelectric conversion module 10 according to Embodiment 1.

The present configuration can relax the stress applied from heat transfer plates 6019a, 6019b to the insulator parts 13 as compared with the heat transfer plate 19 according to Embodiment 1, thus suppressing damage to the insulator parts 13.

Figure 17:
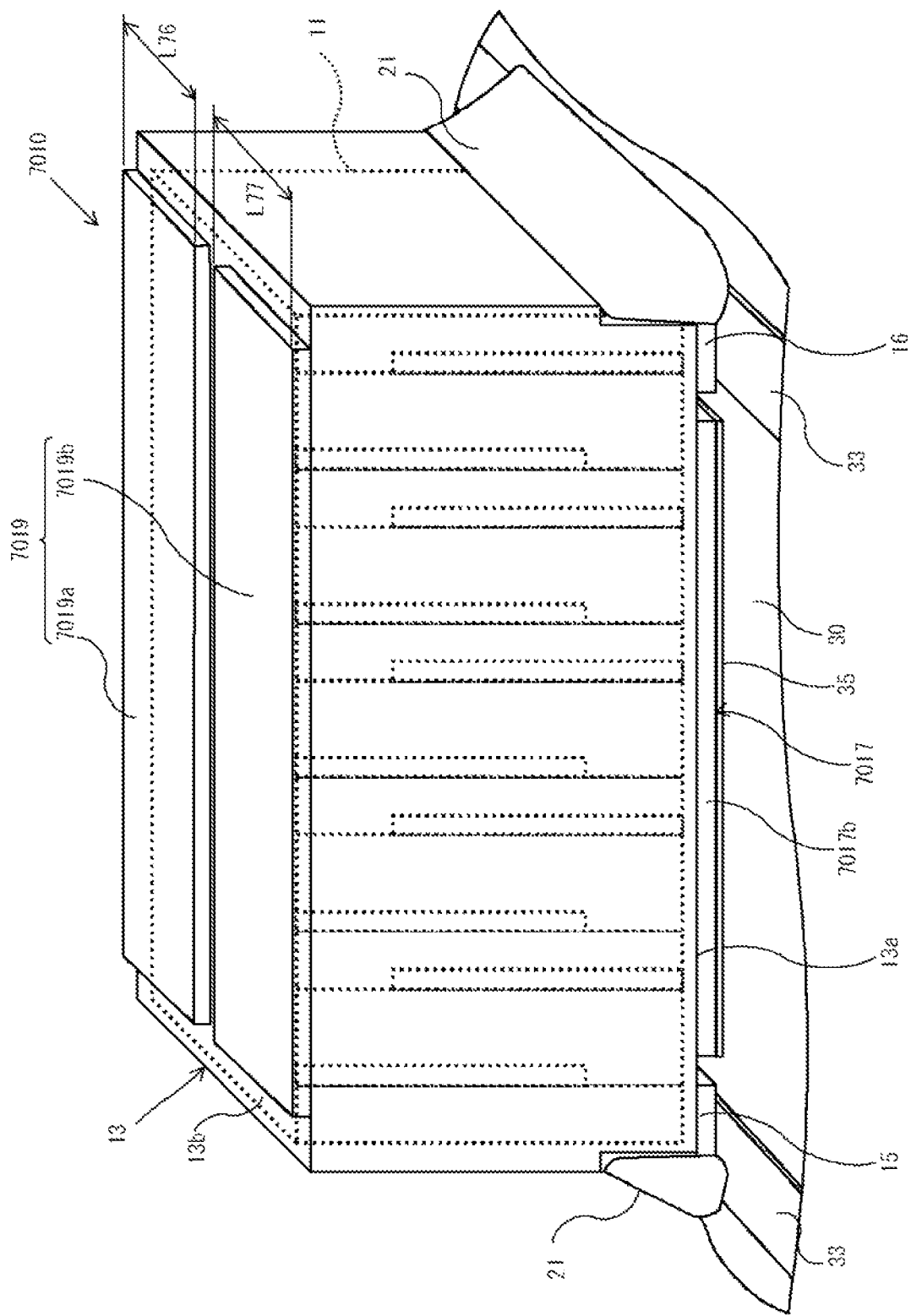
FIG. 17 is a perspective view of a thermoelectric conversion module according to a modification example.
Figure 18:
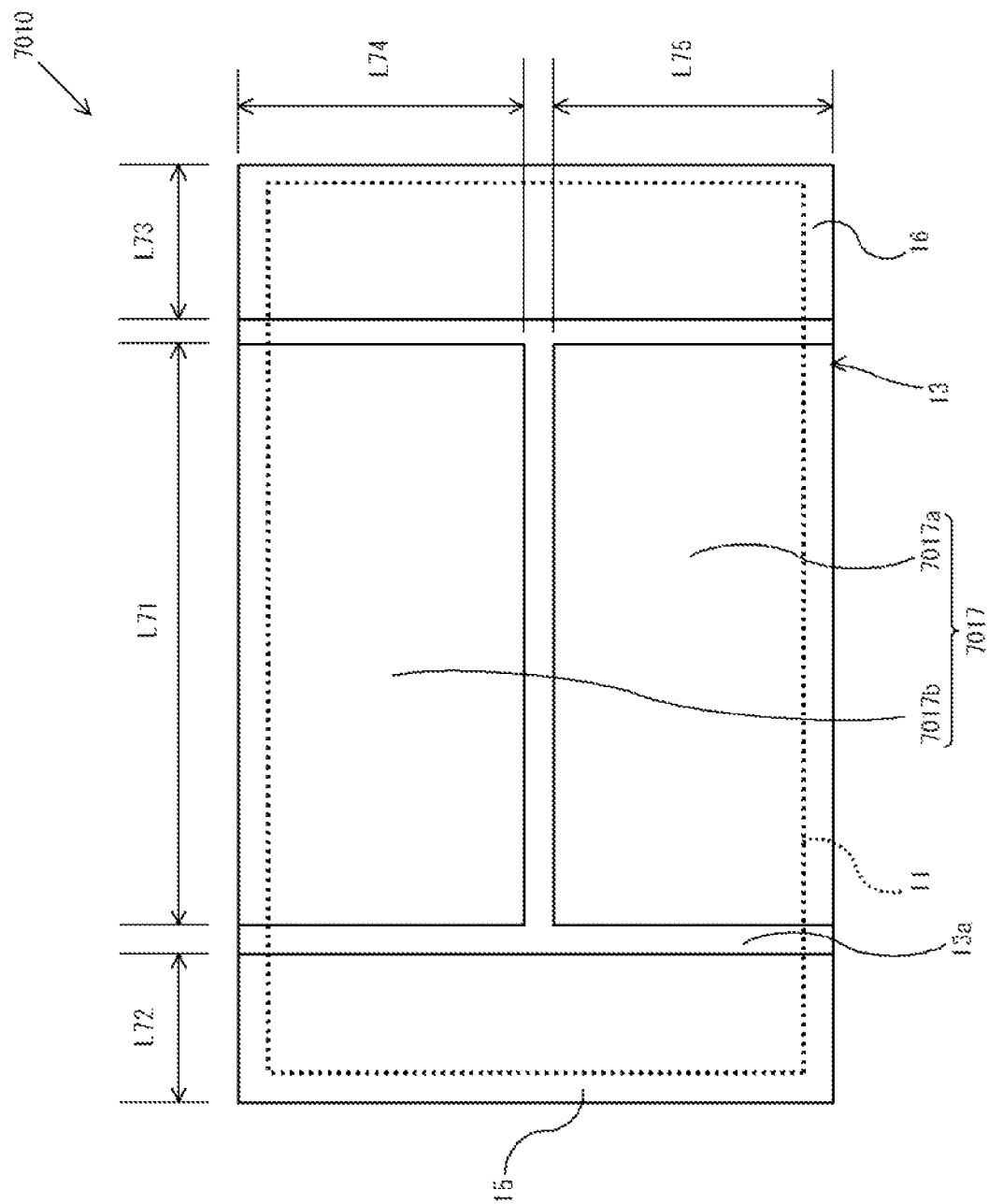
FIG. 18 is a bottom view of the thermoelectric conversion module according to the modification example.

Alternatively, as with the thermoelectric conversion module 7010 shown in FIGS. 17 and 18, a heat transfer plate 7019 provided on the upper sub-insulator part 13b may be composed of two sub-heat transfer plates 7019a, 7019b, whereas a heat transfer plate 7017 provided on the lower sub-insulator part 13a may be composed of two sub-heat transfer plates 7017a, 7017b. It is to be noted that in FIGS. 17 and 18, the same constituents as those according to Embodiment 1 are denoted by the same reference symbols as in FIG. 2. The two sub-heat transfer plates 7019a, 7019b provided on the upper sub-insulator part 13b are arranged in the transverse direction of the upper sub-insulator part 13b as shown in FIG. 17. In addition, the two sub-heat transfer plates 7017a, 7017b provided on the lower sub-insulator part 13a are also arranged in the transverse direction of the lower sub-insulator part 13a as shown in FIG. 18.

In the method for manufacturing the thermoelectric conversion module 5010, the difference from the manufacturing method described in Embodiment 1 is where the NiMo paste is applied in the step of applying the NiMo paste (step S17) in FIG. 4. In the other respects, the methods are provided in the same way as the manufacturing method described in Embodiment 1. Specifically, the NiMo paste is applied to two locations lined in the transverse direction of the upper sub-insulator part 13b and to two locations lined in the transverse direction of the lower sub-insulator part 13a.

Next, the result of measuring a no-load voltage will be described for the thermoelectric conversion module 7010 according to the present modification example. The sub-heat transfer plates 7019a, 7019b of the thermoelectric conversion module 7010 used for the measurement respectively have lengths L76, L77 that are both 3.0 mm in the transverse direction. In addition, the sub-heat transfer plates 7017a, 7017b respectively have lengths L71 that are both 4.8 mm in the longitudinal direction, and lengths L74, L75 that are both 3.0 mm in the transverse direction. In addition, the respective extended parts 15a, 16a of the electrodes 15, 16 on the lower sub-insulator part 13a have lengths L72, L73 that are both 1 mm in the longitudinal direction of the module main body 11.

In the measurement, the sub-heat transfer plates 7019a, 7019b of the thermoelectric conversion module 7010 were joined to a heat source (not shown) disposed above the thermoelectric conversion module 7010, with a conductive member such as a conductive paste interposed there between, and the sub-heat transfer plates 7017a, 7017b thereof were joined to the substrate 30 with a conductive member such as a conductive paste interposed there between. In addition, the temperature of the heat source was maintained at 30° C., and the temperature of the substrate 30 was maintained at 20° C.

The no-load voltage output from the thermoelectric conversion module 7010 was 71 mV, and substantially equal to the voltage output from the thermoelectric conversion module 10 according to Embodiment 1. The term of "substantially equal" mentioned previously encompasses differences of ±5%. More specifically, the thermoelectric conversion module 7010 has power generation performance equivalent to that of the thermoelectric conversion module 10 according to Embodiment 1.

The present configuration can also relax the stress applied from sub-heat transfer plates 7017a, 7017b, 7019a, 7019b to the insulator part 13 as compared with the heat transfer plate 19 according to Embodiment 1, thus suppressing damage to the insulator parts 13.

It is to be noted that while examples of the heat transfer plates each composed of two sub-heat transfer plates have been described in the modification examples shown in FIGS. 15 through 18, the numbers of sub-heat transfer plates constituting the heat transfer plates are not to be considered limited to 2. For example, the heat transfer plate may be composed of three or more sub-heat transfer plates.

While an example where the heat transfer plates 17, 19 are substantially rectangular in a planar view from the Z direction in FIG. 1 has been described in Embodiment 1, the shapes of the heat transfer plates are not to be considered limited thereto. In addition, while an example where parts of peripheral edges of the upper sub-insulator part 13b and lower sub-insulator part 13a in a planar view are not covered with the heat transfer plates 17, 19 has been described in Embodiment 1, the sizes of the heat transfer plates 17, 19 are not limited thereto.

For example, the heat transfer plate 17 may cover the entire lower sub-insulator part 13a, or the heat transfer plate 19 may cover the entire upper sub-insulator part 13b.

An example where the insulator part 13 covers, over the entire region, the outer surface of the module main body 11 excluding regions with the electrodes 15, 16 joined thereto has been described in Embodiment 1.

However, the region of the module main body covered with the insulator part is not to be considered limited thereto. For example, as with the thermoelectric conversion module 7110 shown in FIG. 19, an insulator part 7200 may partially cover side surfaces of an module main body 7011, and an insulator layer 7013 may have: a lateral sub-insulator part 7013a that partially covers a surface region of a first thermoelectric conversion element 7111 located in the laminating direction (Y axis direction in FIG. 19) thereof; a lower sub-insulator parts 7013b that covers a surface located on the lower side (in the −Z direction in FIG. 19) of the first thermoelectric conversion element 7111; and an upper sub-insulator part 7013c that covers a surface located on the upper side (in the +Z direction in FIG. 19) of the first thermoelectric conversion element 7111. It is to be noted that in FIG. 19, the same constituents as those according to Embodiment 1 are denoted by the same reference symbols as in FIG. 2. In addition, the insulator part 7200 and insulator layers 7013 mentioned above correspond to the "insulator part" according to the invention of the present application. The lower sub-insulator part corresponds to the "first sub-insulator part" according to the invention of the present application. The upper sub-insulator part corresponds to the "second sub-insulator part" according to the invention of the present application. The lateral sub-insulator part corresponds to the "third sub-insulator part" according to the invention of the present application.

The first sub-insulator part, the second sub-insulator part, and the third sub-insulator part are formed integrally as the insulator layer.

The module main body 7011 has a plurality of layered first thermoelectric conversion elements 7111 and a plurality of layered second thermoelectric conversion elements 7113 arranged alternately in the thickness direction thereof. Each end of the first thermoelectric conversion elements 7111 in the Z axis direction is located closer to the central part in the Z axis direction than each end of the second thermoelectric conversion elements 7113 in the Z axis direction. First sites 7111a of the first thermoelectric conversion elements 7111, which are located on the lower side (in the −Z direction in FIG. 19) thereof, are joined to third sites 7113a of the second thermoelectric conversion elements 7113 adjacent in the −Y direction, which are located on the lower side thereof.

In addition, second sites 7111b of the first thermoelectric conversion elements 7111, which are located on the upper side (in the +Z direction in FIG. 19) thereof, are joined to fourth sites 7113b of the second thermoelectric conversion elements 7113 adjacent in the +Y direction, which are located on the upper side thereof. The second thermoelectric conversion elements 7113 are disposed at both ends of the module main body 7011 in the Y-axis direction. The first thermoelectric conversion elements 7111 is formed from a p-type thermoelectric conversion material, as is the case with the first thermoelectric conversion elements 111 according to Embodiment 1. In addition, the second thermoelectric conversion elements 7113 is formed from an n-type thermoelectric conversion material, as is the case with the second thermoelectric conversion elements 113 according to Embodiment 1. The lateral sub-insulator parts 7013a are interposed between the first thermoelectric conversion elements 7111 and the second thermoelectric conversion elements 7113 which are adjacent to each other in the Y axis direction, and provided in a series to cover at least two surfaces of the first thermoelectric conversion element 7111. The material that forms the insulator layers 7013 have the same material as the material that forms the insulator layers 115 according to Embodiment 1. The combined thickness of the first thermoelectric conversion element 7111 and lateral sub-insulator parts 7013a in the Y axis direction is set to be, for example, 20 μm.

The lower sub-insulator part 7013b covers a lower side (in the −Z direction) of the first thermoelectric conversion element 7111, but covers no lower side of the second thermoelectric conversion 7113. The upper sub-insulator part 7013c covers an upper side (in the +Z direction) of the first thermoelectric conversion element 7111, but covers no upper side of the second thermoelectric conversion 7113. The material that forms the insulator layers 7013 and the insulator part 7200 have the same material as the material that forms the insulator layers 115 according to Embodiment 1.

Insulating heat transfer plates 7117, 7119 are heat transfer plates formed from an insulator material. The insulating heat transfer plate 7117 is provided so as to cover lower sides of the lower sub-insulator parts 7013b and lower sides of the second thermoelectric conversion elements 7113. The insulating heat transfer plate 7119 is provided so as to cover upper sides of the upper sub-insulator parts 7013c and upper sides of the second thermoelectric conversion elements 7113. The insulating heat transfer plate 7117 is joined to the substrate 30 with the conductive member 35 interposed there between.

The insulating heat transfer plates 7117, 7119 are formed from an insulator material that is higher in thermal conductivity as compared with the material (for example, ZrO2) that forms the insulator layers 7013.

Examples of the insulator material include AlN, SiN, and Al2O3. ZrO2 has a thermal conductivity of 2.7 to 3.0 W/m·K, whereas AlN, SiN, and Al2O3 are respectively 90 to 200 W/m·K, 20 to 28 W/m·K, and 23 to 36 W/m·K.

According to the present configuration, the second thermoelectric conversion elements 7113 are thermally coupled to a heat source with only the insulating heat transfer plate 7119 interposed there between, and thermally coupled to the substrate 30 with the insulating heat transfer plate 7117 and the conductive member 35 interposed there between. This configuration increases the heat transfer efficiency from the heat source to the upper ends of the second thermoelectric conversion elements 7113 and the heat transfer efficiency from the lower ends of the second thermoelectric conversion elements 7113 to the substrate 30. Accordingly, the temperature difference between the upper ends and lower ends of the second thermoelectric conversion elements 7113 can be brought close to the temperature difference between the heat source and the substrate 30, thus increasing the power generation efficiency of the thermoelectric conversion module 7110.

Figure 19:
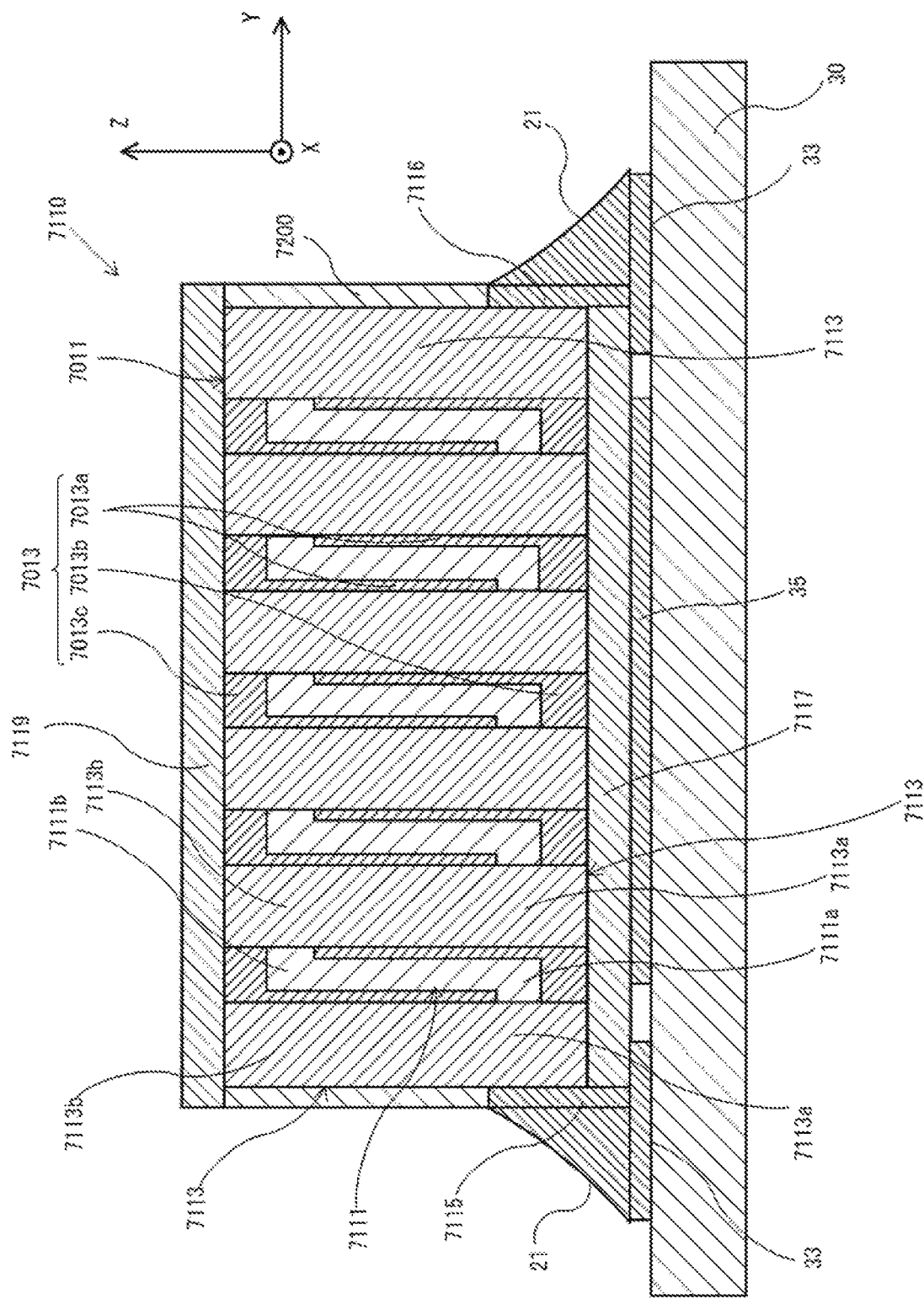
FIG. 19 is a cross-sectional view of a thermoelectric conversion module according to a modification example.
Figure 20:
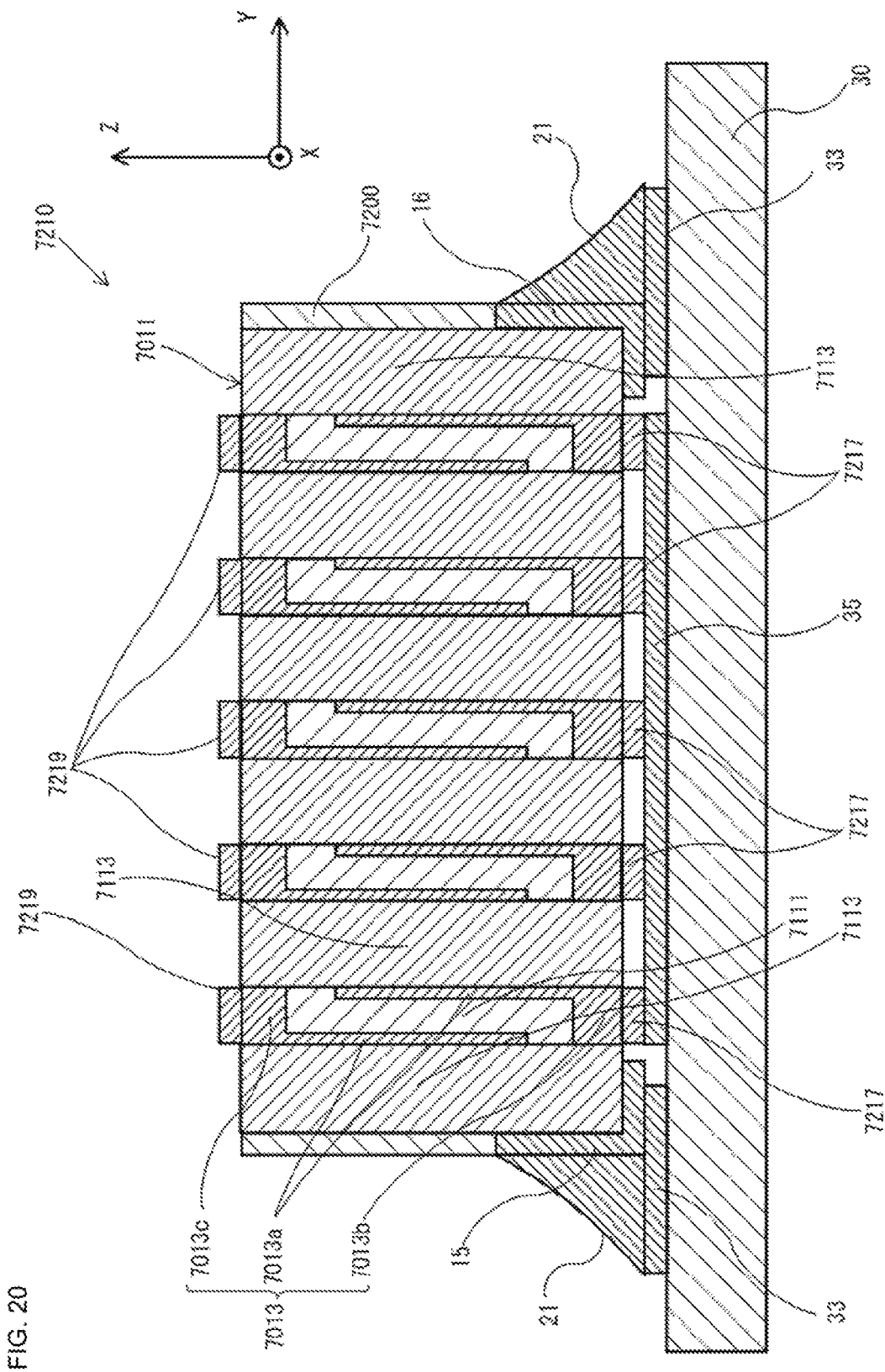
FIG. 20 is a cross-sectional view of a thermoelectric conversion module according to a modification example.

An example where the insulating heat transfer plates 7117, 7119 cover the lower sides and upper sides of the second thermoelectric conversion elements 7113 has been described with reference to the thermoelectric conversion module 7110 shown in FIG. 19. However, the heat transfer plates are not always limited to the configuration of covering the lower sides and upper sides of the second thermoelectric conversion elements 7113. For example, as with the thermoelectric conversion module 7210 shown in FIG. 20, a plurality of heat transfer plates 7217 may be provided on exposed parts of the insulator layers 7013 at the lower surface of the module main body 7011, whereas a plurality of heat transfer plates 7219 may be provided on exposed parts of the insulator layers 7013 at the upper surface of the module main body 7011. It is to be noted that in FIG. 20, the same constituents as those according to Embodiment 1 and in FIG. 19 are respectively denoted by the same reference symbols as in FIG. 2 and FIG. 19. In addition, the heat transfer plates 7217 and the heat transfer plates 7219 correspond to the "sub-heat transfer plates" according to the invention of the present application.

The heat transfer plates 7217 are jointed to the substrate 30 with the conductive member 35 interposed there between. The heat transfer plates 7217, 7219 are formed from a metal such as a NiMo alloy. Such gaps that can ensure electrical insulation are provided between the heat transfer plates 7217, 7219 and the second thermoelectric conversion elements 7113. The heat transfer plates 7217, 7219 may have any electrical insulation or conductivity, as long as the materials are higher in thermal conductivity as compared with ZrO2.

The present configuration can reduce the materials required for the formation of the heat transfer plates 7217, 7219, because the areas of the heat transfer plates 7217, 7219 can be made relatively small.

Figure 21:
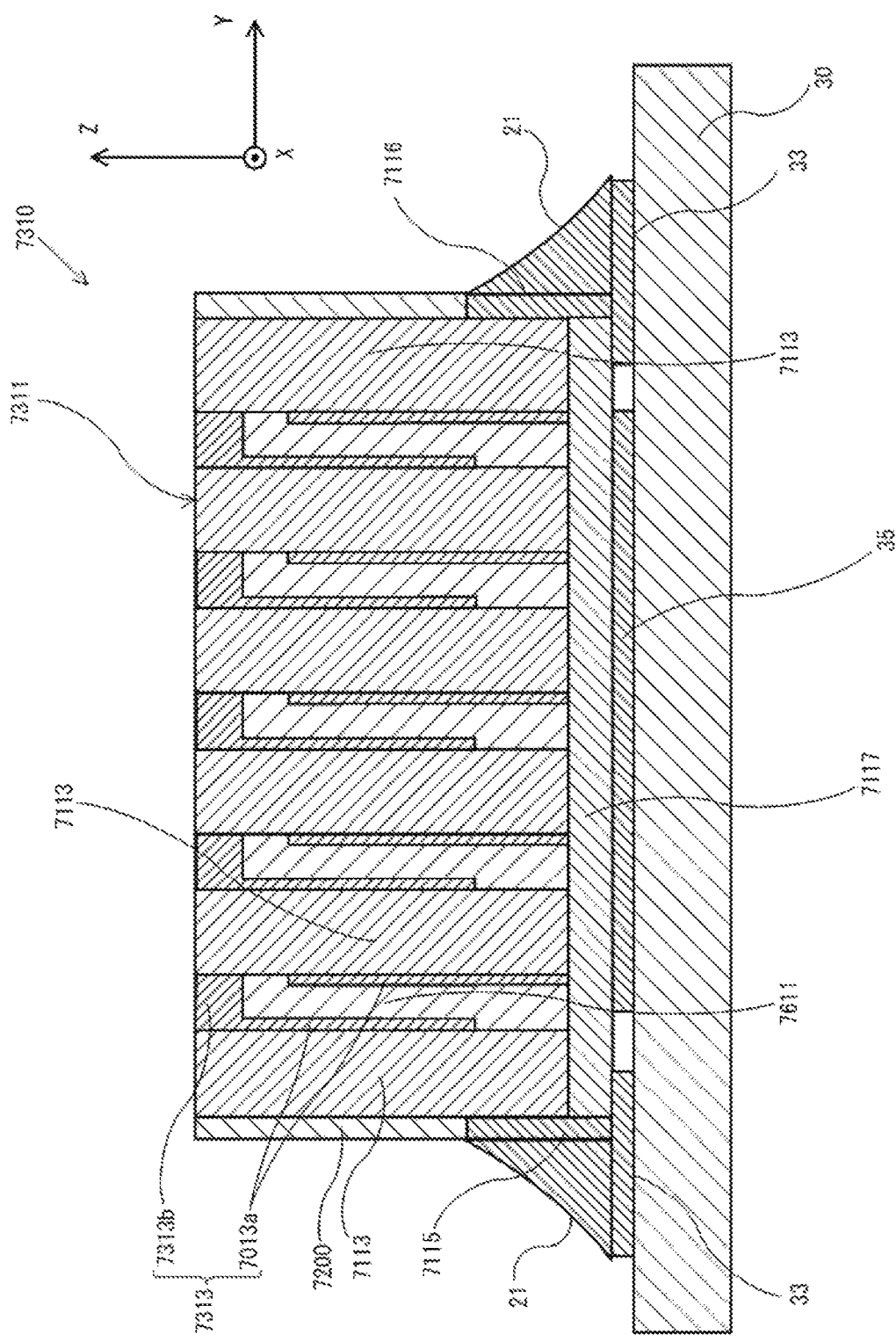
FIG. 21 is a cross-sectional view of a thermoelectric conversion module according to a modification example.

While an example where the insulator layer 7013 has the lower sub-insulator part 7013b partially covering the lower surface of the module main body 7011 and the upper sub-insulator part 7013c partially covering the upper surface of the module main body 7011 has been described with reference to the thermoelectric conversion module 7110 shown in FIG. 19, the insulator parts are not always to be considered limited to the configuration covering both end surfaces of the first thermoelectric conversion elements 7111. For example, as with the thermoelectric conversion module 7310 shown in FIG. 21, the insulator part 7200 may cover side surfaces of an module main body 7311, and an insulator layer 7313 may have: the lateral sub-insulator part 7013a that covers the first thermoelectric conversion element 7111 in the laminating direction (Y-axis direction); and an upper sub-insulator part 7313b that covers an upper side (in the +Z direction) of the first thermoelectric conversion module 7111. It is to be noted that in FIG. 21, the same constituents as those shown in FIG. 19 are denoted by the same reference symbols as those shown in FIG. 19. In addition, the insulator part 7200 and insulator layers 7313 mentioned above correspond to the "insulator part" according to the invention of the present application. The upper sub-insulator part corresponds to the "second sub-insulator part" according to the invention of the present application. The lateral sub-insulator part corresponds to the "third sub-insulator part" according to the invention of the present application. The second sub-insulator part and the third sub-insulator part are formed integrally as the insulator layer.

The insulating heat transfer plate 7117 is provided so as to cover the lower sides of first thermoelectric conversion elements 7611 and the lower sides of the second thermoelectric conversion elements 7113.

The present configuration increases the heat transfer efficiency from a heat source to the upper ends of the second thermoelectric conversion elements 7113, because the upper end surfaces of the second thermoelectric conversion elements 7113 can be brought into direct contact with the heat source. Accordingly, the power generation efficiency of the thermoelectric conversion module 7310 can be increased. In addition, the upper sub-insulator parts 7313b cover the upper end surfaces of the first thermoelectric conversion elements 7113. Thus, for example, when the thermoelectric conversion 7310 is used in an atmosphere with a corrosive gas or the like dispersed, the first thermoelectric conversion elements 7611 are prevented from coming into contact with the corrosive gas or the like. Accordingly, the material that forms the first thermoelectric conversion elements 7611 can be prevented from reacting with the corrosive gas or the like.

Figure 22:
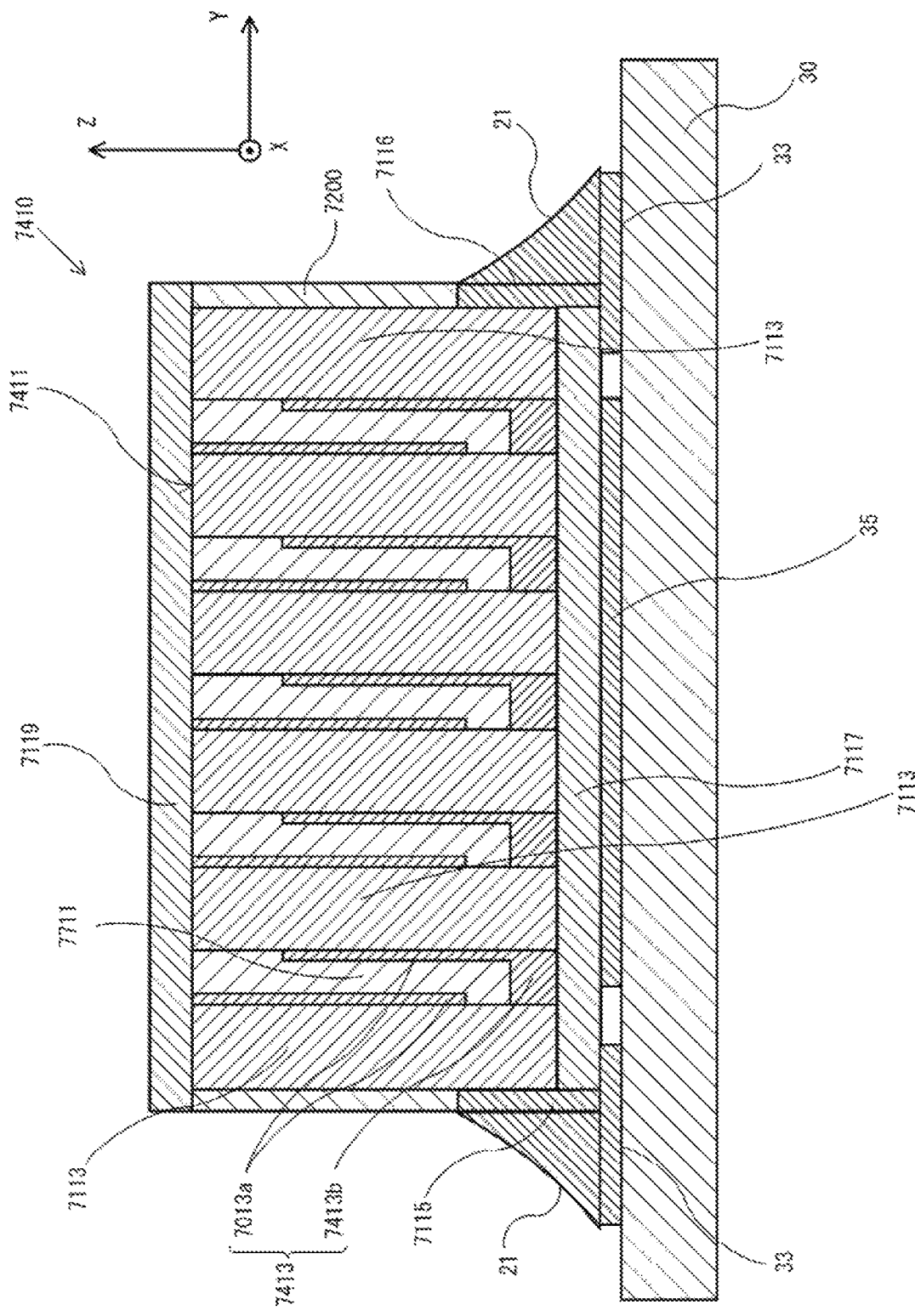
FIG. 22 is a cross-sectional view of a thermoelectric conversion module according to a modification example.

Alternatively, as with the thermoelectric conversion module 7410 shown in FIG. 22, the insulator part 7200 may cover side surfaces of an module main body 7411, and an insulator layer 7413 may have: the lateral sub-insulator part 7013a that covers the first thermoelectric conversion element 7111 in the laminating direction (Y-axis direction); and a lower sub-insulator part 7413b that covers a lower side (in the −Z direction) of the first thermoelectric conversion module 7711. It is to be noted that the same constituents as those shown in FIG. 19 are denoted by the same reference symbols in FIG. 22. In addition, the insulator part 7200 and insulator layers 7413 mentioned above correspond to the "insulator part" according to the invention of the present application. The lower sub-insulator part corresponds to the "first sub-insulator part" according to the invention of the present application. The lateral sub-insulator part corresponds to the "third sub-insulator part" according to the invention of the present application. The first sub-insulator part and the third sub-insulator part are formed integrally as the insulator layer.

The insulating heat transfer plate 7117 covers the lower sides of the lower sub-insulator parts 7413b and the lower sides of the second thermoelectric conversion elements 7113. The insulating heat transfer plate 7119 covers the upper sides of the first thermoelectric conversion elements 7111 and the upper sides of the second thermoelectric conversion elements 7113.

The present configuration has the first thermoelectric conversion elements 7111 thermally coupled to a heat source through only the insulating heat transfer plate 7119. Thus, the heat transfer efficiency is increased from the heat source to upper ends of the first thermoelectric conversion elements 7111. Accordingly, the temperature difference between the upper ends and lower ends of the first thermoelectric conversion modules 7111 can be brought closer to the temperature difference between the heat source and the substrate 30, and the power generation efficiency of the thermoelectric conversion module 7410 can be thus increased.

The configurations with the first thermoelectric conversion elements 7111, 7611, 7711 formed from p-type thermoelectric conversion materials and the second thermoelectric conversion elements 7113 formed from an n-type thermoelectric conversion material have been described with reference to the thermoelectric conversion modules 7110, 7210, 7310, 7410 shown FIGS. 19 through 22. However, without limitation thereto, the first thermoelectric conversion elements 7111, 7611, 7711 may be formed from n-type thermoelectric conversion materials, whereas the second thermoelectric conversion elements 7113 may be formed from a p-type thermoelectric conversion material.

In this case, the first thermoelectric conversion elements 7111, 7611, 7711 may be formed from a p-type thermoelectric conversion material composed of a composite oxide containing La and Cu, whereas the second thermoelectric conversion element 7113 may be formed from an n-type thermoelectric conversion material obtained through the addition of the composite oxide to Ni. Examples of the composite oxide mentioned above include La2CuO4.

Further, the thermoelectric conversion modules 7110, 7410 shown in FIGS. 19 and 22 may be configured to be further provided, over the insulating heat transfer plates 7119, with heat transfer prats formed from a metal such as a NiMo alloy. In addition, the thermoelectric conversion modules 7110, 7410 shown in FIGS. 19 and 22 may be configured to have heat transfer prats formed from a metal such as a NiMo alloy, interposed between the insulating heat transfer plates 7117 and the conductive members 35.

While an example where the insulating pastes for the insulator layers 115 and the insulator part 13 have the same material has been described in Embodiment 1, for example, the insulating paste for the insulator part 13 may contain, as its main constituent, the material of the insulating paste for the insulator layers 115 and have another stabilizing material added thereto. Even in this case, the insulating paste for the insulator part 13 and the insulating paste for the insulator layers 115 can be subjected to co-firing at the same timing, and the manufacturing process can be thus simplified.

While an example where the insulating paste contain, as its main constituent, ZrO2 with Y2O3 added thereto as a stabilizing agent (yttria stabilized zirconia) has been described in Embodiment 1, without limitation thereto, the insulating paste may contain, as its main constituent, ZrO2 with another stabilizing agent (for example, Ca, Mg) added thereto. In addition, the insulating paste may contain, as its main constituent, partially stabilized ZrO2 with a relatively small additive amount of stabilizing agent.

An example where the electrodes 15, 16 are formed by firing the NiMo paste has been described in Embodiment 1. However, the type of the conductive paste for the electrodes 15, 16 is not to be considered limited to the NiMo paste as long as the material can be co-fired with the first thermoelectric conversion elements 111 and the second thermoelectric conversion elements 113. For example, the conductive paste may be a conductive paste containing Ni, Pt, Pd, NiCr, or NiW. It is to be noted that the conductive paste preferably includes a metal powder (the NiMo powder in the case of Embodiment 1) for use in the production of p-type thermoelectric conversion material sheets.

An example where the heat transfer plates 17, 19 are formed by firing the NiMo paste has been described in Embodiment 1. However, the type of the conductive paste for the heat transfer plates 17, 19 is not to be considered limited to the NiMo paste as long as the material can be co-fired with the first thermoelectric conversion elements 111 and the second thermoelectric conversion elements 113.

For example, the conductive paste may be a conductive paste containing Ni, Pt, Pd, NiCr, or NiW.

Figure 23:
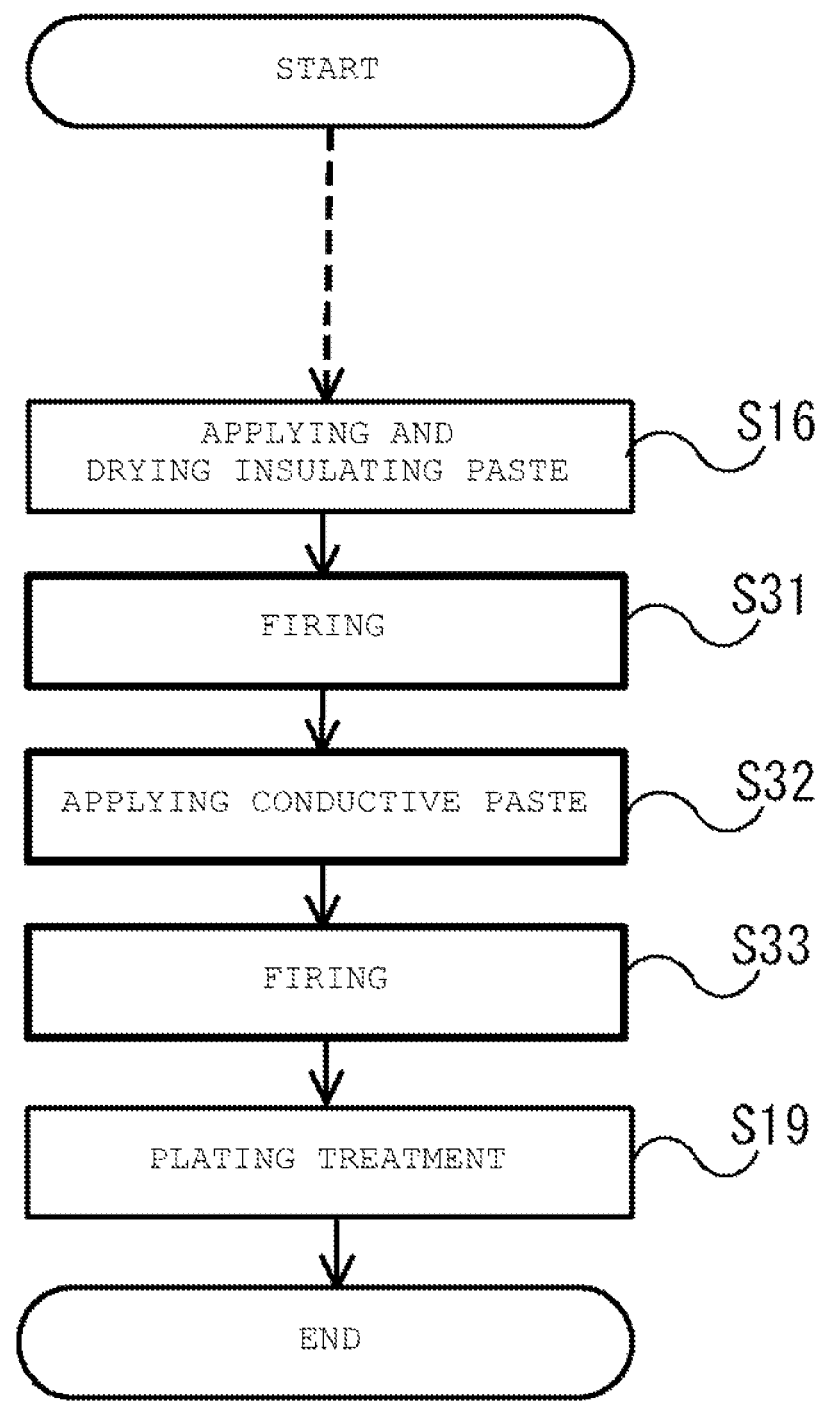
FIG. 23 is a diagram for explaining a method for manufacturing the thermoelectric conversion module according to the modification example.

The method for manufacturing the thermoelectric conversion module 10, where the module main body 11, the insulating paste, and the NiMo paste are subjected to co-firing has been described in Embodiment 1. However, the method for manufacturing the thermoelectric conversion module 10 is not to be considered limited to the foregoing method. For example, the method may be a manufacturing method as shown in FIG. 23. In accordance with this manufacturing method, a process (step S31) of firing the laminated body for the module main body 11 and the insulating paste is conducted after completing the process in the step S16. Thereafter, a process (step S32) of applying the conductive paste and a process (step S33) of firing the conductive paste are conducted sequentially. In this case, the module main body 11 with the insulator part 13 formed partially on the outer surface of the body is produced when the process in the step S31 is completed. It is to be noted that in FIG. 23, the same steps as those of according to Embodiment 1 are denoted by the same reference symbols as in FIG. 4.

In the process (step S32) of applying the conductive paste, a paste including a Ni powder is used as the conductive paste. In the process of firing the conductive paste, the firing is carried out under the conduction of 800° C. in the atmosphere. Alternatively, the conductive paste may contain, for example, Cu, Al, Ag, Au, Pd, Pt, W, Ag/Pd, Ag/Zn, or the like.

While an example of producing the electrodes 15, 16 and the heat transfer plates 17, 19 by firing the conductive paste has been described in Embodiment 1, the method for producing the electrodes 15, 16 and the heat transfer plates 17, 19 is not to be considered limited thereto. For example, the electrodes 15, 16 and the heat transfer plates 17, 19 may be formed through the use of a vapor deposition method, a sputtering method, a PVD method, or a CVD method. Alternatively, the electrodes 15, 16 and the heat transfer plates 17, 19 may be formed by method of applying an organo-metallic compound instead of the conductive paste.

Figure 24:
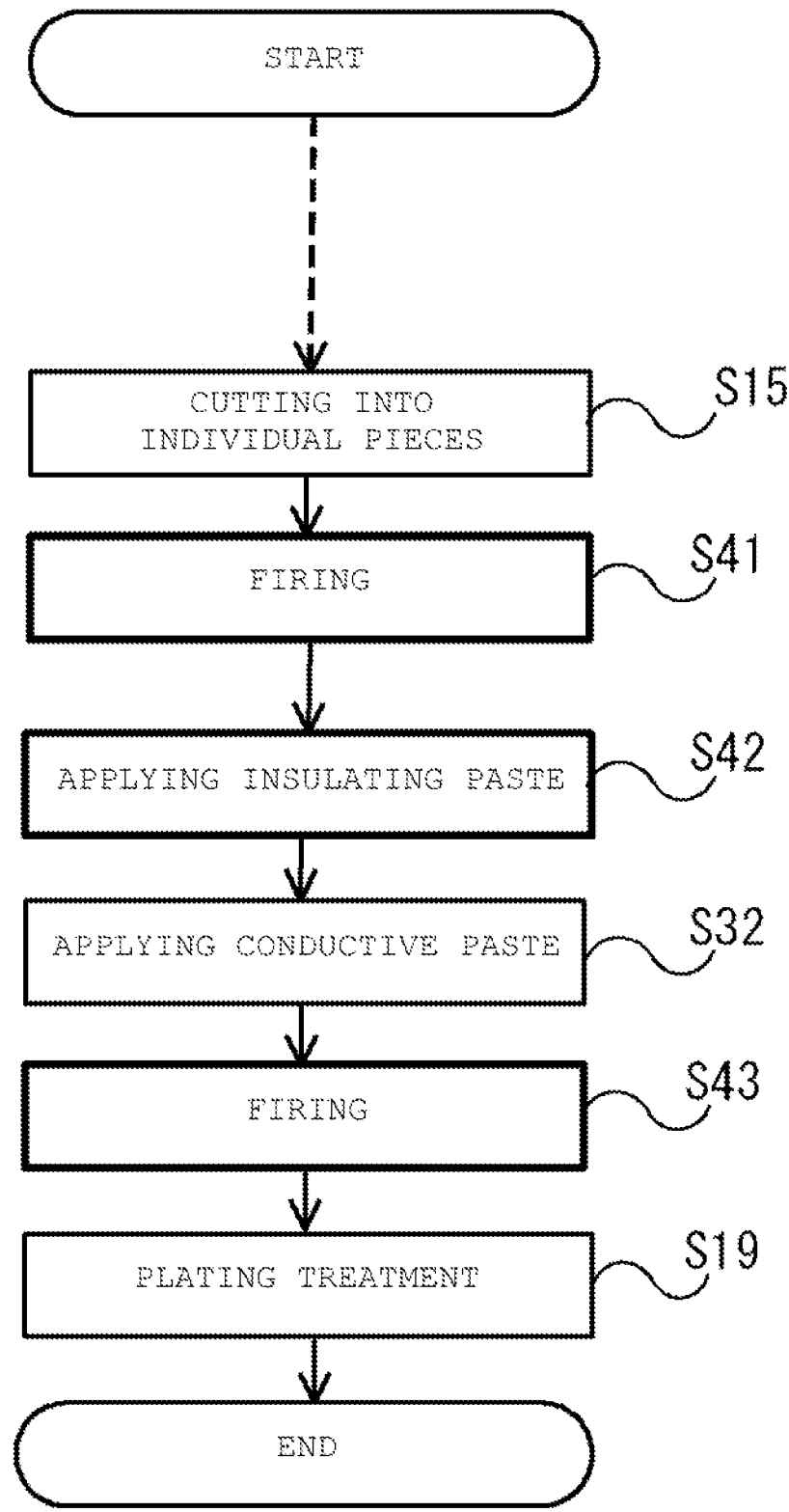
FIG. 24 is a diagram for explaining a method for manufacturing the thermoelectric conversion module according to the modification example.

Alternatively, the method may be a manufacturing method as shown in FIG. 24. In accordance with this manufacturing method, a process (step S41) of firing the laminated body for the module main body 11 is conducted after completing the process in the step S15. At this stage, the module main body 11 is produced. Thereafter, a process (step S42) of applying the insulating paste, a process (step S32) of applying the conductive paste, and a process (step S43) of firing the insulating paste and the conductive paste are conducted sequentially.

In the process (step S42) of applying the insulating paste, a glass powder that melts at a higher temperature than the temperature of the heat source or the glass powder mixed with an Al2O3 powder is used as the insulating paste. In the process of firing the insulating paste the conductive paste, the firing is carried out under the conduction of 900° C. in the atmosphere. Alternatively, the insulating paste may contain, for example, ZrO2, Mg2SiO4, Y2O3, an epoxy resin, or the like.

While an example of the thermoelectric conversion module 1 where the 5×3 thermoelectric conversion modules 10 are respectively connected in series and parallel has been described in Embodiment 2, without limitation thereto, the module may have, for example, M×N (N: positive integer other than 5, M: positive integer other than 3) thermoelectric conversion modules 10 connected respectively in series and parallel.

Figure 25:
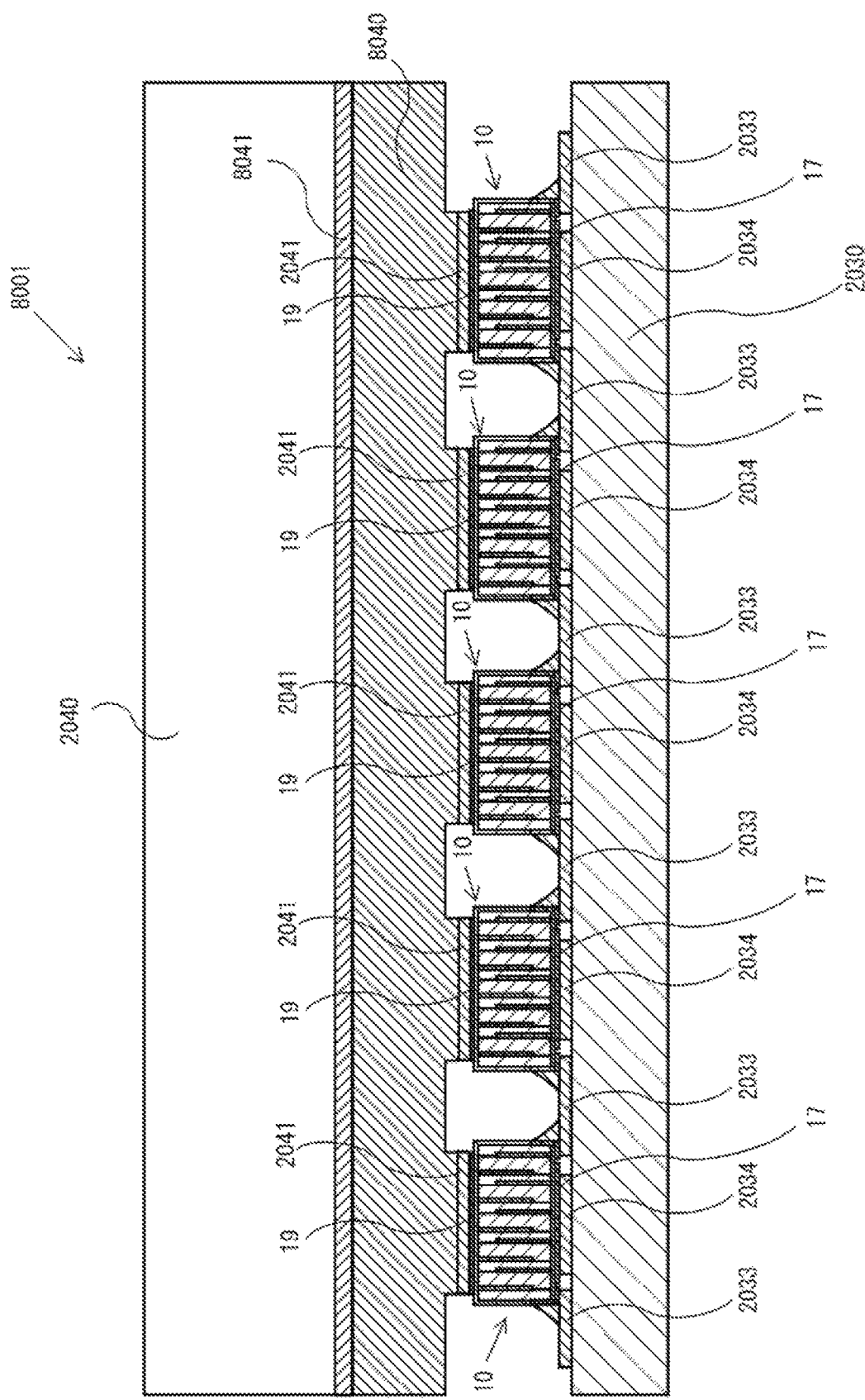
FIG. 25 is a cross-sectional view of a thermoelectric conversion module according to a modification example.

While an example where the respective thermoelectric conversion modules 10 are joined directly to the heat source 2040 with the heat transfer plates 19 interposed therebetween has been described in Embodiment 2, the module is not to be considered limited to the configuration with the heat source joined directly to the thermoelectric conversion modules 10. For example, as with the thermoelectric conversion module 8001 shown in FIG. 25, the heat transfer plates 19 of the respective thermoelectric conversion modules 10 may be configured to be joined to a first heat transfer member 8040 with the conductive member 2041 such as a conductive paste, and a side of the first heat transfer member 8040 opposite to the thermoelectric conversion modules 10 may be configured to be bonded to the heat source 2040. It is to be noted that in FIG. 25, the same constituents as those according to Embodiment 2 are denoted by the same reference symbols as in FIG. 6. The first heat transfer member 8040 is formed from a metal, a ceramic material with a high thermal conductivity, or the like. The first heat transfer member 8040 is attached to the heat source 2040 with a thermally conductive adhesive 8041. For example, an adhesive with a high thermal conductivity, containing a silicone resin or an epoxy resin as its main constituent, is adopted as the thermally conductive adhesive 8041.

The present configuration has the first heat transfer member 8040 interposed between the thermoelectric conversion modules 10 and the heat source 2040, thereby resulting in the thermoelectric conversion modules 10 protected with the first heat transfer member 8040 when a shock is applied to the thermoelectric conversion module 8001 from the outside. Accordingly, damage to the thermoelectric conversion module 10 can be suppressed.

While an example where the heat transfer plates 17 of the respective thermoelectric conversion modules 10 are joined to the substrate 30 has been described in Embodiment 2, the module is not to be considered limited to the configuration with the heat transfer plates 17 joined to the substrate 30. For example, as with the thermoelectric conversion modules

Figure 26:
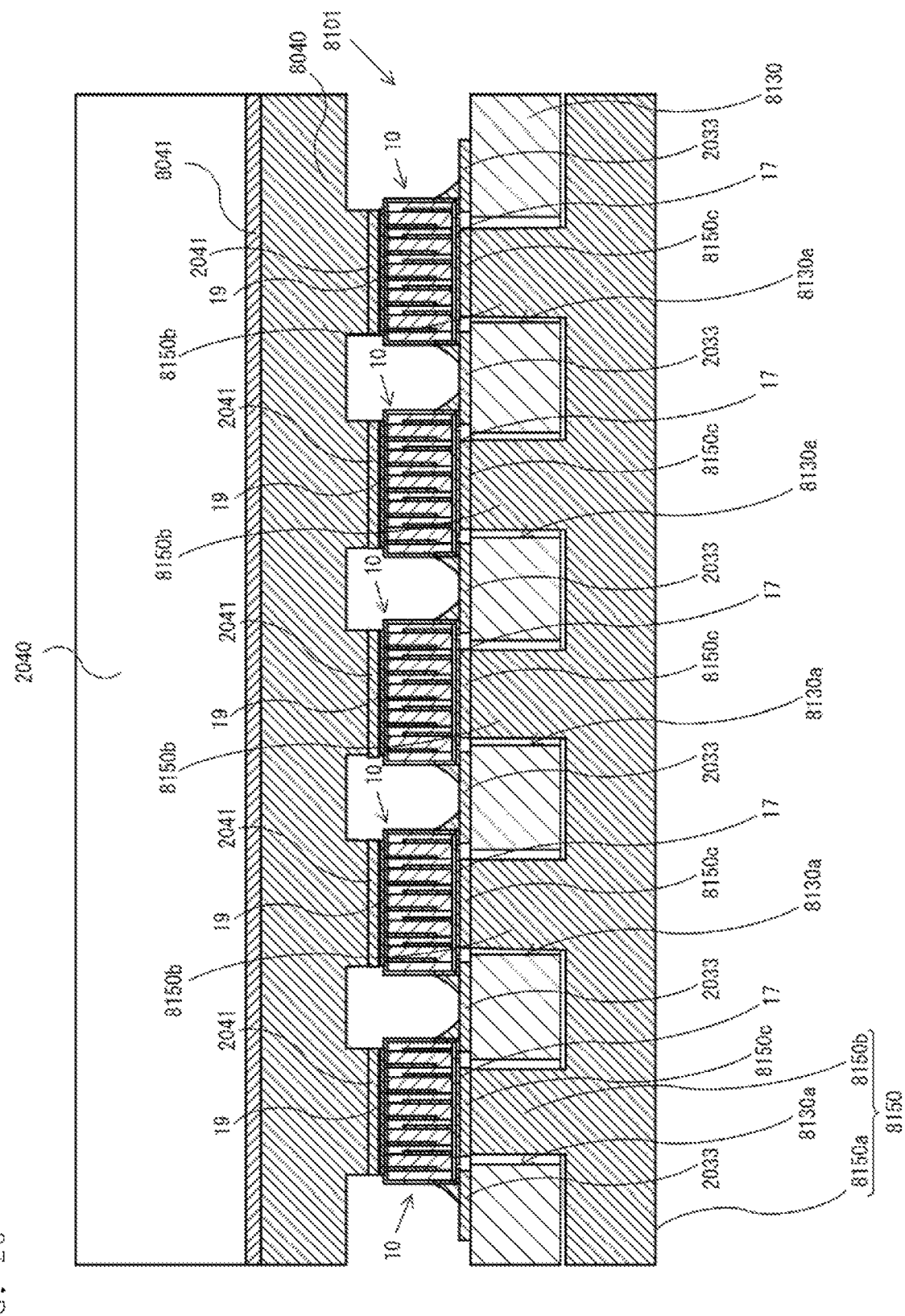
FIG. 26 is a cross-sectional view of a thermoelectric conversion module according to a modification example.
Figure 27A:
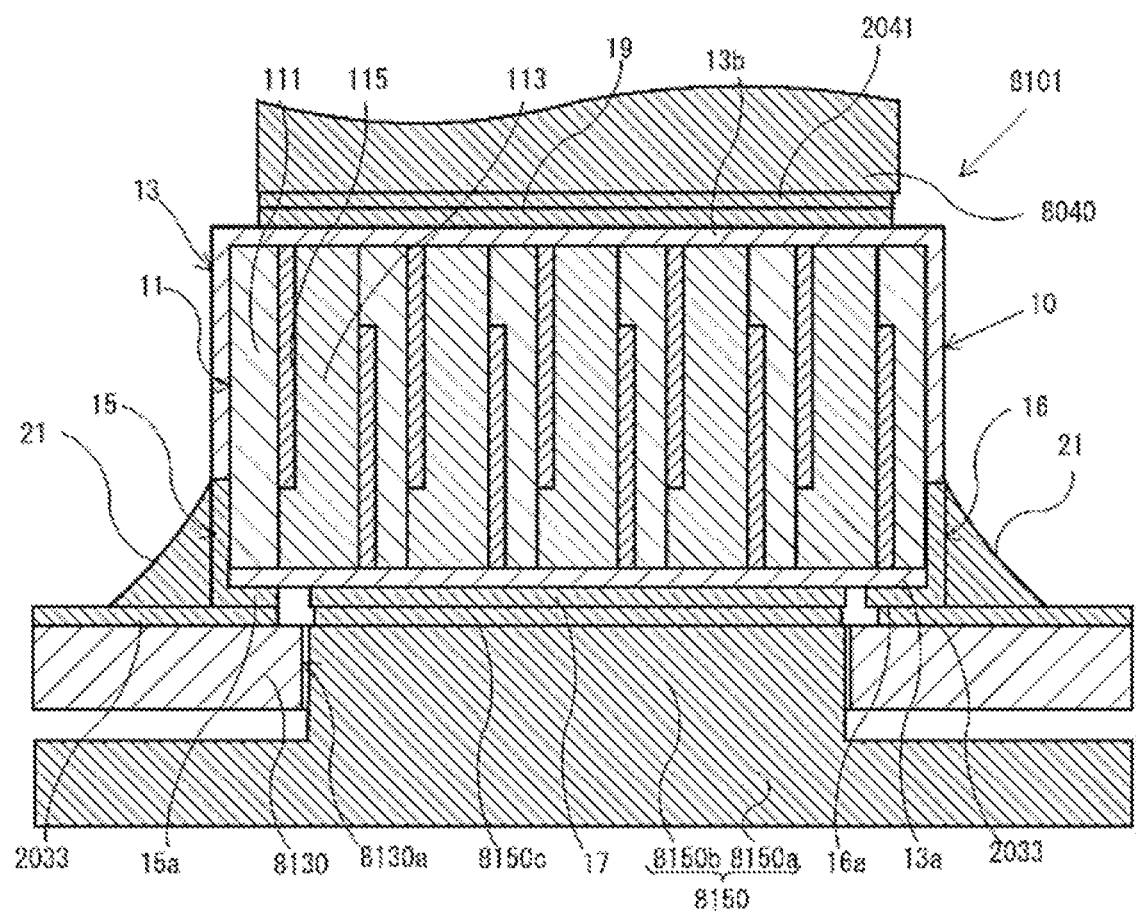
FIG. 27A is a cross-sectional view partially illustrating the thermoelectric conversion module according to the modification example.

8101 and 8201 shown in FIG. 26 and FIG. 27A, respectively, the heat transfer plates 17 of the thermoelectric conversion modules 10 may be configured to be jointed to a second heat transfer member 8150.

A substrate 8130 has, as shown in FIG. 27A, through holes 8130a penetrating in the thickness direction of the substrate 8130, which are provided at sites corresponding to respective thermoelectric conversion modules 10.

The second heat transfer member 8150 includes a plate-like main part 8150a and protruded parts 8150b protruded from the main part 8150a in the thickness direction thereof. The main part 8150a of the second heat transfer member 8150 is disposed on a side of the substrate 8130 opposite to the thermoelectric conversion modules 10, and the protruded parts 8150b thereof are disposed inside the through holes 8130a of the substrate 8130. The heat transfer plates 17 of the thermoelectric conversion modules 10 are joined to the protruded parts 8150b disposed inside the through holes 8130a. The second heat transfer member 8150 is formed from a metal, a ceramic material with a high thermal conductivity, or the like.

Figure 27B:
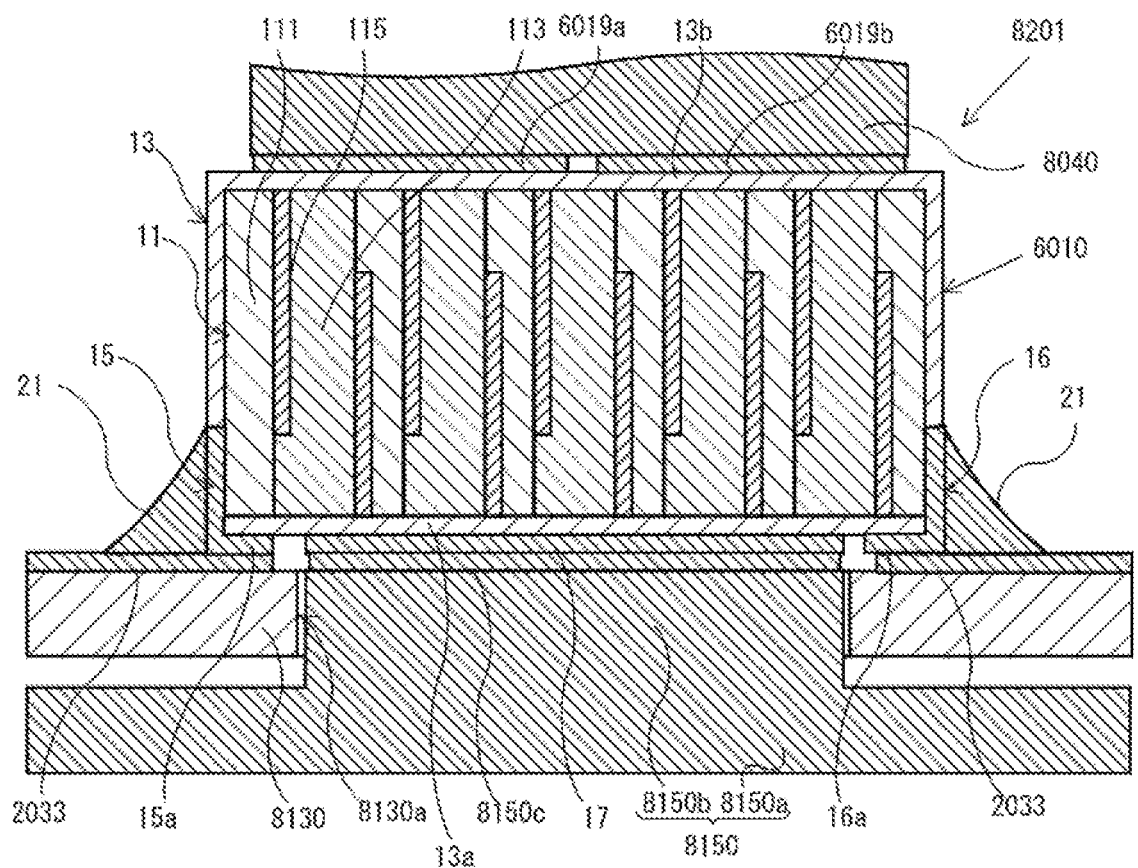
FIG. 27B is a cross-sectional view partially illustrating a thermoelectric conversion module according to a modification example.

It is to be noted that while the configuration including the thermoelectric conversion module 10 described in Embodiment 1 has been described with reference to the thermoelectric conversion modules 8101 and 8201 shown in FIG. 26 and FIG. 27A, the type of the thermoelectric conversion module is not limited thereto. For example, as with the thermoelectric conversion module 8201 shown in FIG. 27B, the module may be configured to include the thermoelectric conversion module 6010 shown in FIG. 15A.

According to the present configuration, for example, when the second heat transfer member 8150 is formed from a material that is higher in thermal conductivity than the substrate 8130, heat radiation characteristics on the side of the module main body 11 with the heat transfer plates 17 can be improved, thus making it easy to provide the module main body 11 with a temperature difference.

Furthermore, as with the thermoelectric conversion module 8301 shown in FIG. 28, the module may be configured to have a heat radiation fin 8360 attached with an adhesive 8361 to a side of the main part 8150a of the second heat transfer member 8150 opposite to the protruded parts 8150b. For example, an adhesive with a high thermal conductivity, containing a silicone resin or an epoxy resin as its main constituent, is adopted as the adhesive 8361. The present configuration includes the heat radiation fin 8360, thereby making it possible to improve heat radiation performance, for example, from the second heat transfer member 8150 to the outside air.

Figure 29A:
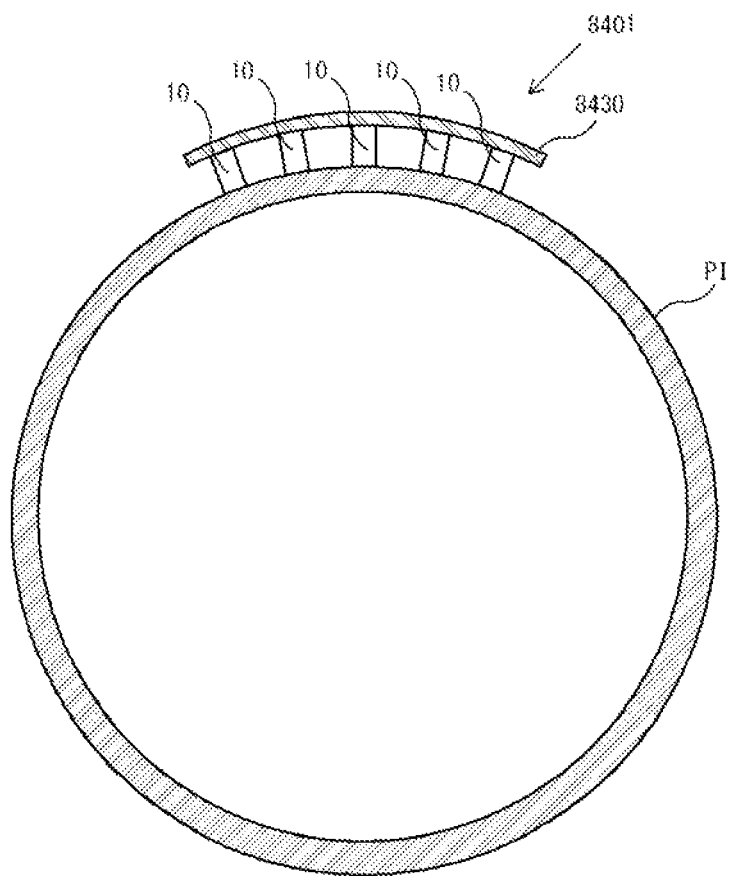
FIG. 29A is a cross-sectional view of a thermoelectric conversion module according to a modification example.

While an example of the thermoelectric conversion module 1 where the substrate 2030 is an inflexible rigid substrate has been described in Embodiment 2, the type of the substrate is not limited thereto, but may be configured from a flexible substrate for example. As shown in FIG. 29A, a thermoelectric conversion module 8401 according to the present modification example includes a substrate 8430 composed of a flexible substrate, and can be disposed to be curved along the outer surface of a cylindrical tube PI.

Figure 29B:
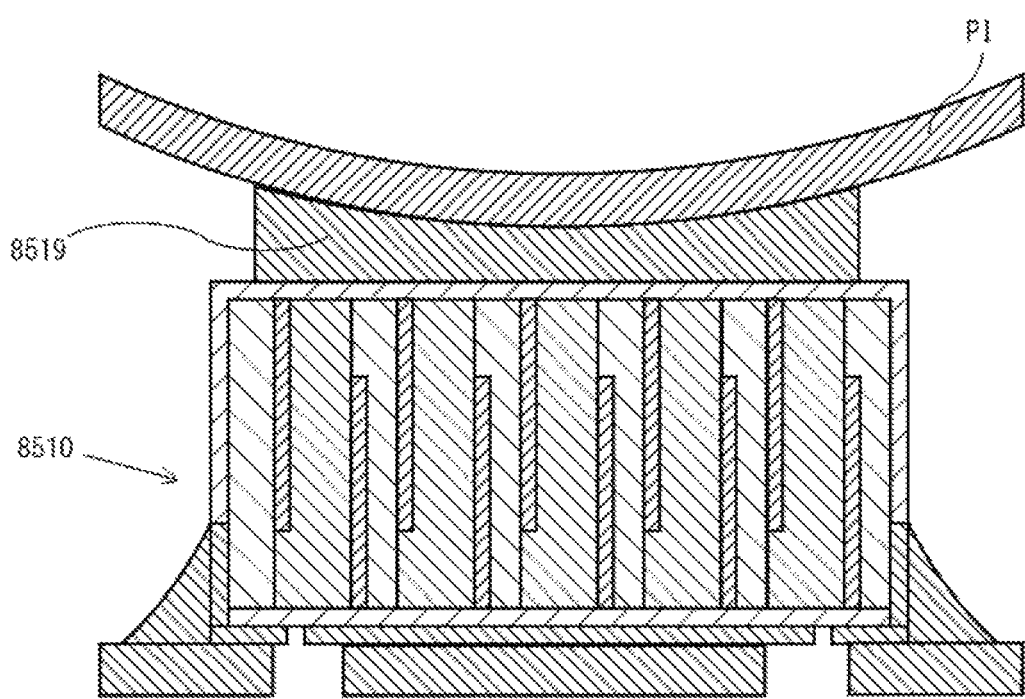
FIG. 29B is a cross-sectional view of a thermoelectric conversion module according to a modification example.

In addition, while an example of the thermoelectric conversion module 10 with the flat heat transfer plate 19 has been described in Embodiment 1, the shape of the heat transfer plate 19 is not to be considered limited thereto, and for example, as shown in FIG. 29B, for a thermoelectric conversion module 8510, a surface of a heat transfer plate 8519 closer to a tube PI may be depressed along the outer surface of the tube PI.

While an example where the material that forms the insulating substrates 3013a, 3013b is Al2O3 has been described in Embodiment 3, the material that forms the insulating substrates 3013a, 3013b is not limited thereto. For example, the insulating substrates 3013a, 3013b may be formed from ZrO2, MgSiO4, Y2O3 or the like.

Figure 30:
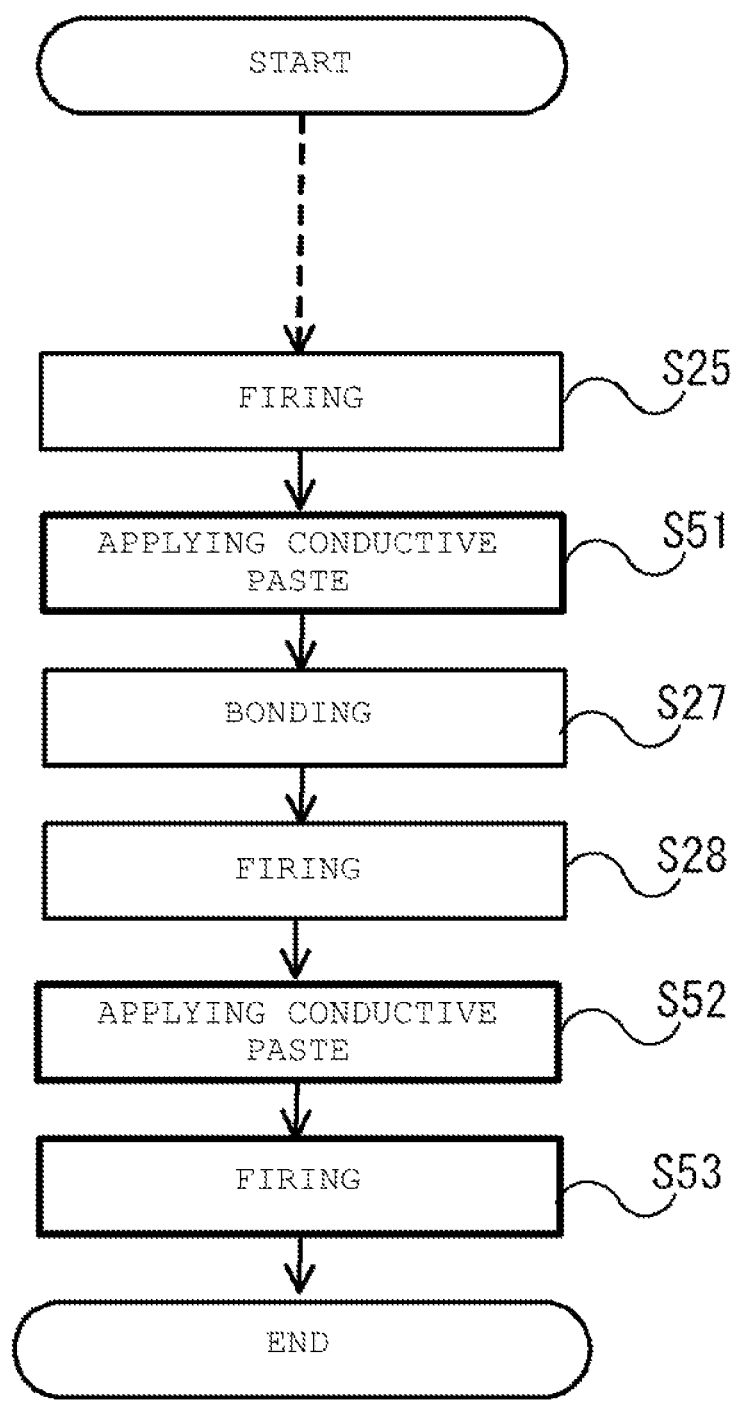
FIG. 30 is a diagram for explaining a method for manufacturing the thermoelectric conversion module according to the modification example.

The method for manufacturing the thermoelectric conversion module 3010 has been described in Embodiment 3, where the conductive paste for bonding the first thermoelectric conversion elements 3111 and the second thermoelectric conversion elements 3113 to the insulating substrates 3013a, 3013b, and the conductive paste for the heat transfer plates 3017, 3019 are subjected to co-firing. However, the method for manufacturing the thermoelectric conversion module 3010 is not to be considered limited to the foregoing method. For example, the method may be a manufacturing method as shown in FIG. 30. In accordance with this manufacturing method, a process (step S51) of applying only the conductive paste for bonding the first thermoelectric conversion elements 3111 and the second thermoelectric conversion elements 3113 to the insulating substrates 3013a, 3013b is conducted after completing the process in the step S25. Next, a process (step S27) of bonding the first thermoelectric conversion elements 3111 and the second thermoelectric conversion elements 3113 to the insulating substrates 3013a, 3013b, and a process (step S28) of firing the conductive paste are conducted sequentially. Thereafter, a process (step S52) of applying the conductive paste for the heat transfer plates 3017, 3019 and a process (step S53) of firing the conductive paste are conducted sequentially.

In the process (step S42) of applying the conductive paste, a paste including an Ag powder is used as the conductive paste. In the process of firing the conductive paste, the firing is carried out under the conduction of 800° C. in the atmosphere. Alternatively, the conductive paste may contain, for example, Ni, Cu, Al, Au, Pd, Pt, W, Ag/Pd, Ag/Zn, or the like.

While an example of producing the heat transfer plates 3017, 3019 by firing the conductive paste has been described in Embodiment 3, the method for producing the heat transfer plates 3017, 3019 is not to be considered limited thereto. For example, the heat transfer plates 3017, 3019 may be formed through the use of a vapor deposition method, a sputtering method, a PVD method, or a CVD method. Alternatively, the heat transfer plates 3017, 3019 may be formed by a method of applying an organo-metallic compound instead of the conductive paste.

While the configuration including the insulating substrates 3013a, 3013b respectively provided with the heat transfer plates 3017, 3019 has been described in Embodiment 3, the numbers of heat transfer plates provided on the respective insulating substrates 3013a, 3013b is not to be considered limited to 1.

For example, the insulating substrates 3013a, 3013b may be each configured to have a plurality of heat transfer plates provided. The present configuration can relax the stress applied from heat transfer plates to the insulating substrates 3013a, 3013b, thus suppressing damage to the insulating substrates 3013a, 3013b.

While an example where the heat transfer plates 3017, 3019 are substantially rectangular in a planar view from the Z direction in FIG. 9 has been described in Embodiment 3, the shapes of the heat transfer plates are not to be considered limited thereto. In addition, while an example where parts of peripheral edges of the insulating substrates 3013a, 3013b in a planar view are not covered with the heat transfer plates 3017, 3019 has been described in Embodiment 3, the sizes of the heat transfer plates 3017, 3019 are not limited thereto. For example, the heat transfer plates 3017, 3019 may be configured to cover the entire surfaces on the side of the insulating substrates 3013a, 3013b opposite to the first thermoelectric conversion elements 3111 and the second thermoelectric conversion elements 3113.

Figure 31:
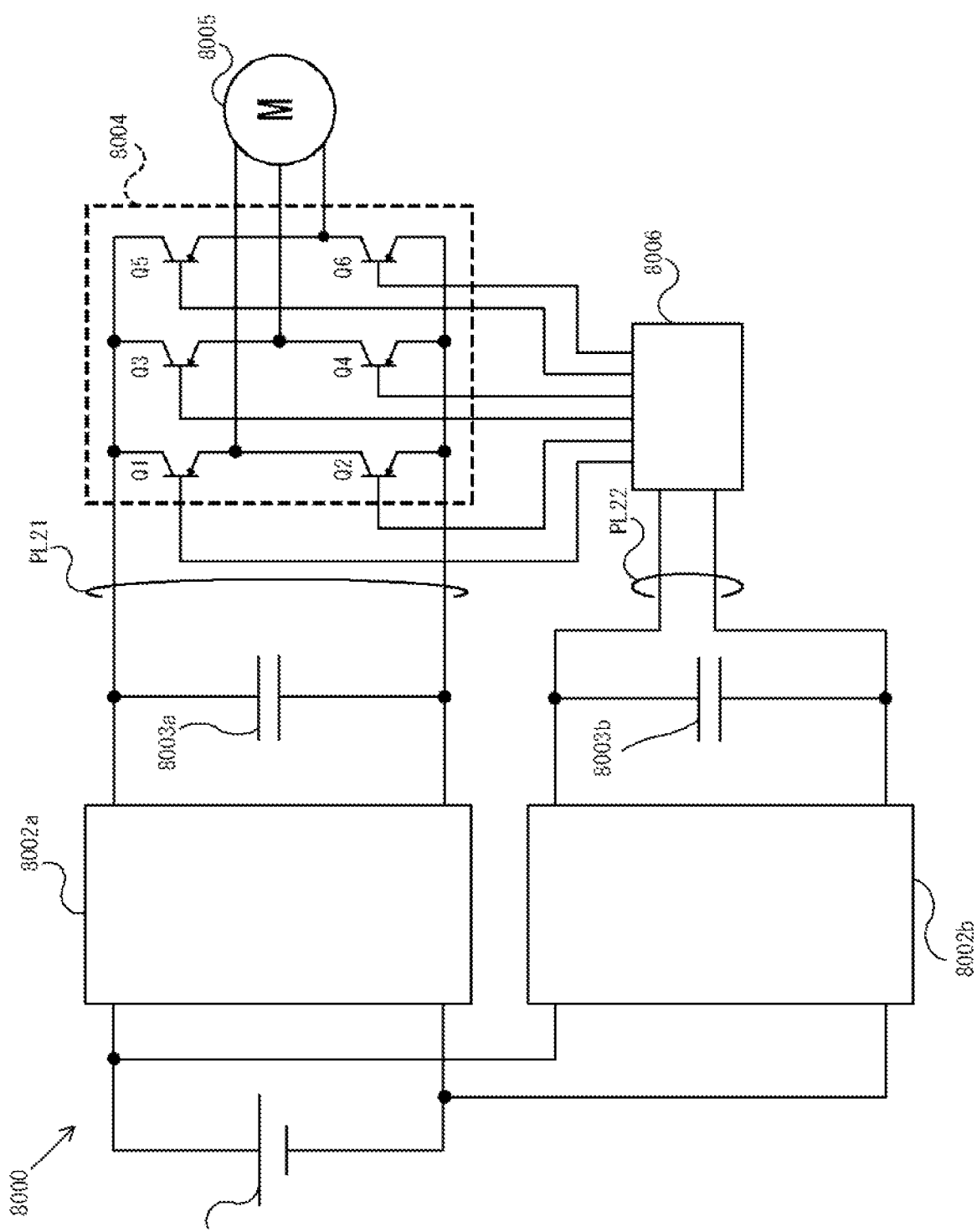
FIG. 31 is a circuit diagram illustrating the configuration of a generator according to a modification example.

While an example of the communication device 1000 has been described as an electrical device including the thermoelectric conversion module 1 in Embodiment 4, the including the thermoelectric conversion module 1 is not to be considered limited to the communication device 1000. For example, as shown in FIG. 31, the electrical device may be a generator 8000 including the thermoelectric conversion module 1, DC/DC converters 8002a, 8002b, capacitors 8003a, 8003b, an inverter circuit 8004, a motor 8005, and a control unit 8006. It is to be noted that in FIG. 31, the same constituents as those according to Embodiment 4 are denoted by the same reference symbols as in FIG. 12. The DC/DC converters 8002a, 8002b are composed of step-up/step-down circuits that step up/down the direct-current voltage supplied from the thermoelectric conversion module 1. The DC/DC converter 8002a outputs a direct-current voltage equal to the operating voltage of the inverter circuit 8004, whereas the DC/DC converter 8002b outputs a direct-current voltage equal to the operating voltage of the control unit 8006. The capacitor 8003a supplies electric power through a power line PL21 to the inverter circuit 8004, whereas the capacitor 8003b supplies electric power through a power line PL22 to the control unit 8006.

The inverter circuit 8004 includes six switching modules Q1, Q2, Q3, Q4, Q5, Q6. The switching modules Q1, Q2, Q3, Q4, Q5, Q6 are composed of transistors or the like. The motor 8005 is composed of a three-phase alternate-current motor, which rotates in response to three-phase alternate-current power supplied from the inverter circuit 8004. The control unit 8006 turns on/off the switching modules Q1, Q2, Q3, Q4, Q5, Q6 of the inverter circuit 8004 respectively at preset timings, thereby causing the inverter circuit 8004 to output a three-phase alternate current.

When the present configuration is installed in a location where a heat source is present, the motor 8005 can be allowed to continue to operate semi permanently as long as heat is supplied from the heat source to the thermoelectric conversion module 1. Accordingly, for example, as compared with a generator operated by power supply from a battery or the like, the burden of maintenance on users can be reduced because of the eliminated need for work such as battery replacement or battery charging.

While embodiments and modification examples of the present invention have been described above, the present invention is not to be considered limited to the foregoing. The present invention encompasses appropriate combinations of the embodiments and modification examples, and the combinations with changes appropriately made thereto.

DESCRIPTION OF REFERENCE SYMBOLS 1, 8001, 8101, 8201, 8301: thermoelectric conversion module
2, 8002a, 8002b: DC/DC converter
3, 8003a, 8003b: capacitor
4: wireless communication unit
5: sensor
6, 8006: control unit
10, 3010, 4010, 4110, 5010, 6010, 6110, 7010, 7110, 7210, 7310, 7410, 9010: thermoelectric conversion module
11, 3011, 7011, 7311, 7411: module main body
11a: upper surface
11b: lower surface
11c, 11d: side surface
13: insulator part
13a, 7013b, 7413b: lower sub-insulator parts
13b, 7013c, 7313b: upper sub-insulator parts
15, 16, 5015, 5016: electrodes
17, 19, 3017, 3019, 6019, 7017, 7019, 7217, 7219: heat transfer plates
21, 35, 2034, 2041, 3023a, 3023b, 8150c: conductive members
30, 2030, 8130: substrates
33, 2033: conductive pattern
111, 3111, 7111, 7611, 7711: first thermoelectric conversion elements
111a, 3111a, 7111a: first sites
111b, 3111b, 7111b: second sites
113, 3113, 7113: second thermoelectric conversion elements
113a, 3113a, 7113a: third sites
113b, 3113b, 7113b: fourth sites
115, 7013, 7313, 7413: insulator layers
1000: communication device
2040: heat source
3013a, 3013b: insulating substrates
6019a, 6019b, 7017a, 7107b, 7019a, 7019b: sub-heat transfer plates
7013a: lateral sub-insulator part
7117, 7119: insulating heat transfer plates
8000: generator
8004: inverter circuit
8005: three-phase alternate-current motor
8130a: through hole
8040: first heat transfer member
8041, 8361: adhesives
8150: second heat transfer member
8150a: main part
8150b: protruded part
8360: heat radiation fin
PL1, PL2, PL3, PL21, PL22: power lines

The invention claimed is:

1. A thermoelectric conversion module having a central axis, a length as measured along the central axis and a height as measured perpendicular to the central axis, the length being longer than the height, the thermoelectric conversion module, comprising:
  (a) a row of alternating first and second thermoelectric conversion elements which form n pairs of adjacent first and second thermoelectric conversion elements, n being an integer greater than 1, each of the first and second thermoelectric conversion elements having upper and lower surfaces extending parallel to the central axis;
  (b) first and second electrodes electrically connected to respective ones of the first or second thermoelectric conversion elements;
  (c) n insulators, each insulator being associated with a respective pair of adjacent first and second thermoelectric conversion elements and extending between the adjacent first and second thermoelectric conversion elements of its associated pair, a first of the insulators, which is associated with a first of the adjacent pairs, extending in a direction parallel to the central axis across the upper surface of one of the first and second adjacent thermoelectric conversion elements of the first adjacent pair but not extending in a direction parallel to the central axis across the upper surface of the other of the first and second adjacent thermoelectric conversion elements of the first adjacent pair; and (d) a heat transfer plate provided on at least one of the insulators.

2. The thermoelectric conversion module according to claim 1, wherein the first insulator does not extend higher than the top surface of the other of the first and second adjacent thermoelectric conversion elements of the first adjacent pair in a direction perpendicular to the central axis.

3. The thermoelectric conversion module according to claim 2, wherein the first insulator does not extend beyond one of the first and second adjacent thermoelectric conversion elements of the first adjacent pair in a direction parallel to the central axis.

4. The thermoelectric conversion module according to claim 1, wherein, for each adjacent pair of thermoelectric conversion elements,. the insulator associated with the adjacent pair extends across either the upper or lower surface of one of the first and second adjacent thermoelectric conversion elements of the adjacent pair in a direction parallel to the central axis but does not extend over either the upper or lower surface of the other of the first and second adjacent thermoelectric conversion elements of the adjacent pair in a direction parallel to the central axis.

5. The thermoelectric conversion module according to claim 4, wherein the heat transfer plate is a first heat transfer plate and the thermoelectric conversion module further includes a second heat transfer plate, the first heat transfer plate being located above the upper surface of the first thermoelectric conversion elements and the second heat transfer plate being is located below the lower surface of the second thermoelectric conversion elements.

6. The thermoelectric conversion module according to claim 2, wherein:
then adjacent pairs of thermoelectric conversion elements include a first pair of adjacent thermoelectric conversion elements and a second pair of adjacent thermoelectric conversion elements, the first and second pairs of adjacent thermoelectric conversion elements sharing a common first or second thermoelectric conversion element;
the insulator associated with the first pair adjacent of thermoelectric conversion elements extends across the upper surface of the common thermoelectric conversion element in a direction parallel to the central axis; and
the insulator associated with the second adjacent pair of thermoelectric conversion elements extends across the lower surface of the common thermoelectric conversion element in a direction parallel to the central axis.

7. The thermoelectric conversion module according to claim 6, wherein:
the insulator associated with the first adjacent pair of thermoelectric conversion elements does not extend across the upper surface of the second thermoelectric conversion element of the first adjacent pair of thermoelectric conversion elements in a direction parallel to the central axis; and
the insulator associated with the second adjacent pair of thermoelectric conversion elements does not extend across the lower surface of the second thermoelectric conversion element of the second adjacent pair of thermoelectric conversion elements in a direction parallel to the central axis.

8. The thermoelectric conversion module of claim 1, wherein the main module body is cuboid in shape.

9. The thermoelectric conversion module according to claim 1, wherein the heat transfer plate has a higher thermal conductivity than the insulators.

10. The thermoelectric conversion module according to claim 5, wherein the first and second heat transfer plates are formed from a material that has a higher thermal conductivity than the first and second insulators, respectively.

11. The thermoelectric conversion module according to claim 1, wherein the first and second electrodes are physically joined to respective ones of the first thermoelectric conversion elements.

12. The thermoelectric conversion module according to claim 11, wherein:
(a) the first and second electrodes comprise:
(i) a base layer formed from Ni and Mo and provided on an outer surface of the module main body; and
(ii) a contact layer formed from a metal, the contact layer covering the base layer; and
(b) each of the base layers is joined to a respective one of the first thermoelectric conversion elements.

13. The thermoelectric conversion module according to claim 1, wherein:
(a) each of the first thermoelectric conversion elements comprise a p-type semiconductor including Ni, Mo, and a composite oxide;
(b) each of the second thermoelectric conversion elements comprise an n-type semiconductor including the composite oxide; and
(c) the composite oxide comprises Sr, La, and Ti.

14. The thermoelectric conversion module according to claim 1, wherein:
(a) each of the first thermoelectric conversion elements comprises an n-type semiconductor; and
(b) each of the second thermoelectric conversion elements comprise a p-type semiconductor.

15. A combination comprising the thermoelectric conversion module according to claim 1 and a substrate on which the thermoelectric conversion module is mounted.

16. The combination according to claim 15, wherein the heat transfer plate has a higher thermal conductivity than the insulators.

17. The thermoelectric conversion module according to claim 1, wherein the first thermoelectric conversion element of each adjacent pair has:
(i) a first lateral surface which abuts and is electrically connected to an opposed first lateral surface of the second thermoelectric conversion element of the adjacent pair; and
(ii) a second lateral surface which is spaced from the first lateral surface of the second thermoelectric conversion element of the adjacent pair with a respective insulating member element located there between.

* * * * *